United States Patent
Park et al.

(10) Patent No.: US 9,312,124 B2
(45) Date of Patent: Apr. 12, 2016

(54) METHODS OF FABRICATING GATE INSULATING LAYERS IN GATE TRENCHES AND METHODS OF FABRICATING SEMICONDUCTOR DEVICES INCLUDING THE SAME

(75) Inventors: Tai-Su Park, Seoul (KR); Gun-Joong Lee, Suwon-si (KR); Young-Dong Lee, Suwon-si (KR); Sang-Chul Han, Suwon-si (KR); Joo-Byoung Yoon, Yongin-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 713 days.

(21) Appl. No.: 13/605,463

(22) Filed: Sep. 6, 2012

(65) Prior Publication Data

US 2013/0164919 A1 Jun. 27, 2013

(30) Foreign Application Priority Data

Dec. 27, 2011 (KR) .......................... 10-2011-0143701

(51) Int. Cl.
*H01L 21/02* (2006.01)
*H01L 29/423* (2006.01)
(Continued)

(52) U.S. Cl.
CPC .... *H01L 21/02238* (2013.01); *H01L 21/02252* (2013.01); *H01L 21/02255* (2013.01); *H01L 29/42356* (2013.01); *H01L 29/4966* (2013.01); *H01L 29/78* (2013.01)

(58) Field of Classification Search
CPC .................. H01L 29/42356; H01L 21/02255; H01L 21/02252
See application file for complete search history.

(56) References Cited

U.S. PATENT DOCUMENTS

| 5,953,607 | A * | 9/1999 | Hakey | H01L 27/10861 257/E21.651 |
| 6,235,606 | B1 * | 5/2001 | Huang | H01L 21/76224 257/E21.507 |
| 6,258,726 | B1 * | 7/2001 | Park | H01L 21/76224 257/E21.546 |

(Continued)

FOREIGN PATENT DOCUMENTS

| KR | 20060038241 A | 5/2006 |
| KR | 2010-0020645 A | 2/2010 |
| KR | 20100033918 A | 3/2010 |

OTHER PUBLICATIONS

Ligenza "Effect of crystal orientation on oxidation rates of silicon in high pressure steam" Nov. 1961, pp. 2011-2014.

*Primary Examiner* — John P Dulka
(74) *Attorney, Agent, or Firm* — Harness, Dickey & Pierce, PLC

(57) ABSTRACT

A method of fabricating a semiconductor device may include: forming a field region defining an active region in a substrate; forming a gate trench in which the active and field regions are partially exposed; forming a gate insulating layer on a surface of the active region; conformally forming a gate barrier layer including metal on the gate insulating layer and partially exposed field region; forming a gate electrode layer including metal on the gate barrier layer; and/or forming a gate capping layer. Forming the gate insulating layer may include forming a first gate oxide layer by primarily oxidizing the active region's surface, and forming a second gate oxide layer between the active region's surface and the first gate oxide layer by secondarily oxidizing the active region's surface. The gate capping layer may be in contact with the gate insulating layer, gate barrier layer, and/or gate electrode layer.

20 Claims, 40 Drawing Sheets

(51) Int. Cl.
*H01L 29/49* (2006.01)
*H01L 29/78* (2006.01)

(56) References Cited

U.S. PATENT DOCUMENTS

| | | | | |
|---|---|---|---|---|
| 6,359,308 B1* | 3/2002 | Hijzen | ................. | H01L 29/407 257/330 |
| 6,620,676 B2* | 9/2003 | Malik | ............... | H01L 21/76224 257/E21.546 |
| 6,790,739 B2* | 9/2004 | Malik | ............... | H01L 21/76224 257/301 |
| 7,160,780 B2* | 1/2007 | Lee | ..................... | H01L 29/7851 257/E21.178 |
| 7,166,514 B2* | 1/2007 | Kang | ................. | H01L 29/7851 257/E21.532 |
| 7,235,445 B2* | 6/2007 | Ha | ................... | H01L 29/66621 257/E21.429 |
| 8,058,680 B2* | 11/2011 | Io | ...................... | H01L 21/28273 257/315 |
| 8,114,743 B2* | 2/2012 | Hiller | ................... | H01L 29/0615 257/330 |
| 8,124,482 B2* | 2/2012 | Denison | .............. | H01L 29/0865 257/288 |
| 8,652,911 B2* | 2/2014 | Bang | ................. | H01L 21/28123 257/E21.443 |
| 9,099,473 B2* | 8/2015 | Kim | ................. | H01L 23/53266 |
| 2008/0121990 A1* | 5/2008 | Hasunuma | ........ | H01L 27/10876 257/333 |
| 2009/0096005 A1* | 4/2009 | Lim | ...................... | H01L 27/115 257/316 |
| 2009/0256212 A1* | 10/2009 | Denison | .............. | H01L 29/0653 257/408 |
| 2010/0072545 A1 | 3/2010 | Ryu et al. | | |
| 2010/0184267 A1 | 7/2010 | Kabe et al. | | |
| 2011/0017586 A1 | 1/2011 | Nakamura et al. | | |
| 2011/0108914 A1* | 5/2011 | Denison | .............. | H01L 29/0865 257/337 |
| 2011/0237037 A1 | 9/2011 | Park et al. | | |
| 2014/0183614 A1* | 7/2014 | Li | ..................... | H01L 29/42324 257/316 |

\* cited by examiner

METHODS OF FABRICATING GATE INSULATING LAYERS IN GATE TRENCHES AND METHODS OF FABRICATING SEMICONDUCTOR DEVICES INCLUDING THE SAME

CROSS-REFERENCE TO RELATED APPLICATION

This application claims priority from Korean Patent Application No. 10-2011-0143701, filed on Dec. 27, 2011, in the Korean Intellectual Property Office (KIPO), the entire contents of which are incorporated herein by reference.

BACKGROUND

1. Field

Example embodiments relate to methods of forming gate insulating layers by oxidizing surfaces of substrates.

2. Description of Related Art

High-integrated semiconductor devices should have fine patterns, low power consumption and low operating voltages. For example, metal-oxide-semiconductor field-effect transistors (MOSFETs) should be turned on/off at a low voltage and have low leakage current through a gate insulating layer, etc. Most problems of the MOSFETs can be solved by forming a gate insulating layer having stable characteristics.

SUMMARY

Example embodiments may provide methods of fabricating semiconductor devices.

Example embodiments may also provide methods of processing wafers.

Example embodiments may also provide methods of fabricating semiconductor devices having gate insulating layers.

Example embodiments may also provide methods of forming gate insulating layers.

In some example embodiments, a method of fabricating a semiconductor device may include: forming a field region defining an active region in a substrate; forming a gate trench in which the active region and the field region in the substrate are partially exposed; forming a gate insulating layer on a surface of the active region exposed in the gate trench, wherein forming the gate insulating layer includes forming a first gate oxide layer by primarily oxidizing the surface of the active region, and/or forming a second gate oxide layer between the surface of the active region and the first gate oxide layer by secondarily oxidizing the surface of the active region; conformally forming a gate barrier layer including metal on the gate insulating layer and the partially exposed field region; forming a gate electrode layer including metal on the gate barrier layer; and/or forming a gate capping layer in contact with the gate insulating layer in the gate trench, the gate barrier layer in the gate trench, and the gate electrode layer in the gate trench.

In some example embodiments, forming a gate trench may include forming a mask pattern for gate trench formation that selectively exposes the active region and the field region on the substrate; and/or etching the active region and the field region using the mask pattern for gate trench formation as an etch mask. Conformally forming a gate barrier layer may include forming a gate barrier material layer on the gate insulating layer, the exposed field region, and the mask pattern for gate trench formation; and/or removing the gate barrier material layer formed on the mask pattern for gate trench formation.

In some example embodiments, the surface of the active region may include a horizontal surface substantially parallel to an upper surface of the substrate, and/or a vertical sidewall surface inclined with respect to the horizontal surface. The field region may include a field bottom surface substantially parallel to the horizontal surface.

In some example embodiments, the horizontal surface may be closer to the upper surface of the substrate than the field bottom surface, and/or the vertical sidewall surface may be between the horizontal surface and the field bottom surface.

In some example embodiments, the horizontal surface may have a $\{100\}$ crystal plane and/or the vertical sidewall surface may have a $\{110\}$ crystal plane.

In some example embodiments, forming a first gate oxide layer may include forming a first external gate oxide layer toward the gate trench from the surface of the active region; and/or forming a first internal gate oxide layer toward a bulk of the substrate from the surface of the active region. The first external gate oxide layer may be thicker than the first internal gate oxide layer.

In some example embodiments, forming a second gate oxide layer may include forming a second external gate oxide layer toward the gate trench from the surface of the active region; and/or forming a second internal gate oxide layer toward the bulk of the substrate from the surface of the active region. The second external gate oxide layer may be thicker than the second internal gate oxide layer.

In some example embodiments, forming a first gate oxide layer may include oxidizing the surface of the active region using plasma. The first gate oxide layer may be about 1.5 to 3.5 times thicker on the horizontal surface of the active region than on the vertical sidewall surface of the active region.

In some example embodiments, forming a first gate oxide layer may further include loading the substrate into a plasma processing chamber; vacuumizing an inside of the plasma processing chamber to pressure greater than or equal to about 10 mTorr and less than or equal to about 500 mTorr; heating the substrate to temperature greater than or equal to about 400° C. and less than or equal to about 600° C.; supplying oxygen and argon gases to the inside of the plasma processing chamber; and/or generating plasma by supplying microwaves to the inside of the plasma processing chamber.

In some example embodiments, forming a first gate oxide layer may further include applying, to the substrate, bias power greater than or equal to about 50 W and less than or equal to about 500 W, at frequency greater than or equal to about 5 MHz and less than or equal to about 50 MHz.

In some example embodiments, forming a first gate oxide layer may further include supplying the oxygen and argon gases at a volume ratio greater than or equal to about 1:5 and less than or equal to about 1:20.

In some example embodiments, forming a first gate oxide layer may further include supplying hydrogen gas to the inside of the plasma processing chamber. The oxygen gas may be supplied in an amount two or more times that of the hydrogen gas.

In some example embodiments, forming a second gate oxide layer may include oxidizing the surface of the active region, which contacts the first gate oxide layer, using heat. The second gate oxide layer may be about 1.5 to 3.5 times thicker on the vertical sidewall surface of the active region than on the horizontal surface of the active region.

In some example embodiments, forming a second gate oxide layer may further include loading the substrate into a thermal processing furnace; supplying oxygen gas to an inside of the thermal processing furnace; and/or heating the substrate to temperature greater than or equal to about 800° C. and less than or equal to about 1100° C.

In some example embodiments, a method of fabricating a semiconductor device may include loading a substrate into a plasma processing chamber; wherein the substrate includes a field region defining an active region, and a gate trench partially exposing the active region and the field region; forming a first gate oxide layer on the active region exposed in the gate trench; unloading the substrate having the first gate oxide layer formed thereon from the plasma processing chamber, and loading the substrate into a thermal processing furnace; forming a gate insulating layer by forming a second gate oxide layer between the active region and the first gate oxide layer; and/or unloading the substrate having the gate insulating layer formed thereon from the thermal processing furnace.

In some example embodiments, a method of fabricating a gate insulating layer may include forming a field region defining an active region in a substrate; forming a gate trench in which the active region and the field region in the substrate are at least partially exposed; forming a first gate oxide layer on horizontal and vertical side surfaces of the active region at least partially exposed in the gate trench by primarily oxidizing the horizontal and vertical side surfaces of the active region; and/or forming a second gate oxide layer between the horizontal and vertical side surfaces of the active region and the first gate oxide layer by secondarily oxidizing the horizontal and vertical side surfaces of the active region.

In some example embodiments, the horizontal and vertical side surfaces of the active region may be primarily oxidized using plasma.

In some example embodiments, the horizontal and vertical side surfaces of the active region may be secondarily oxidized using plasma.

In some example embodiments, the horizontal and vertical side surfaces of the active region may be primarily oxidized using heat.

In some example embodiments, the horizontal and vertical side surfaces of the active region may be secondarily oxidized using heat.

BRIEF DESCRIPTION OF THE DRAWINGS

The above and/or other aspects and advantages will become more apparent and more readily appreciated from the following detailed description of example embodiments, taken in conjunction with the accompanying drawings, in which.

DETAILED DESCRIPTION

Figure 1:
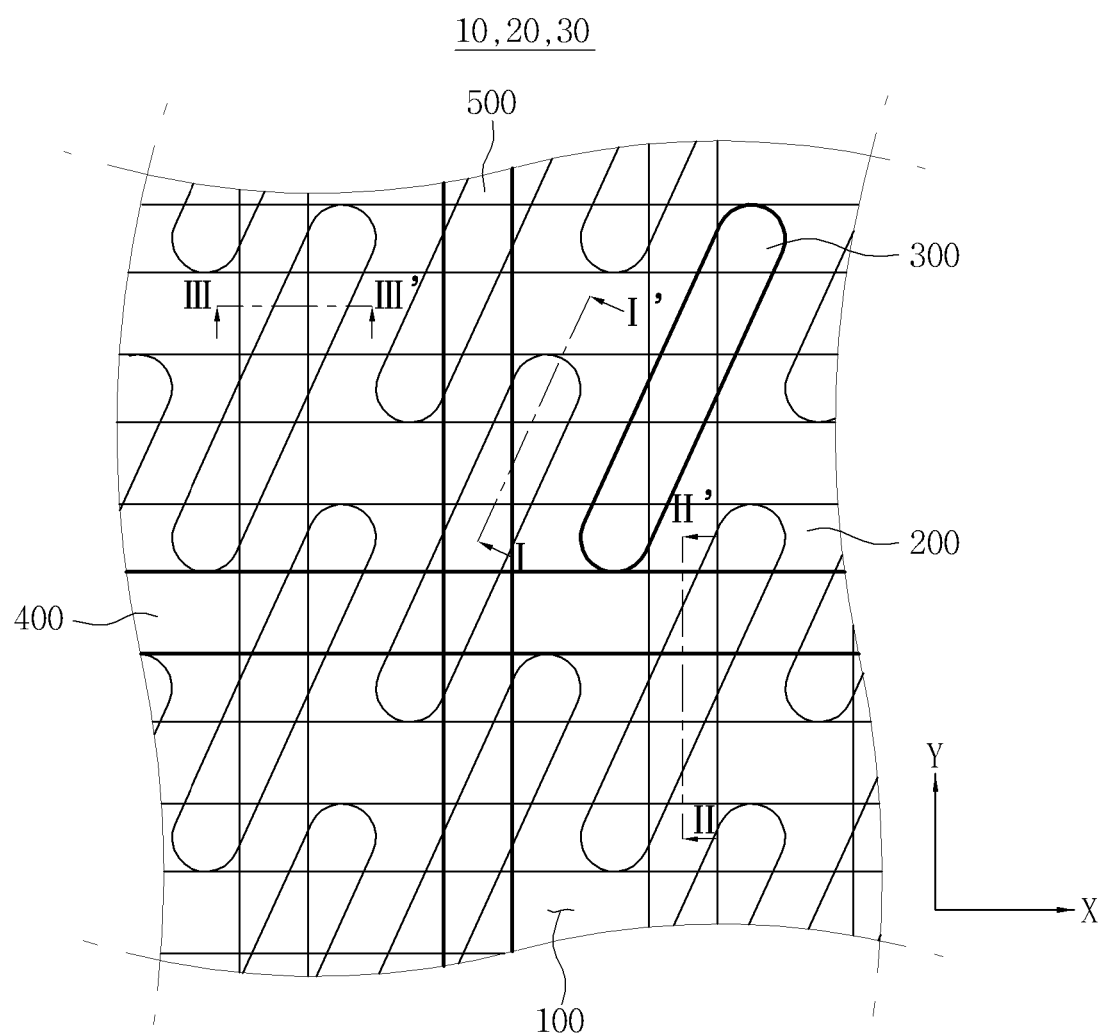
FIG. 1 is a layout view of semiconductor devices in accordance with some example embodiments.

Example embodiments will now be described more fully with reference to the accompanying drawings. Embodiments, however, may be embodied in many different forms and should not be construed as being limited to the embodiments set forth herein. Rather, these example embodiments are provided so that this disclosure will be thorough and complete, and will fully convey the scope to those skilled in the art. In the drawings, the thicknesses of layers and regions may be exaggerated for clarity.

It will be understood that when an element is referred to as being "on," "connected to," "electrically connected to," or "coupled to" to another component, it may be directly on, connected to, electrically connected to, or coupled to the other component or intervening components may be present. In contrast, when a component is referred to as being "directly on," "directly connected to," "directly electrically connected to," or "directly coupled to" another component, there are no intervening components present. As used herein, the term "and/or" includes any and all combinations of one or more of the associated listed items.

It will be understood that although the terms first, second, third, etc., may be used herein to describe various elements, components, regions, layers, and/or sections, these elements, components, regions, layers, and/or sections should not be limited by these terms. These terms are only used to distinguish one element, component, region, layer, and/or section from another element, component, region, layer, and/or section. For example, a first element, component, region, layer, and/or section could be termed a second element, component, region, layer, and/or section without departing from the teachings of example embodiments.

Spatially relative terms, such as "beneath," "below," "lower," "above," "upper," and the like may be used herein for ease of description to describe the relationship of one component and/or feature to another component and/or feature, or other component(s) and/or feature(s), as illustrated in the drawings. It will be understood that the spatially relative terms are intended to encompass different orientations of the device in use or operation in addition to the orientation depicted in the figures.

The terminology used herein is for the purpose of describing particular example embodiments only and is not intended to be limiting of example embodiments. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

Reference will now be made to example embodiments, which are illustrated in the accompanying drawings, wherein like reference numerals may refer to like components throughout.

FIG. 1 is a layout view of semiconductor devices in accordance with some example embodiments.

Referring to FIG. 1, semiconductor devices 10, 20 and 30 in accordance with some example embodiments may include field regions 200 formed in a substrate 100, and active regions 300 defined by the field regions 200. The active regions 300 may be separated and arranged in an island shape. The semiconductor devices 10, 20 and 30 may include word lines 400 and bit lines 500. In this figure, the word lines 400 may extend in an X direction and intersect the field regions 200 and the active regions 300. In this figure, the bit lines 500 may extend in a Y direction and intersect the field regions 200 and the active regions 300. The word lines 400 will be described as gate structures 400 in longitudinal sectional views of FIG. 1. The active regions 300 may be inclined at a desired (or alternatively, predetermined) angle with respect to the X and Y directions. The active regions 300 may have a bar shape.

Figure 2A:
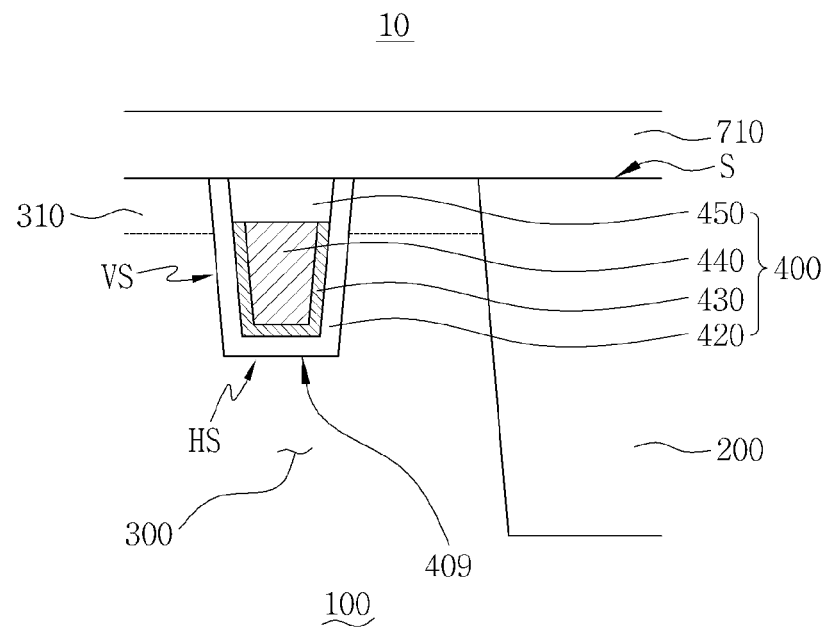
FIG. 2A is a view conceptually showing a longitudinal section taken along line I-I' of FIG. 1, for illustrating a semiconductor device in accordance with some example embodiments.

FIG. 2A is a view conceptually showing a longitudinal section taken along line I-I' of FIG. 1, for illustrating a semiconductor device in accordance with some example embodiments.

Referring to FIG. 2A, a semiconductor device 10 in accordance with some example embodiments may include a gate structure 400 buried in the substrate 100. The substrate 100 may include a field region 200 and an active region 300 defined by the field region 200. The active region 300 may include source/drain regions 310 respectively formed at both sides of the gate structure 400.

The substrate 100 may include a silicon wafer, a silicon on insulator (SOI) substrate, a SiGe substrate, a SiC substrate, a compound semiconductor substrate, or other various substrates.

The gate structure 400 may include a gate insulating layer 420, a gate barrier layer 430, a gate electrode layer 440 and a gate capping layer 450.

The gate insulating layer 420 may be conformally formed on a horizontal surface HS and a vertical sidewall surface VS of a gate trench 409 formed by removing the substrate 100 to a desired (or alternatively, predetermined) depth. Specifically, the level of the top of the gate insulating layer 420 may be substantially identical or similar to the upper surface S of the substrate 100. The gate insulating layer 420 may completely cover the horizontal surface HS and the vertical sidewall surface VS of the gate trench 409. The gate insulating layer 420 may include a silicon oxide material. The vertical sidewall surface VS of the gate trench 409 may have a {110} crystal plane, and the horizontal surface HS may have a {100} crystal plane.

The gate barrier layer 430 may be conformally formed on the gate insulating layer 420 so as to fill the gate trench 409 about halfway. The top of the gate barrier layer 430 may be disposed lower than the upper surface S of the substrate 100. The gate barrier layer 430 may include a single- or multi-layered metal or metal compound. For example, the gate barrier layer 430 may include Ti, TiN, Ta, TaN, Ru, W, TiW, WN and other various metals or metal compounds.

The gate electrode layer 440 may also be formed on the gate barrier layer 430 so as to fill the gate trench 409 about halfway. The upper surface of the gate electrode layer 440 may also be disposed lower than the upper surface S of the substrate 100. In this figure, the upper surface of the gate electrode layer 440 and the top of the gate barrier layer 430 have the same level, but this is merely illustrative. For example, the top of the gate barrier layer 430 may be protruded or recessed from the upper surface of the gate electrode layer 440.

The gate capping layer 450 may be formed on the gate electrode layer 440 so as to completely fill the gate trench 409. Although it has been illustrated in this figure that the gate insulating layer 420 is formed between the substrate 100 and the gate capping layer 450, the substrate 100 and the gate capping layer 450 may be in direct contact with each other. The upper surface of the gate capping layer 450 and the upper surface S of the substrate 100 may be disposed at the same level. The gate capping layer 450 may include the gate insulating layer 420 and another material. For example, the gate insulating layer 420 may include a silicon oxide material, and the gate capping layer 450 may include a silicon nitride material or silicon oxynitride material.

An interlayer insulating layer 710 may be entirely formed on the substrate 100, the field region 200 and the gate structure 400. The interlayer insulating layer 710 may include a silicon oxide material, silicon oxynitride material or silicon nitride material. A contact plug connected to the active region 300 through the interlayer insulating layer 710 may be further formed.

Figure 2B:
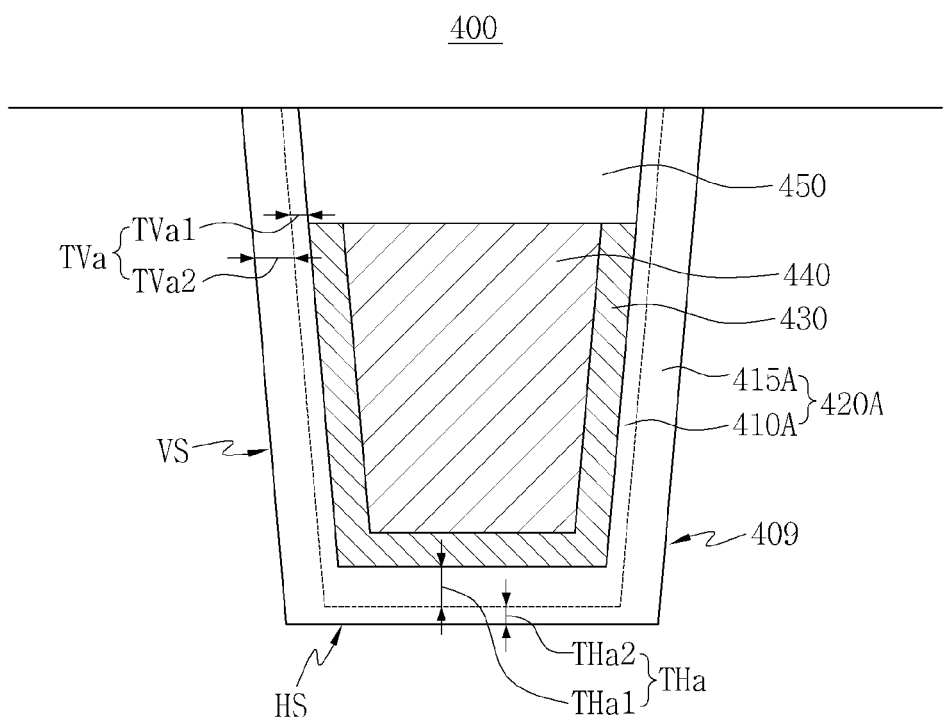
FIGS. 2B and 2C are enlarged views illustrating, in detail, a gate insulating layer of the semiconductor device of FIG. 2A.
Figure 2C:
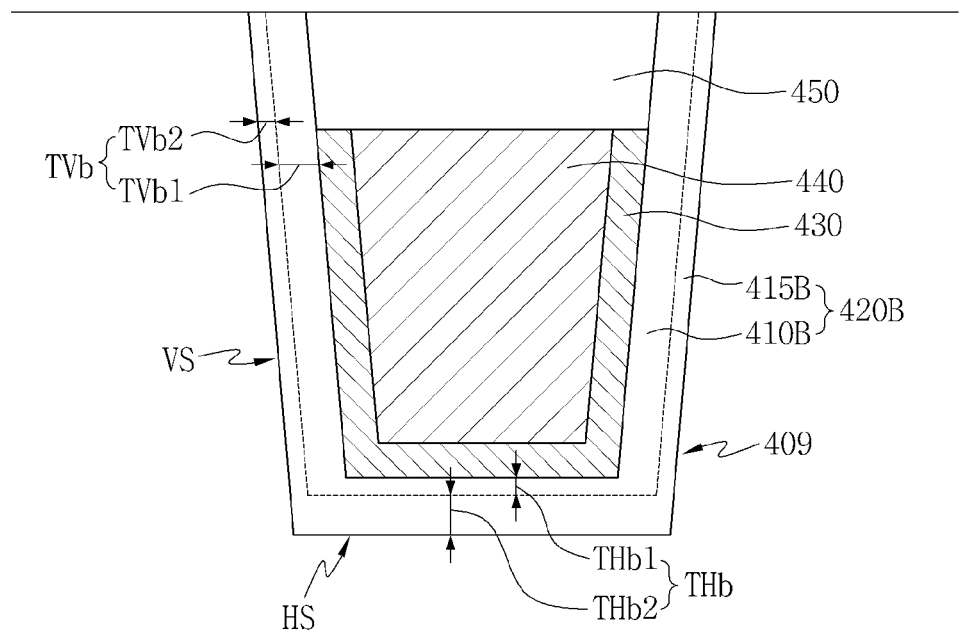

FIGS. 2B and 2C are enlarged views illustrating, in detail, the gate insulating layer 420 of the semiconductor device 10 of FIG. 2A.

Referring to FIG. 2B, a gate insulating layer 420A in accordance with some example embodiments may include a first gate oxide layer 410A and a second gate oxide layer 415A. The first gate oxide layer 410A may be formed in the direction of the inside of the gate trench 409, and the second gate oxide layer 415A may be formed in the direction of the substrate 100. Alternatively, the second gate oxide layer 415A may be formed between the surface of the active region 300 and the first gate oxide layer 410A. More specifically, the second gate oxide layer 415A may be formed between the surface of the active region 300 and the first gate oxide layer 410A. The first gate oxide layer 410A may be formed in a shape covering the surface of the second gate oxide layer 415A. The second gate oxide layer 415A may be formed in a shape surrounding the first gate oxide layer 410A. The first gate oxide layer 410A may be formed about 1.5 to 3.5 times thicker on the horizontal surface HS of the gate trench 409 than on the vertical sidewall surface VS of the gate trench 409 (THa1>TVa1). The second gate oxide layer 415A may be formed about 1.5 to 3.5 times thicker on the vertical sidewall surface VS of the gate trench 409 than on the horizontal surface HS of the gate trench 409 (TVa2>THa2). The thickness of the gate insulating layer 420A formed on the vertical sidewall surface VS of the gate trench 409 may be substantially equal, within a variation of 10%, to that of the gate insulating layer 420A formed on the horizontal surface HS of the gate trench 409 (TVa≈THa).

Referring to FIG. 2C, a gate insulating layer 420B in accordance with some example embodiments may include a first gate oxide layer 410B and a second gate oxide layer 415B. The first gate oxide layer 410B may be formed in the direction of the inside of the gate trench 409, and the second gate oxide layer 415B may be formed in the direction of the substrate 100. Alternatively, the second gate oxide layer 415B may be formed between the surface of the active region 300 and the first gate oxide layer 410B. The first gate oxide layer 410B may be formed in a shape covering the surface of the second gate oxide layer 415B. The second gate oxide layer 415B may be formed in a shape surrounding the first gate oxide layer 410B. The first gate oxide layer 410B may be formed about 1.5 to 3.5 times thicker on the vertical sidewall surface VS of the gate trench 409 than on the horizontal surface HS of the gate trench 409 (TVb1>THb1). The second gate oxide layer 415B may be formed about 1.5 to 3.5 times thicker on the horizontal surface HS of the gate trench 409 than on the vertical sidewall surface VS of the gate trench 409 (THb2>TVb2). The thickness of the gate insulating layer 420B formed on the vertical sidewall surface VS of the gate trench 409 may be substantially equal, within a variation of 10%, to that of the gate insulating layer 420B formed on the horizontal surface HS of the gate trench 409 (TVb≈THb).

Figure 3A:
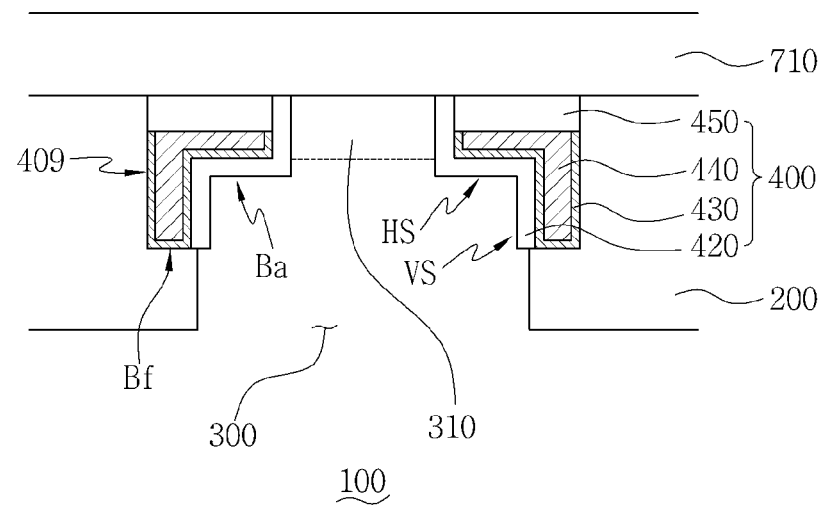
FIG. 3A is a view conceptually showing a longitudinal section taken along line II-II' of FIG. 1, for illustrating a semiconductor device in accordance with some example embodiments.

FIG. 3A is a view conceptually showing a longitudinal section taken along line II-II' of FIG. 1, for illustrating a semiconductor device in accordance with some example embodiments.

Referring to FIG. 3A, a semiconductor device 20 in accordance with some example embodiments may include a gate structure 400 buried in the substrate 100. When comparing the semiconductor device 20 with the semiconductor device 10 shown in FIG. 2A, the gate trench 409 may be formed in the field region 200 and the active region 300. In other words, both the field region 200 and the active region 300 may be exposed in the gate trench 409. The vertical sidewall surface VS of the gate trench 409 may have a {110}crystal plane, and the horizontal surface HS of the gate trench 409 may have a {100} crystal plane.

The gate trench 409 may have an active bottom surface Ba formed relatively high in a position corresponding to the active region 300, and a field bottom surface Bf formed relatively low in a position corresponding to the field region 200. The term "relatively high" can be understood as a meaning that the active bottom surface Ba is relatively close to the upper surface of the substrate 100. The term "relatively low" can be understood as a meaning that the active bottom surface Ba is not relatively close to the upper surface of the substrate 100. That is, the gate trench 409 is formed in a step shape and may include the bottom surfaces Ba and Bf having a step difference. Therefore, the gate insulating layer 420 and the gate barrier layer 430 may be formed to correspond to the profile of the active bottom surface Ba and the field bottom surface Bf. The shape of the lower portion of the gate electrode layer 440 may also be formed to correspond to the profile of the active bottom surface Ba and the field bottom surface Bf. The other components undescribed herein can be understood with reference to FIG. 2A.

Figure 3B:
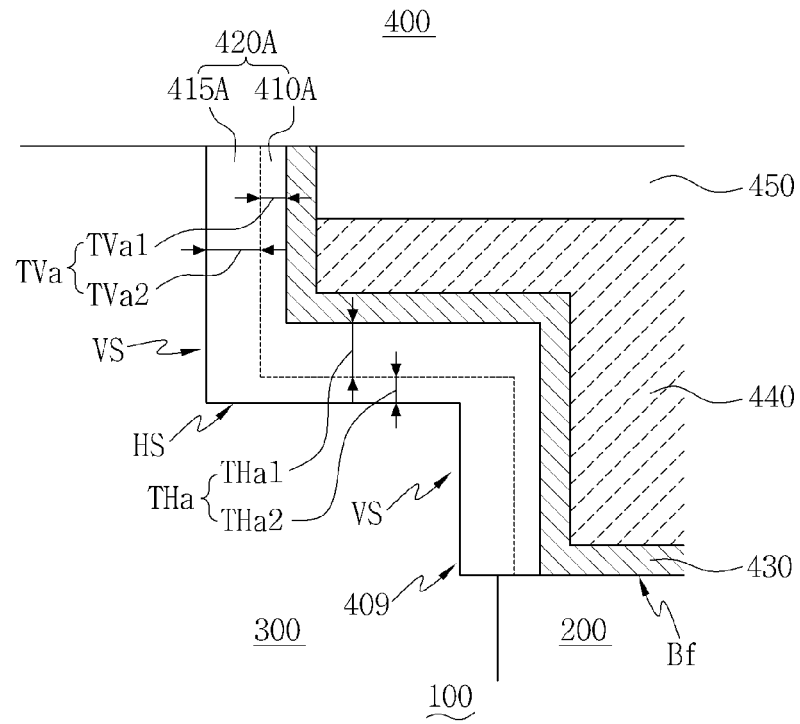
FIGS. 3B and 3C are enlarged views illustrating, in detail, a gate insulating layer of the semiconductor device of FIG. 3A.
Figure 3C:
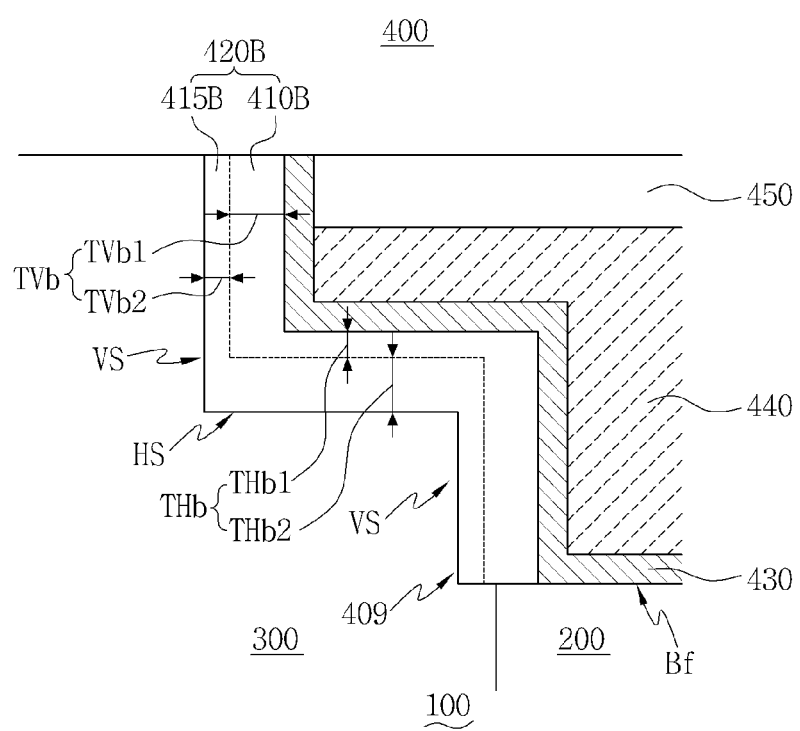

FIGS. 3B and 3C are enlarged views illustrating, in detail, the gate insulating layer 420 of the semiconductor device 20 of FIG. 3A.

Referring to FIG. 3B, a gate insulating layer 420A in accordance with some example embodiments may include a first gate oxide layer 410A and a second gate oxide layer 415A. The first gate oxide layer 410A may be formed in the direction of the inside of the gate trench 409, and the second gate oxide layer 415A may be formed in the direction of the substrate 100. Alternatively, the second gate oxide layer 415A may be formed between the surface of the active region 300 and the first gate oxide layer 410A. The first gate oxide layer 410A may be formed in a shape covering the surface of the second gate oxide layer 415A. The second gate oxide layer 415A may be formed in a shape surrounding the first gate oxide layer 410A. The first gate oxide layer 410A may be formed about 1.5 to 3.5 times thicker on the horizontal surface HS of the gate trench 409 than on the vertical sidewall surface VS of the gate trench 409 (THa1>TVa1). The second gate oxide layer 415A may be formed about 1.5 to 3.5 times thicker on the vertical sidewall surface VS of the gate trench 409 than on the horizontal surface HS of the gate trench 409 (TVa2>THa2). The thickness of the gate insulating layer 420A formed on the vertical sidewall surface VS of the gate trench may be substantially equal, within a variation of 10%, to that of the gate insulating layer 420A formed on the horizontal surface HS of the gate trench 409 (TVa≈THa).

Referring to FIG. 3C, a gate insulating layer 420B in accordance with some example embodiments may include a first gate oxide layer 410B and a second gate oxide layer 415B. The first gate oxide layer 410B may be formed in the direction of the inside of the gate trench 409, and the second gate oxide layer 415B may be formed in the direction of the substrate 100. Alternatively, the second gate oxide layer 415B may be formed between the surface of the active region 300 and the first gate oxide layer 410B. The first gate oxide layer 410B may be formed in a shape covering the surface of the second gate oxide layer 415B. The second gate oxide layer 415B may be formed in a shape surrounding the first gate oxide layer 410B. The first gate oxide layer 410B may be formed about 1.5 to 3.5 times thicker on the vertical sidewall surface VS of the gate trench 409 than on the horizontal surface HS of the gate trench 409 (TVb1>THb1). The second gate oxide layer 415B may be formed about 1.5 to 3.5 time thicker on the horizontal surface HS of the gate trench 409 than on the vertical sidewall surface VS of the gate trench 409 (THb2>TVb2). The thickness of the gate insulating layer 420B formed on the vertical sidewall surface VS of the gate trench 409 may be substantially equal, within a variation of 10%, to that of the gate insulating layer 420B formed on the horizontal surface HS of the gate trench 409 (TVb≈THb).

Figure 4A:
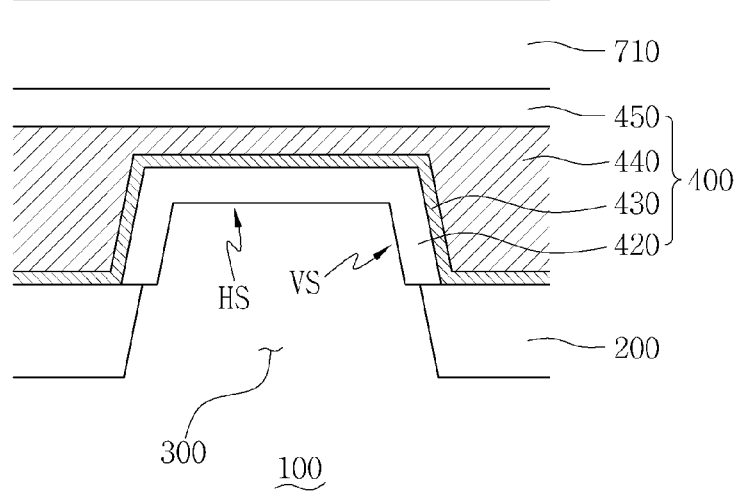
FIG. 4A is a view conceptually showing a longitudinal section taken along line III-III' of FIG. 1, for illustrating a semiconductor device in accordance with some example embodiments.

FIG. 4A is a view conceptually showing a longitudinal section taken along line III-III' of FIG. 1, for illustrating a semiconductor device in accordance with some example embodiments.

Referring to FIG. 4A, a semiconductor device 30 in accordance with some example embodiments may include a field region 200 formed in the substrate 100. The field region 200 may define an active region 300. The semiconductor device 30 may include a gate structure having an indented shape formed on the field region 200 and the active region 300. The gate structure 400 may have an indented bottom surface. Specifically, the bottom surface of the gate structure 400 may have a relatively high level on the active region 300, and a relatively low level on the field region 200.

The gate structure 400 may include a gate insulating layer 420, a gate barrier layer 430, a gate electrode layer 440 and a gate capping layer 450. The gate insulating layer 420 may be formed on the horizontal surface HS and the vertical sidewall surface VS of the active region 300. The gate insulating layer 420 may be formed in a shape grown in the directions of the inside and outside of the surfaces HS and VS of the active region 300. A detailed profile of the gate insulating layer 420 will be described in other figures. The horizontal surface HS may have a {100}crystal plane, and the vertical sidewall surface VS may have a {110}crystal plane.

The gate barrier layer 430 may be formed on the gate insulating layer 420. The gate barrier layer 430 may also be formed at an upper portion of the field region 200. The gate electrode 440 may be formed on the gate barrier layer 430. The gate electrode layer 440 may have a relatively flat top surface.

The insulative gate capping layer 450 may be formed on the gate electrode layer 440. An interlayer insulating layer 710 may be formed on the gate capping layer 450.

Figure 4B:
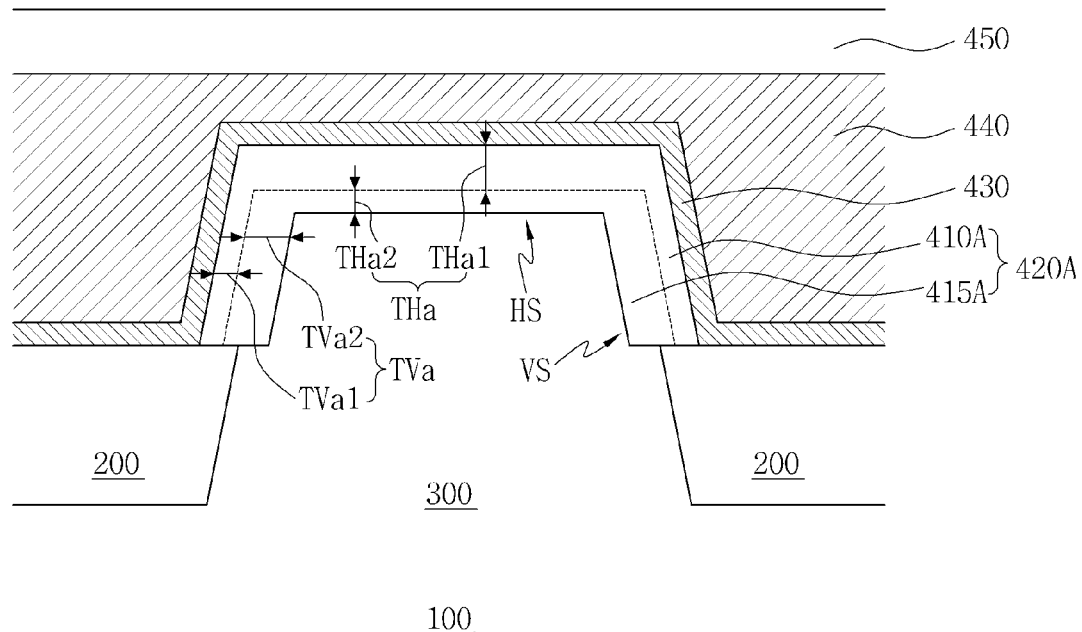
FIGS. 4B and 4C are enlarged views illustrating, in detail, a gate insulating layer of the semiconductor device of FIG. 4A.
Figure 4C:
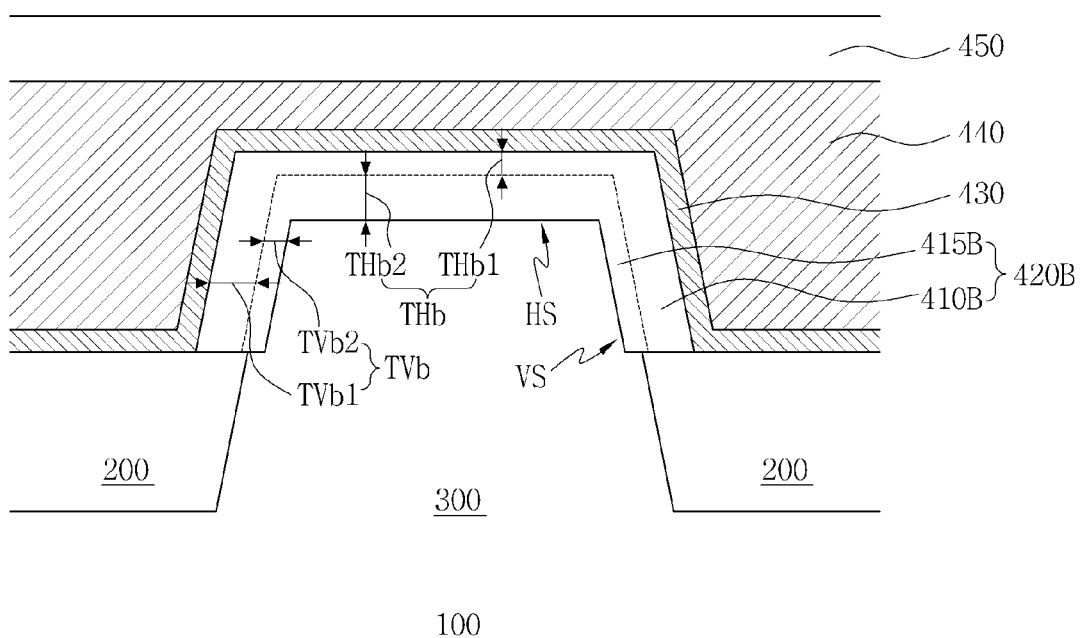

FIGS. 4B and 4C are enlarged views illustrating, in detail, the gate insulating layer 420 of the semiconductor device 30 of FIG. 4A.

Referring to FIG. 4B, a gate insulating layer 420A of the semiconductor device 30 in accordance with some example embodiments may include a first gate oxide layer 410A and a second gate oxide layer 415A.

The total thickness THa1 of the first gate oxide layer 410A formed on the horizontal surface HS of the active region 300 may be about 1.5 to 3.5 times thicker than that TVa1 of the first gate oxide layer 410A formed on the vertical sidewall surface VS of the active region 300 (THa1>TVa1).

The total thickness TVa2 of the second gate oxide layer 415A formed on the vertical sidewall surface VS of the active region 300 may be about 1.5 to 3.5 times thicker than that THa2 of the second gate oxide layer 415A formed on the horizontal surface HS of the active region 300 (TVa2>THa2).

The gate insulating layer 420A may be equal in total thickness on the vertical sidewall surface VS and horizontal surface HS of the active region 300 (TVa≈THa). In another embodiment, the gate insulating layer 420A may be formed to be relatively thick on the vertical sidewall surface VS of the active region 300, and relatively thin on the horizontal surface HS of the active region 300. In still another embodiment, the gate insulating layer 420A may be formed to be relatively thick on the horizontal surface HS of the active region 300, and relatively thin on the vertical sidewall surface VS of the active region 300. In all the embodiments described above, the thickness TVa of the gate insulating surface 420A formed on the vertical sidewall surface VS of the active region 300 may be equal, within a variation of 10%, to that THa of the gate insulating layer 420A formed on the horizontal surface HS of the active region 300 (THa≈TVa).

Referring to FIG. 4C, a gate insulating layer 420B of the semiconductor device 30 in accordance with some example embodiments may include a first gate oxide layer 410B and a second gate oxide layer 415B.

The total thickness TVb1 of the first gate oxide layer 410B formed on the vertical sidewall surface VS of the active region 300 may be about 1.5 to 3.5 times thicker than that THb1 of the first gate oxide layer 410B formed on the horizontal surface HS of the active region 300 (TVb1>THb1).

The total thickness THb2 of the second gate oxide layer 415B formed on the horizontal surface HS of the active region 300 may be about 1.5 to 3.5 times thicker than that TVb2 of the second gate oxide layer 415B formed on the vertical sidewall surface VS of the active region 300 (THb2>TVb2).

The gate insulating layer 420B may have a same thickness on the vertical sidewall surface VS and horizontal surface HS of the active region 300 (TVb≈THb). In another embodiment, the gate insulating layer 420B may be formed to be relatively thick on the vertical sidewall surface VS of the active region 300, and relatively thin on the horizontal surface HS of the active region 300. In still another embodiment, the gate insulating layer 420B may be formed to be relatively thick on the horizontal surface HS of the active region 300, and relatively thin on the vertical sidewall surface VS of the active region 300. In all the embodiments described above, the thickness TVb of the gate insulating layer 420B formed on the vertical sidewall surface VS of the active region 300 may be equal, within a variation of 10%, to that THb of the gate insulating layer 420B formed on the horizontal surface HS of the active region 300 (TVb≈THb).

FIGS. 5A to 5D are flowcharts conceptually illustrating methods of fabricating semiconductor devices in accordance with some example embodiments.

FIGS. 6A to 6K are longitudinal sectional views taken along line I-I' of FIG. 1, conceptually illustrating a method of fabricating the semiconductor device 10 of FIG. 2.

Figure 5A:
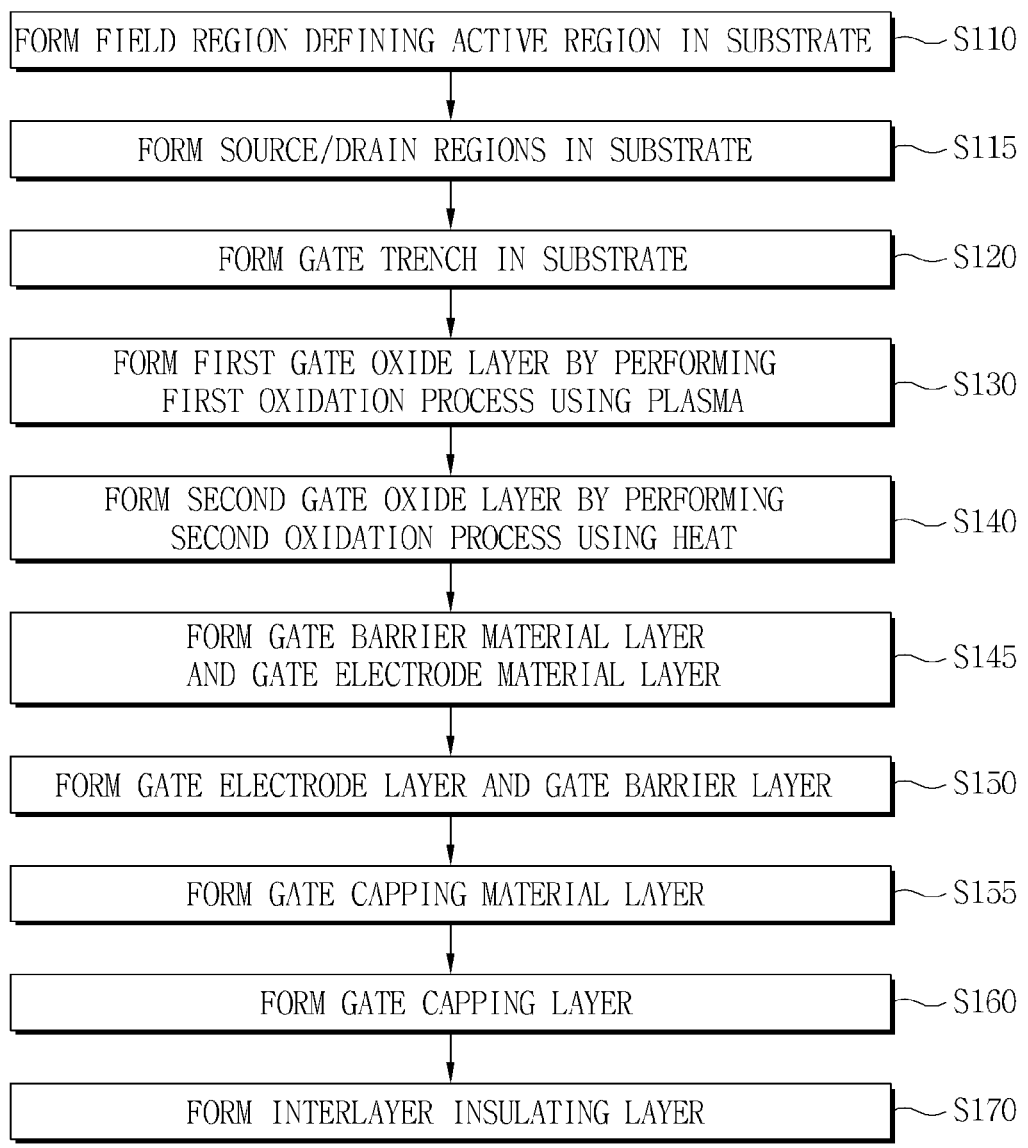
FIGS. 5A to 5D are flowcharts conceptually illustrating methods of fabricating semiconductor devices in accordance with some example embodiments.
Figure 6A:
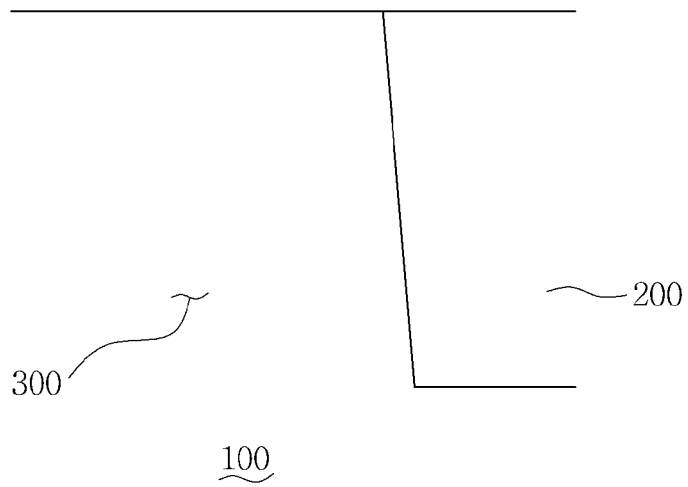
FIGS. 6A to 6K are longitudinal sectional views taken along line I-I' of FIG. 1, conceptually illustrating a method of fabricating the semiconductor device of FIG. 2.

Referring to FIGS. 5A and 6A, a method of fabricating the semiconductor device in accordance with some example embodiments may include forming a field region 200 that defines an active region 300 in a substrate 100 (S110). The substrate 100 may include a silicon bulk substrate including single crystalline silicon, a silicon on insulator substrate, a SiGe epitaxy substrate, a SiC epitaxy substrate, or other various semiconductor substrates. The surface of the substrate 100 may have a {100} crystal plane. The field region 200 may be formed using a shallow trench isolation (STI) technique. The side of the field region 200 may be tapered. The forming of the field region 200 may include forming a trench in the substrate 100, and filling the trench with an insulation material such as a silicon oxide material and/or a silicon nitride material.

Figure 6B:
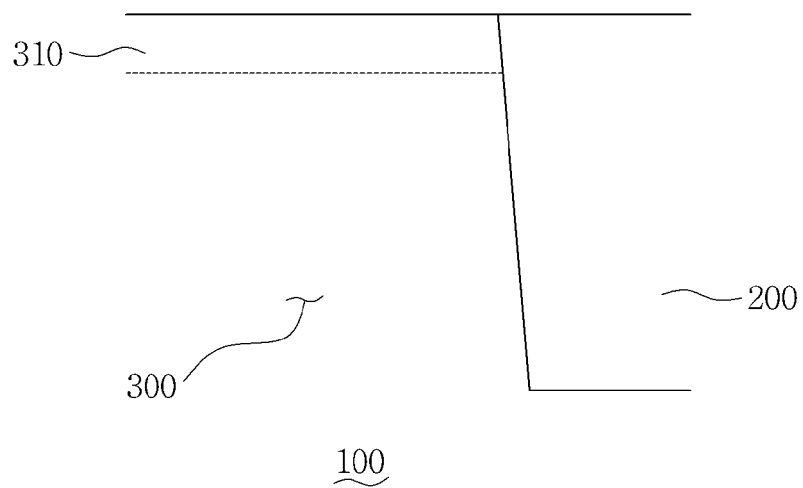

Referring to FIGS. 5A and 6B, the method may include forming source/drain regions 310 in the active region 300 of the substrate 100 (S115). The forming of the source/drain regions 310 may include implanting phosphorous (P), arsenic (As) or boron (B) ions into the substrate 100.

Figure 6C:
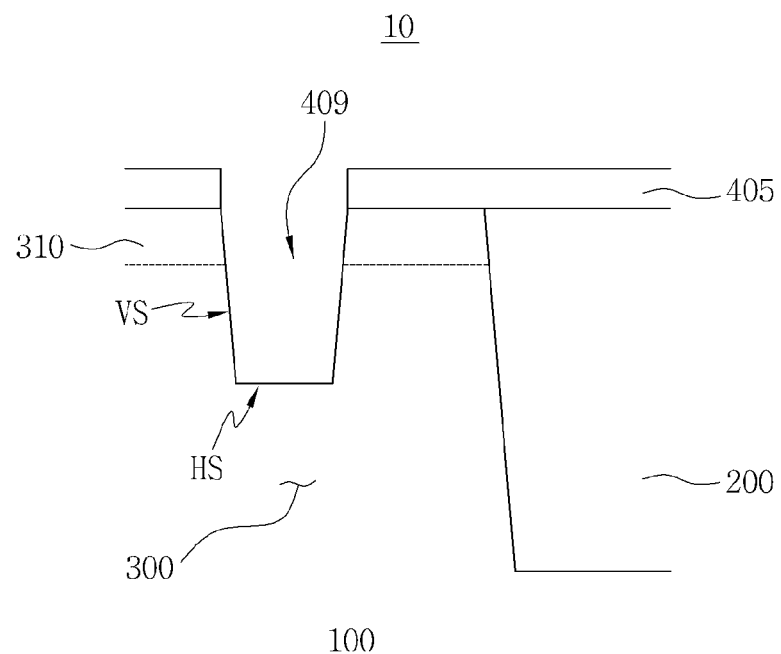

Referring to FIGS. 5A and 6C, the method may include forming a gate trench 409 in the substrate 100 (S120). The forming of the gate trench 409 may include forming a mask pattern 405 for trench formation on the substrate 100, and etching the substrate 100 using the mask pattern 405 for trench formation as an etch mask. The vertical sidewall surface VS of the gate trench 409 may have a {110} crystal plane. The horizontal surface HS of the gate trench 409 may have a {100} crystal plane. The gate trench 409 may have a greater vertical depth than a horizontal width. That is, an aspect ratio of the gate trench 409 may be greater than 1. In this embodiment, the aspect ratio of the gate trench 409 may be greater than 1.25, for example. The forming of the gate trench 409 may include forming the mask pattern 405 for trench formation on the substrate 100, and etching the substrate 100 using the mask pattern 405 for trench formation as an etch mask. The mask pattern 405 for trench formation may include a silicon oxide material, a silicon nitride material, a silicon oxynitride material, or spin-on-hardmask (SOH). The gate trench 409 may intersect the field region 200 and/or the active region 300.

Figure 6D:
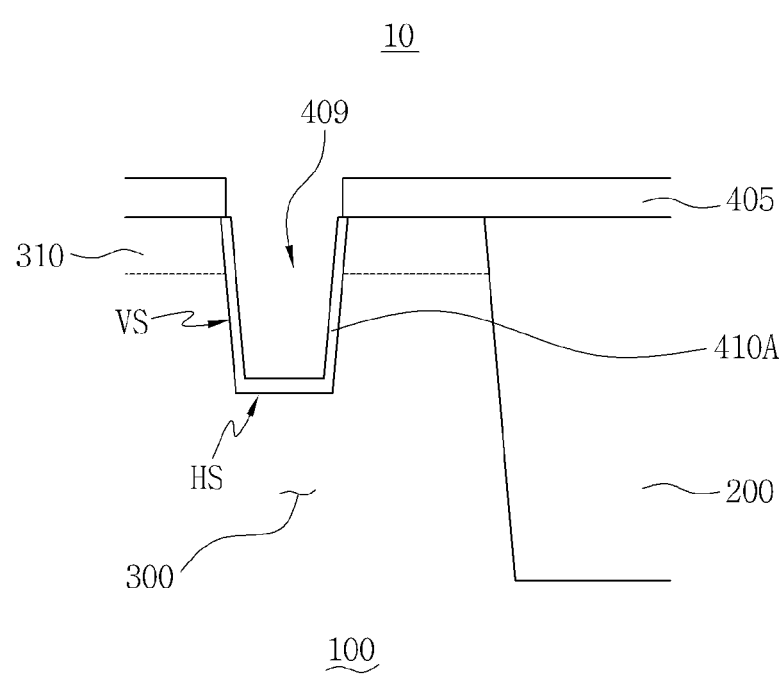

Referring to FIGS. 5A and 6D, the method may include forming a first gate oxide layer 410A in the gate trench 409 by performing a first oxidation process (S130). The first oxidation process may include oxidizing the surface of the substrate 100 exposed in the gate trench 409.

The first oxidation process may include diffusing, infiltrating or implanting oxygen ions excited in a plasma state into the substrate 100. The oxygen ions may chemically react with silicon atoms, thereby forming a silicon oxide material. That is, the first oxidation process may include converting Si—Si bonds to Si—O bonds. In addition, the first oxidation process may exclude depositing an oxide material on the substrate 100. The first gate oxide layer 410A may be formed on the exposed surface of the substrate 100. In other words, the first gate oxide layer 410A may be formed at the inside and outside of a virtual trench surface 408.

The first oxidation process may include a first plasma oxidation process.

The first plasma oxidation process may include supplying argon (Ar) gas having a flow rate of about 100 to 700 standard cubic centimeters/minute (sccm). Ar gas is an optimal inert gas in the plasma oxidation process in accordance with some example embodiments. For example, argon (Ar) gas is a gas capable of implementing the most stable plasma at the most moderate price under process conditions of the plasma oxidation process. When the flow rate of argon (Ar) gas is too small, it is difficult to produce plasma with an appropriate energy. When the flow rate of argon (Ar) gas is too large, the content rate of reactive ions in the plasma is low, and therefore, the reactivity of the plasma may be lowered. The first plasma oxidation process may include supplying oxygen ($O_2$) gas having a flow rate of about 10 to 100 sccm. When the flow rate of oxygen gas is too small, it is difficult to obtain sufficient oxygen ions in the plasma, and therefore, productivity may be lowered. When the flow rate of oxygen gas is too large, it is difficult to control reaction rate, and an abnormal reaction may occur. For example, the plasma oxidation process may include supplying argon gas at a flow rate or volume rate about 5 to 20 times more than that of oxygen gas (Ar: $O_2 \approx$ 1:5 to 1:20).

The first plasma oxidation process may include supplying hydrogen ($H_2$) gas having a flow rate of about 5 to 100 sccm. When the flow rate of hydrogen gas is too small or large, it is difficult to control reaction rate, and a defect may exist in the inside or surface of an oxide material to be formed. For example, a buffering point may be produced as hydrogen is bonded to a single dangling bond, etc., and the surface of the oxide material may be smoothly processed. However, in the first plasma oxidation process, the flow rate of argon gas may be the largest, and the flow rate of hydrogen gas may be the smallest. The flow rate of argon gas may be at least two times more than that of oxygen gas. The flow rate of oxygen gas may be 1.5 to 3 times more than that of hydrogen gas. The first plasma oxidation process may include heating the substrate 100 to a temperature of about 400 to 600° C. The heating of the substrate 100 may include maintaining the temperature of a chuck or stage having the substrate 100 loaded thereon to at about 400 to 600° C.

If the temperature of the substrate 100 is too low, the rate of an oxidation reaction is lowered. If the temperature of the substrate 100 is too high, durability of equipment may be degraded and it may be difficult to control the rate of the oxidation reaction. The first plasma oxidation process may be performed under a pressure of about 10 to 50 mTorr. When the pressure is high, a relatively large quantity of oxygen radical (O*) may exist in the plasma, and a relatively small quantity of oxygen ions may exist in the plasma. For example, under normal pressure or higher, the oxygen radical (O*) mostly exists in the plasma and an ultra small quantity of oxygen ions exist in the plasma. As pressure is lowered, the ratio of oxygen ion to oxygen radical (O*) in the plasma may increase. If pressure is experimentally lowered to about a few hundreds of mTorr, the ratio of oxygen ion to oxygen radical (0*) may be maintained as about 70:30 to 90:10. The ratio may be applied in approximately conformally forming the first gate oxide layer 410A. However, the first gate oxide layer 410A may be formed relatively thick on the bottom surface of the gate trench 409. Specifically, as the pressure is lowered to about 10 to 50 mTorr, the ratio of oxygen ion to oxygen radical (O*) in the plasma can be controlled to be about 55:45 to 45:55. The ratio is a result experimentally obtained as a potentially optimal ratio.

According to some example embodiments, when the substrate 100 is processed by producing plasma containing the oxygen radical (O*) and the oxygen ion at the ratio of about 55:45 to 45:55, a portion of the first gate oxide layer 410A formed on the bottom surface of the gate trench 409 may be formed thicker than that of the first gate oxide layer 410A formed on sidewalls of the gate trench 409. Consequently, according to some example embodiments, the ratio of oxygen ion to oxygen radical (O*) in the plasma is controlled using pressure, so that the final thickness of the gate insulating layer 420A can be desired (or alternatively, predetermined). In addition, the ratio of oxygen ion to oxygen radical (O*) is increased by further lowering the pressure, so that it is possible to further increase the ratio or difference between the thickness of the first gate oxide layer 410A formed on the bottom surface of the gate trench 409 and the thickness of the first gate oxide layer 410A formed on the sidewall of the gate trench 409. As a result, the pressure proposed in this embodiment can pre-correct the difference in the thickness of the gate insulating layer 420A formed by a thermal oxidation reaction. Bias power may not be supplied in the first plasma oxidation process. Although bias power is not supplied, the oxygen ions (O+) may be drifted by the self-electric field of the plasma. Although bias power is not supplied, the oxygen ions (O+) may move toward the bottom surface of the gate trench 409. The first plasma oxidation process may include generating plasma by supplying a microwave of 2.45 GHz with a power of about 1.5 to 3.8 KW. The microwave of 2.45 GHz is widely used in industrial technologies, and thus the process can be simplified and performed at low cost. If power of the microwaves is too low, it may be insufficient to excite a reactive gas to a plasma state. That is, reactive oxygen ions may not be sufficiently generated. If power of the microwaves is too high, durability of equipment may be negatively affected, and a surplus of oxygen ions may be generated. For example, the first plasma oxidation process in accordance with this embodiment may include supplying a microwave of 2.45 GHz with a power of about 3.1 to 3.6 KW.

Alternatively, the first oxidation process may include a second plasma oxidation process. The second plasma oxidation process may be performed under a pressure of about 100 to 500 mTorr. That is, the second plasma oxidation process may be performed under a pressure higher than the first plasma oxidation process. The second plasma oxidation process may include applying bias power to the substrate 100. For example, the second plasma oxidation process may include applying pulses or sine waves having a frequency of 5 KHz to 50 MHz as the bias power. The bias power may be about 50 to 500 W. The second plasma oxidation process may include generating plasma by supplying a microwave of 2.45 GHz with a power of about 1.5 to 3.8 KW. The second plasma oxidation process may include supplying argon (Ar) gas having a flow rate of about 100 to 700 sccm. The second plasma oxidation process may include supplying oxygen ($O_2$) gas having a flow rate of about 10 to 100 sccm. The second plasma oxidation process may include supplying hydrogen ($H_2$) gas having a flow rate of about 5 to 100 sccm. The second plasma oxidation process may include heating the substrate 100 to a temperature of about 400 to 600° C. The heating of the substrate 100 may include maintaining the temperature of a chuck or stage having the substrate 100 loaded thereon to at about 400 to 600° C.

Alternatively, the first oxidation process may include a third plasma oxidation process. The third plasma oxidation process may be performed under a pressure of about 10 to 500 mTorr. The third plasma oxidation process may include supplying bias power to the substrate 100. For example, the third plasma oxidation process may include applying pulses or sine waves having a frequency of 5 KHz to 50 MHz as the bias power. A radio frequency (RF) bias power of 13.56 MHz may be supplied, for example, as about 50 to 500 W. The first gate oxide layer 410A formed by the first oxidation process may be formed relatively thick on the bottom surface of the gate trench 409, and relatively thin on the sidewall of the gate trench 409. The third plasma oxidation process may include generating plasma by supplying a microwave of 2.45 GHz with a power of about 1.5 to 3.8 KW. The third plasma oxidation process may include supplying argon (Ar) gas having a flow rate of about 100 to 700 sccm. The third plasma oxidation process may include supplying oxygen ($O_2$) gas having a flow rate of about 10 to 100 sccm. The third plasma oxidation process may include supplying hydrogen ($H_2$) gas having a flow rate of about 5 to 100 sccm. The third plasma oxidation process may include heating the substrate 100 to a temperature of about 400 to 600° C. The heating of the substrate 100 may include maintaining the temperature of a chuck or stage having the substrate 100 loaded thereon to at about 400 to 600° C.

The first oxidation process may be performed in the state in which the mask pattern 405 for trench formation exists. When the mask pattern 405 for trench formation does not exist, the first gate oxide layer 410A may also be extended and formed on the upper surface of the substrate 100. The oxide layer formed on the upper surface of the substrate 100 is an unnecessary component, and therefore may be removed later. That is, a process of removing an oxide material may be added to the first oxidation process. The process of removing the oxide material formed on the upper surface of the substrate 100 may damage not only the surface of the substrate 100 but also the upper portion of the field region 200. Therefore, the mask pattern 405 for trench formation exists in order to form the first gate oxide layer 410A only on the surface of the active region 300 exposed in the gate trench 409. Even when the mask pattern 405 for trench formation is removed and another mask pattern is formed by another process, the process also may damage the active region 300 and the upper portion of the field region 200. Therefore, the mask pattern 405 for trench formation may remain on the substrate 100.

Figure 6E:
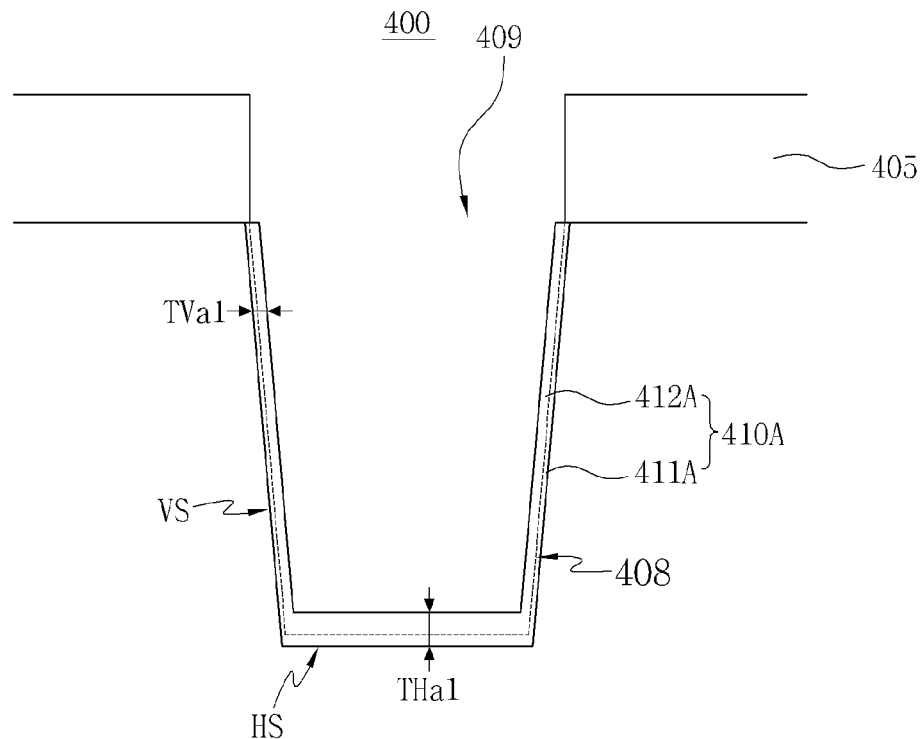

FIG. 6E is an enlarged view of a portion of FIG. 6D so that the first gate oxide layer 410A is viewed in detail.

Referring to FIG. 6E, the first gate oxide layer 410A may include a first internal gate oxide layer 411A grown in the direction of the inside of the substrate 100, and a first external gate oxide layer 412A grown in the direction of the surface of the substrate 100. The gate trench 409 of FIG. 6D, i.e. the surface of the substrate 100 may be indicated by a dotted line as a meaning that the gate trench 409, i.e. the surface of the substrate 100, virtually exists. The dotted line can be understood as a virtual trench surface 408. Therefore, the top of the virtual trench surface 408 may be aligned vertically to the side of the mask pattern 405 for trench formation. The first external gate oxide layer 412A may be about 1.25 to 2 times thicker than the first internal gate oxide layer 411A.

The first gate oxide layer 410A may have a first sidewall thickness TVa1 and a first bottom thickness THa1. The first sidewall thickness TVa1 may mean a total thickness of the first gate oxide layer 410A formed on the vertical sidewall surface VS of the gate trench 409. The first bottom thickness THa1 may mean a total thickness of the first gate oxide layer 410A formed on the horizontal surface HS of the gate trench 409. The first bottom thickness THa1 may be thicker than the first sidewall thickness TVa1 (THa1>TVa1). For example, the first bottom thickness THa1 may be 1.5 to 3.5 times thicker than the first sidewall thickness TVa1. Each of the thicknesses TVa1 and THa1 may be construed as the total average thickness or the thickness at a specific position. The term "thickness at a specific position" may be construed as the thickness at a specific position in a region having a visually average thickness.

Figure 6F:
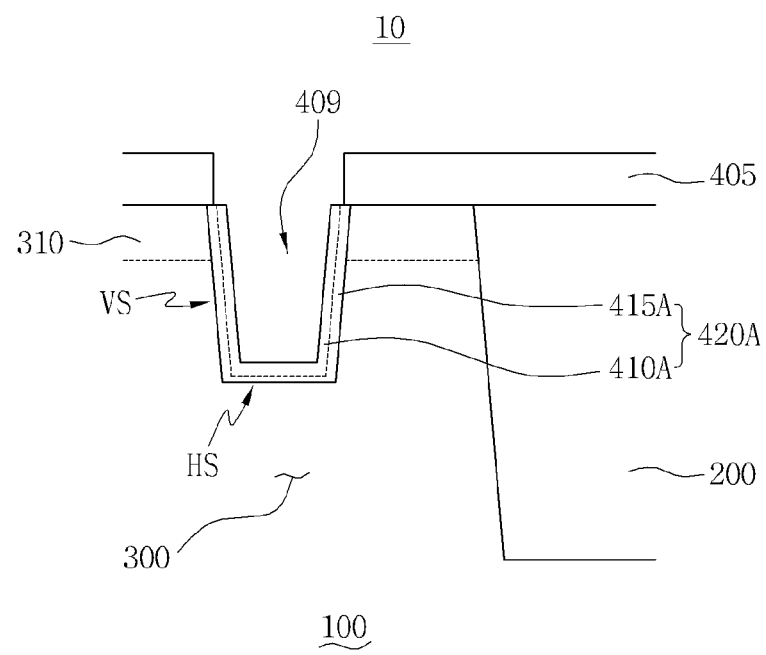

Referring to FIGS. 5A and 6F, the method may include forming a gate insulating layer 420A by performing the second oxidation process (S140). The second oxidation process may include forming a second gate oxide layer 415A between the active region 300 and the first gate oxide layer 410A. That is, the gate insulating layer 420A may include the first gate oxide layer 410A and the second gate oxide layer 415A. The second oxidation process may include oxidizing the substrate 100 using a thermal oxidation method. In addition, the second oxidation process may exclude depositing an oxide material on the substrate 100.

The second oxidation process may include a thermal oxidation process. That is, the second oxidation process may include chemically bonding a silicon atom and an oxygen atom by diffusing or infiltrating oxygen radical (O*) excited by thermal energy into the substrate 100. The thermal oxidation process may be performed under pressure lower than a normal press, specifically, under a pressure of about 50 to 760 Torr. The thermal oxidation process may include supplying oxygen ($O_2$) gas having a flow rate of about 500 to 30000 sccm. The thermal oxidation process may include supplying hydrogen ($H_2$) gas having a flow rate of about 100 to 3000 sccm. The thermal oxidation process may include heating the substrate 100 to a temperature of about 800 to 1100° C. The heating of the substrate 100 may maintain the temperature of the chuck or stage having the substrate 100 loaded thereon to at about 800 to 1100° C. According to the first and second oxidation processes, the gate insulating layer 420A having an entirely uniform thickness can be conformally formed on the surface of the substrate 100 and the sidewall and bottom surface of the gate trench 409.

Figure 6G:
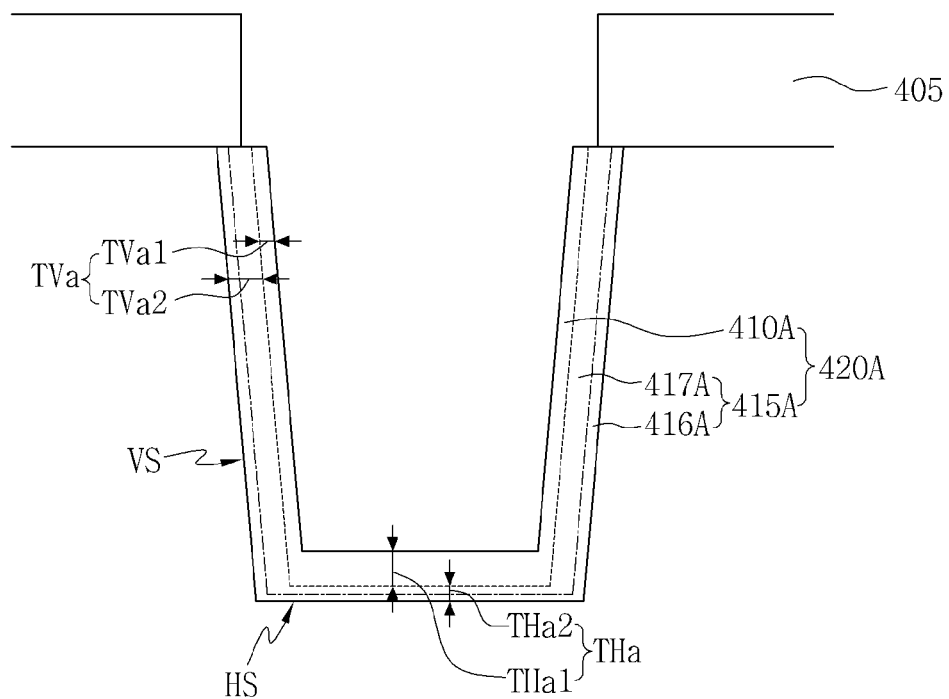

FIG. 6G is an enlarged view of a portion of FIG. 6F so that the gate insulating layer 420A is viewed in detail.

Referring to FIG. 6G, the gate insulating layer 420A may include a first gate oxide layer 410A and a second gate oxide layer 415A. The second gate oxide layer 415A may include a second internal gate oxide layer 416A formed in the direction of the inside of the substrate 100, and a second external gate oxide layer 417A formed in the direction of the outside of the substrate 100. The second external gate oxide layer 417A may be about 1.25 to 2 times thicker than the second internal gate oxide layer 416A.

According to the thermal oxidation process, the second gate oxide layer 415A may be formed thicker on a {110} crystal plane than on a {100} crystal plane. According to some example embodiments, the surface of the substrate 100 and the horizontal surface HS of the trench gate 409 have a {100} crystal plane, and the vertical sidewall surface VS of the gate trench 409 has a {110} crystal surface. Therefore, the second gate oxide layer 415A may be formed thicker on the vertical sidewall surface VS of the gate trench 409 than on the horizontal surface HS of the gate trench 409. For example, according to the thermal oxidation process, the second gate oxide layer 415A may be formed about 1.5 to 3.5 times thicker on the vertical sidewall surface VS of the gate trench 409 than on the horizontal surface I-S of the gate trench 409 (TVa2>THa2). The second gate oxide layer 415A may have a complementary characteristic to the first gate oxide layer 410A. Thus, the gate insulating layer 420A including the first and second gate oxide layers 410A and 415A can have a uniform thickness within a variation of 10%.

Specifically, the gate insulating layer 420A may have a final sidewall thickness TVa and a final bottom thickness THa. The final sidewall thickness TVa may mean a total thickness of the gate insulating layer 420A formed on the vertical sidewall surface VS of the gate trench 409. The final bottom thickness THa may mean a total thickness of the gate insulating layer 420A formed on the horizontal surface HS of the gate trench 409. The two final thicknesses TVa and THa may be uniform within a variation of 10% by adjusting a process time. That is, the two final thicknesses TVa and THa may be controlled to be substantially identical or similar to each other. FIG. 6G can be understood that an appropriate one of experimental results is shown (TVa≈THa).

In some example embodiments, the first and second oxidation processes may be formed after the source/drain regions 310 are formed. In order to form the source/drain regions 310, when impurities ion such as phosphorous, arsenide or boron are implanted into the substrate 100, silicon bonds in the active region 300 may be broken. If the silicon bonds are broken, oxidation reaction may occur faster. Therefore, the first and second gate oxide layers 410A and 415A may be formed relatively thicker at a portion of the sidewall of the gate trench 409 than at other portions—regions into which the impurity ions are not implanted. When the gate insulating layer 420 overlapping the source/drain regions 310 is thick, gate induced drain leakage (GIDL) may be reduced, and thus it is possible to improve stability, data maintenance ability and refresh characteristics of a device or transistor.

Figure 6H:
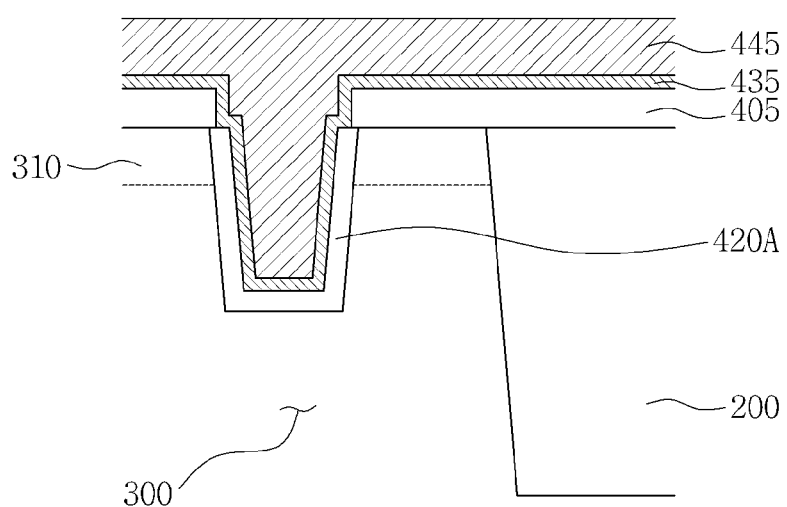

Referring to FIGS. 5A and 6H, the method may include forming a gate barrier material layer 435 and a gate electrode material layer 445 on the gate insulating layer 420A and the mask pattern 405 for trench formation (S145). The gate barrier material layer 435 may be conformally formed using an atomic layer deposition (ALD) method or chemical vapor deposition (CVD) method using heat or plasma. The gate barrier material layer 435 may include a metal compound. For example, the gate barrier material layer 435 may include a single- or multi-layered metal or metal nitride material such as titanium (Ti), titanium nitride (TiN), tantalum (Ta), tantalum nitride (TaN), ruthenium (Ru), ruthenium nitride (RuN), tungsten (W), tungsten titanium (TiW) or tungsten nitride (WN). In this embodiment, it is assumed and described that the gate barrier material layer 435 includes titanium nitride (TiN). The gate electrode material layer 445 may be formed using the ALD method or CVD method using heat or plasma. The gate electrode material layer may include a metal such as tungsten.

Figure 6I:
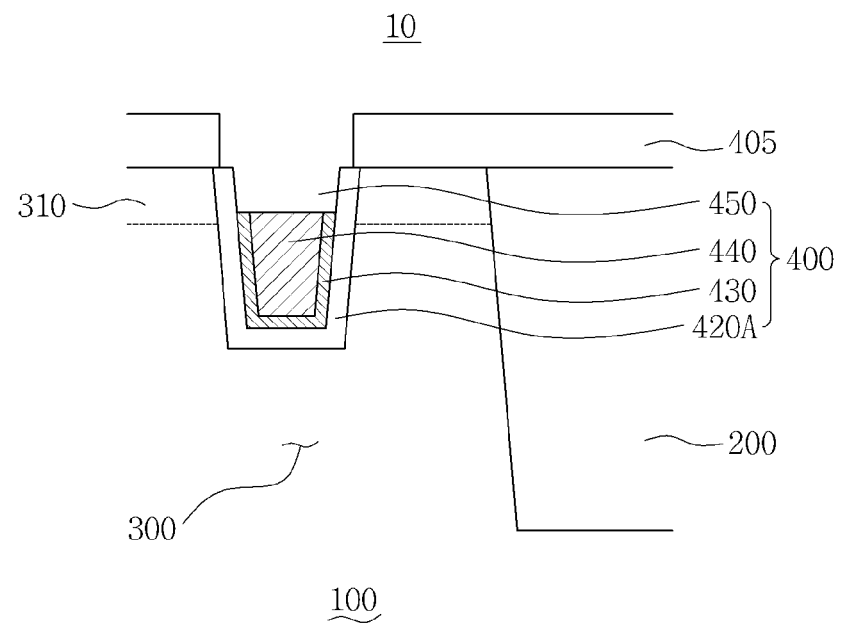

Referring to FIGS. 5A and 6I, the method may include forming a gate electrode layer 440 and a gate barrier layer 430 (S150). The forming of the gate electrode layer 440 and the gate barrier layer 430 may include removing upper portions of the gate electrode material layer 445 and the gate barrier material layer 435 using an etch-back method. In this process, the upper portions or upper surfaces of the gate electrode layer 440 and the gate barrier layer 430 may be recessed from the surface of the substrate 100.

Figure 6J:
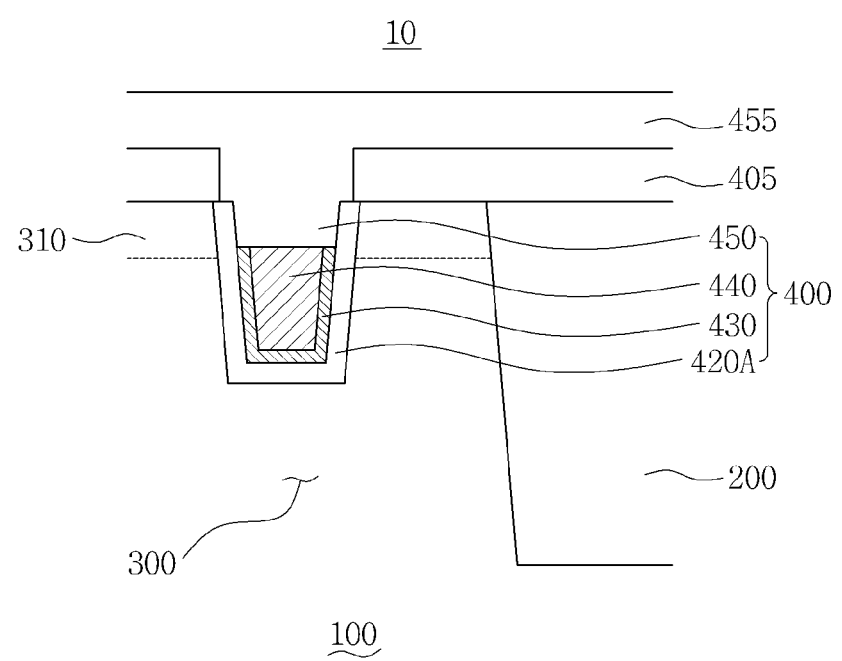

Referring to FIGS. 5A and 6J, the method may include entirely forming a gate capping material layer 455 (S155). The gate capping material layer 455 may be formed using the CVD method using heat or plasma. The gate capping material layer 455 can protect the gate barrier layer 430 and the gate electrode layer 440 from an etching process, etc. in a subsequent process. The gate capping material layer 455 may include an insulation material, e.g., a silicon nitride material or silicon oxynitride material, having an etch selectivity with respect to the silicon oxide material.

Figure 6K:
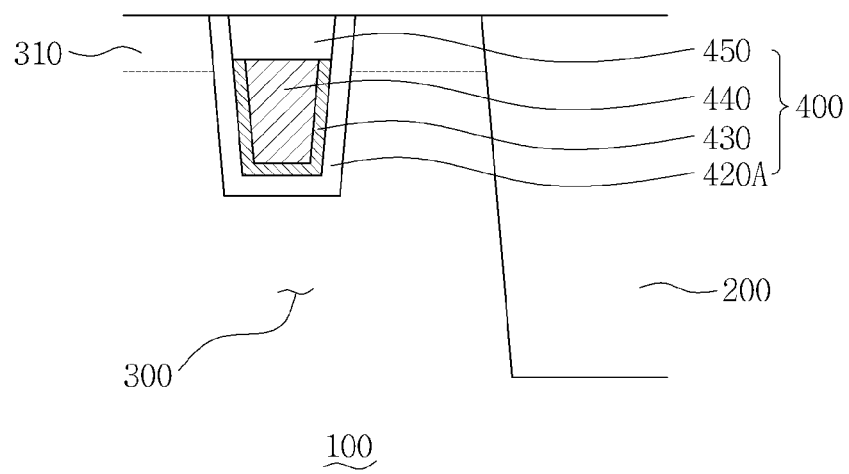

Referring to FIGS. 5A and 6K, the method may include forming a gate capping layer 450 (S160). In this process, a gate structure 400 may be formed. The forming of the gate capping layer 450 may include removing a portion of the gate capping material layer 455 using the etch-back method. The gate capping layer 450 may be filled in the gate trench 409. Subsequently, the mask pattern 405 for trench formation may be removed. In another embodiment, a portion of the mask pattern 405 for trench formation may still exist on the surface of the substrate 100.

Subsequently, the method may include forming an interlayer insulating layer 710 (S170). The interlayer insulating layer 710 may be formed using the CVD method using heat or plasma. The interlayer insulating layer 710 may include a silicon nitride material, a silicon oxide material and a silicon oxynitride material. Through this process, the semiconductor device 10 shown in FIG. 2A can be formed.

The method in accordance with some example embodiments may include performing an oxidation process at a relatively low temperature, and then performing an oxidation process at a relatively high temperature. This process can obtain the effect of densifying an oxide material formed at a relatively low temperature. The densified oxide material, e.g., the gate insulating layer 420, can have improved etch resistance. For example, the etch rate is lowered in subsequent etching processes, and thus the oxide layer can be less damaged. According to some example embodiments, the initially formed thickness of the gate insulating layer 420 is relatively well maintained, and thus the method can be effectively applied to techniques for forming a fine pattern.

FIGS. 7A to 7D are longitudinal sectional views taken along line I-I' of FIG. 1, conceptually illustrating another method of fabricating the semiconductor device 10 of FIG. 2A.

Figure 5B:
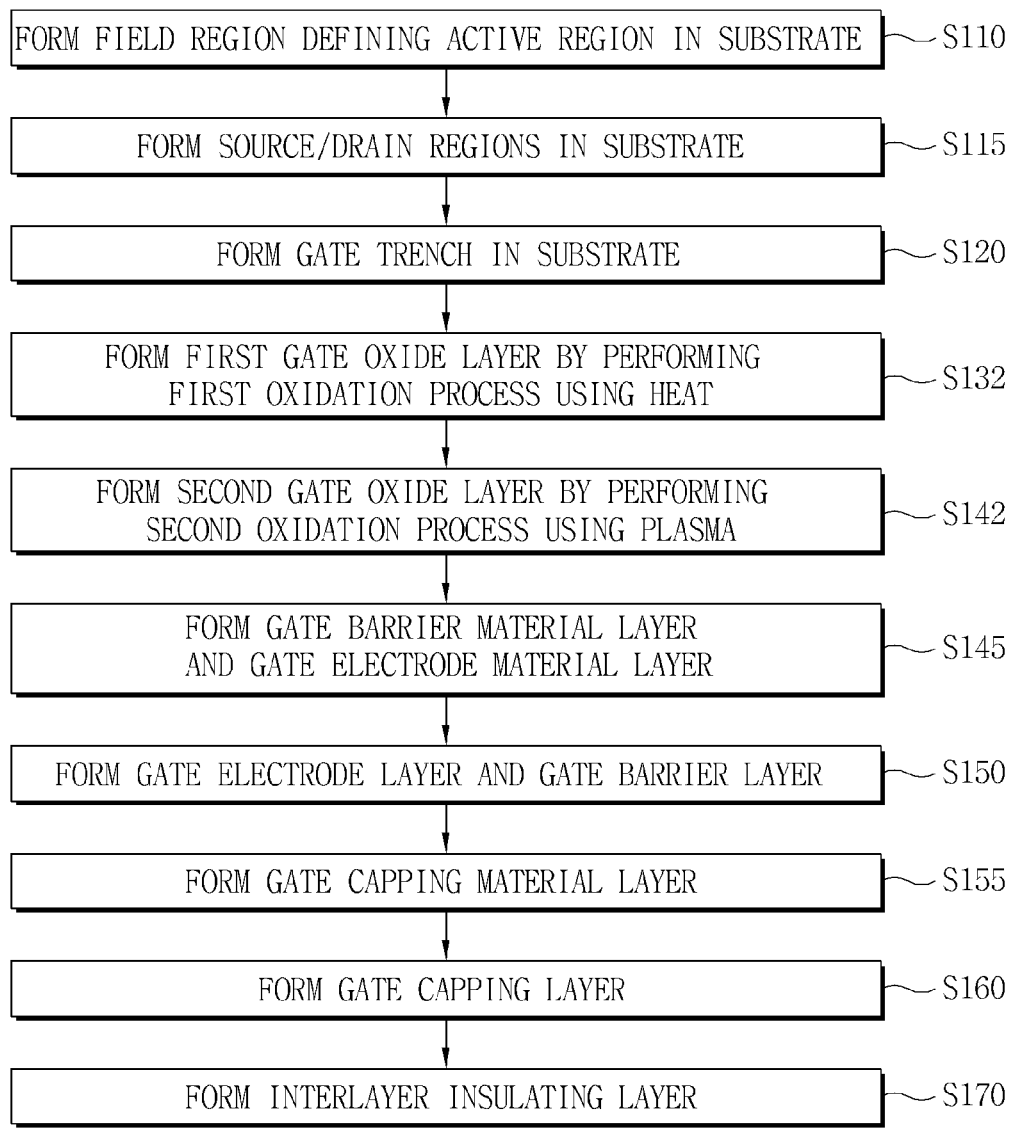
Figure 7A:
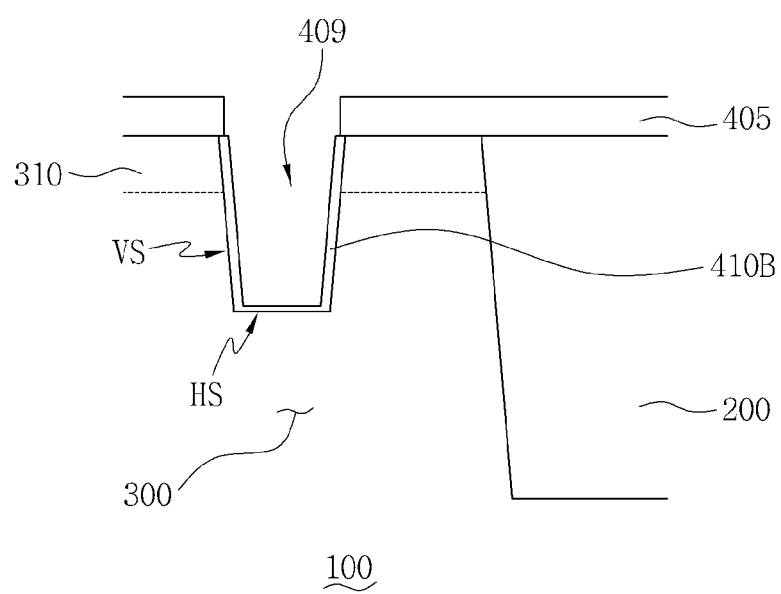
FIGS. 7A to 7D are longitudinal sectional views taken along line I-I' of FIG. 1, conceptually illustrating another method of fabricating the semiconductor device of FIG. 2A.

Referring to FIGS. 5B and 7A, a method of fabricating the semiconductor device in accordance with some example embodiments may include forming a gate trench 409 with reference to FIGS. 6A to 6C, and then forming a first gate oxide layer 410B in the gate trench 409 by performing a first oxidation process (S132). The first oxidation process may include oxidizing the surface of the substrate 100.

The first oxidation process may include the thermal oxidation process described with reference to FIG. 6F. According to some example embodiments, the surface of the substrate 100 and the horizontal surface HS of the gate trench 409 may have a {100}crystal plane, and the vertical sidewall surface VS of the gate trench 409 may have a {110}crystal plane. Therefore, according to the first oxidation process, the first gate oxide layer 410B may be formed thicker on the vertical sidewall surface VS of the gate trench 409 than on the surface of the substrate 100 and the horizontal surface HS of the gate trench 409. The first gate oxide layer 410B may be formed on only the surface of the substrate 100 exposed in the gate trench 409.

Figure 7B:
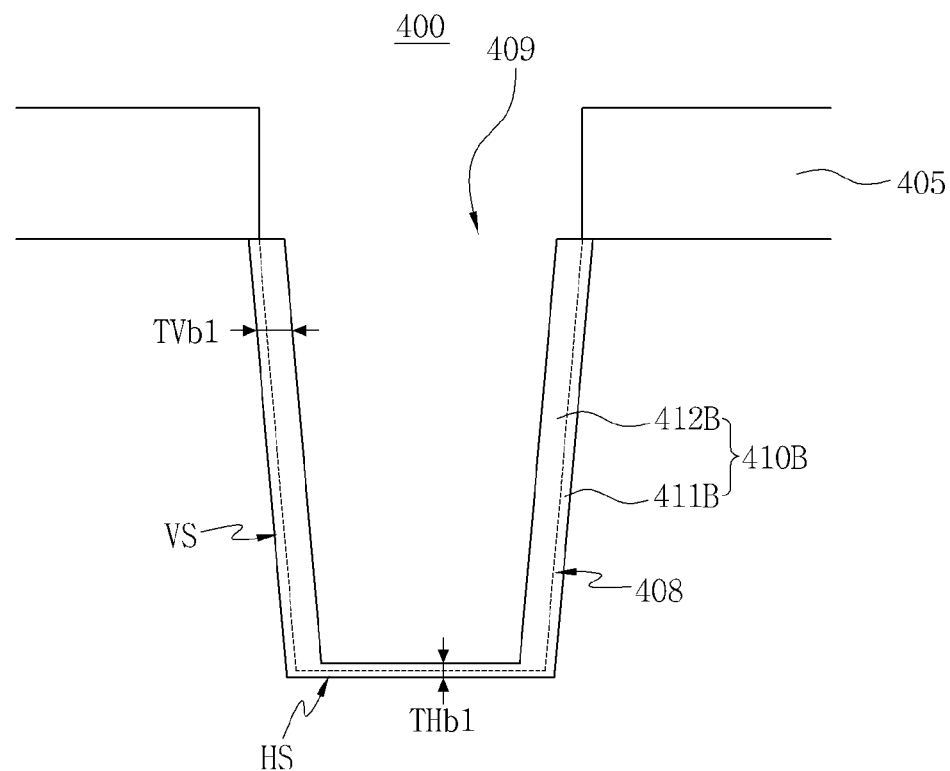

FIG. 7B is an enlarged view of a portion of FIG. 7A so that the first gate oxide layer 410B is viewed in detail.

Referring to FIG. 7B, the first gate oxide layer 410B may include a first internal gate oxide layer 411B formed in the direction of the inside of the substrate 100, and a first external gate oxide layer 412B formed in the direction of the outside of the substrate 100. The surface of the trench is indicated by a dotted line as a meaning that the surface of the trench virtually exists. The first external gate oxide layer 412B may be about 1.25 to 2 times thicker than the first internal gate oxide layer 411B.

The first gate oxide layer 410B may have a first sidewall thickness TVb1 and a first bottom thickness THb1. The first sidewall thickness TVb1 may mean a total thickness of the first gate oxide layer 410B formed on the vertical sidewall surface VS of the gate trench 409. The first bottom thickness THb1 may mean a total thickness of the first gate oxide layer 410B formed on the horizontal surface HS of the gate trench 409.

The first sidewall thickness TVb1 may be thicker than the first bottom thickness THb1 (TVb1>THb1). For example, the first sidewall thickness TVb1 may be about 1.5 to 3.5 times thicker than the first bottom thickness THb1. The two thicknesses TVb and THb1 may be construed as the total average thickness or the thickness at a specific position. The term "thickness at a specific position" may be construed as the thickness at a specific position in a region having a visually average thickness.

Figure 7C:
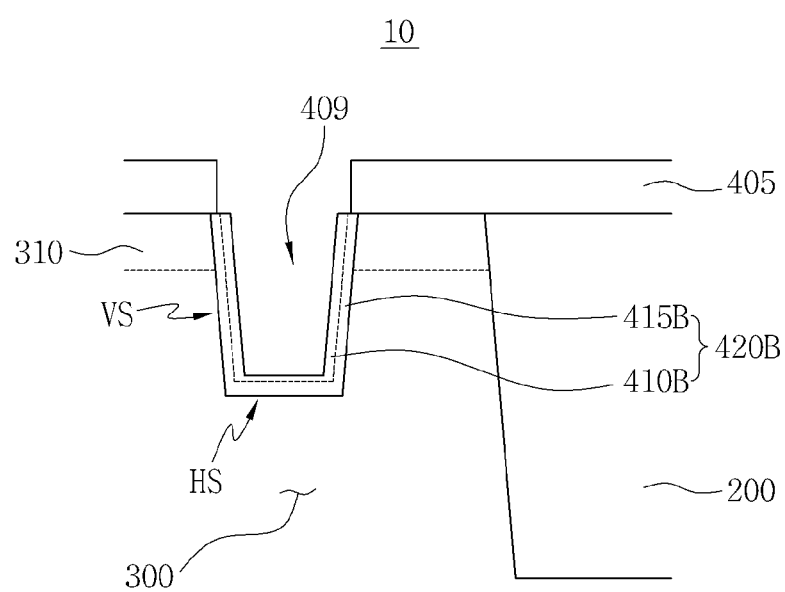

Referring to FIGS. 5B and 7C, the method may include forming a gate insulating layer 420B by performing a second oxidation process using a plasma oxidation method (S142). The gate insulating layer 420B may include a first gate oxide layer 410B and a second gate oxide layer 415B. The second oxidation process may include oxidizing the substrate 100 using the plasma oxidation method. In addition, the second oxidation process may exclude depositing an oxide material on the substrate 100.

The second oxidation process may include oxidizing the substrate 100 using the plasma described with reference to FIG. 6D. Thus, according to some example embodiments, any one of the first to third plasma oxidation processes is used to form a second oxide layer, so that the second gate oxide layer 415B can be formed thicker at a portion formed on the horizontal surface HS of the gate trench 409 than at a portion formed on the vertical sidewall surface VS of the gate trench 409.

Figure 7D:
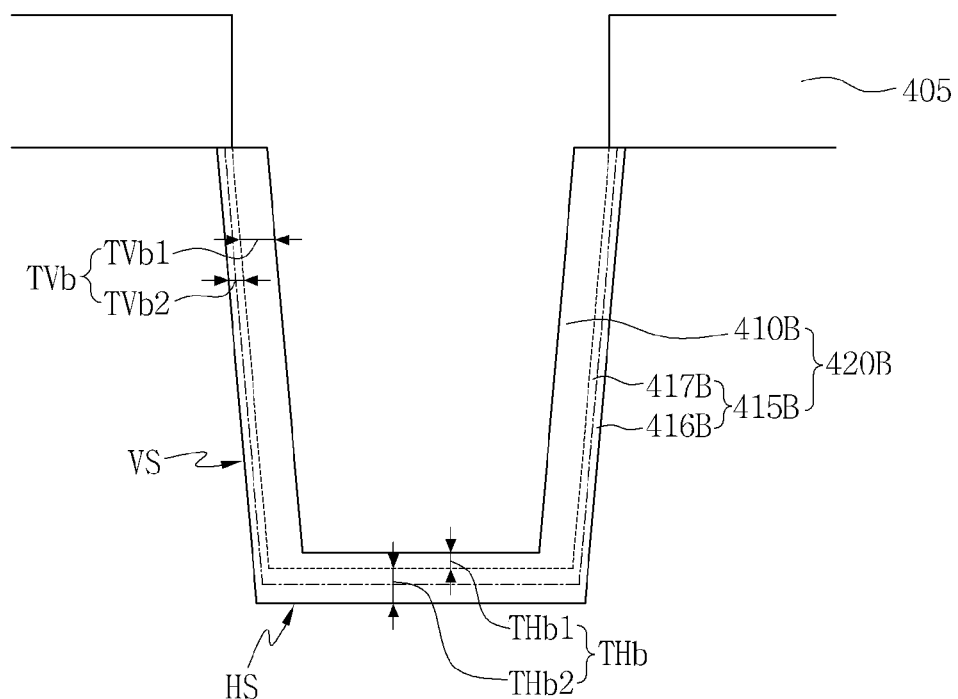

FIG. 7D is an enlarged view of a portion of FIG. 7C so that the gate insulating layer 420B is viewed in detail.

Referring to FIG. 7D, the second gate oxide layer 415B may include a second internal gate oxide layer 416B formed in the direction of the inside of the substrate 100, and a second external gate oxide layer 417B formed in the direction of the outside of the substrate 100. The second external gate oxide layer 417B may be about 1.25 to 2 times thicker than the second internal gate oxide layer 416B.

The second oxidation process may include forming a second gate oxide layer 415B between the surface of the active region 300 and the first gate oxide layer 410B. The second gate oxide layer 415B may be formed about 1.5 to 3.5 time thicker on the horizontal surface HS of the gate trench 409 than on the vertical sidewall surface VS of the gate trench 409 (THb2>TVb2). The second gate oxide layer 415B may have a complementary characteristic with the first gate oxide layer 410B. Thus, the gate insulating layer 420B including the first and second gate oxide layers 410B and 415B can have a uniform thickness within a variation of 10% (TVb≈THb).

The method in accordance with some example embodiments may include performing an oxidation process performed at a relatively high temperature, and then performing an oxidation process performed at a relatively low temperature. This process can obtain the effect of annealing an oxide layer formed at a relatively high temperature. For example, in the oxide layer formed at a relatively high temperature, silicon atoms may exist in the state in which the silicon atoms are compressed at corners at which the bottom and side surfaces meet each other. When the oxidation process is further performed at a relatively low temperature, some Si—O bonds of a silicon oxide material may be re-bonded. Thus, it is possible to reduce the stress of Si—Si and/or Si—O bonds.

Then, the processes described with reference to FIGS. 6H to 6K are further performed, thereby fabricating the semiconductor device 10 shown in FIG. 2A.

FIGS. 8A to 8K are longitudinal sectional views taken along line II-II' of FIG. 1, conceptually illustrating a method of fabricating the semiconductor device 20 of FIG. 3A.

Figure 5C:
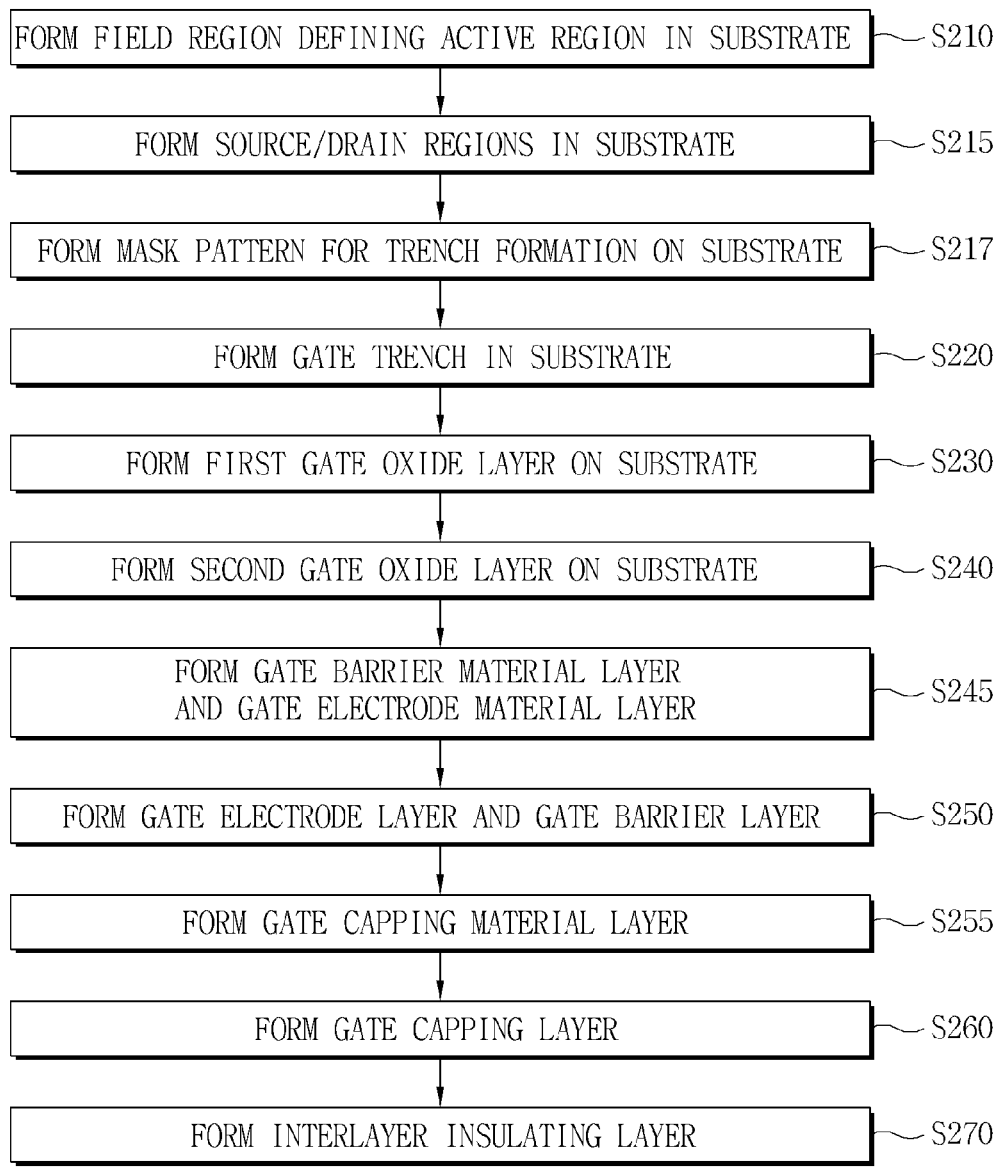
Figure 8A:
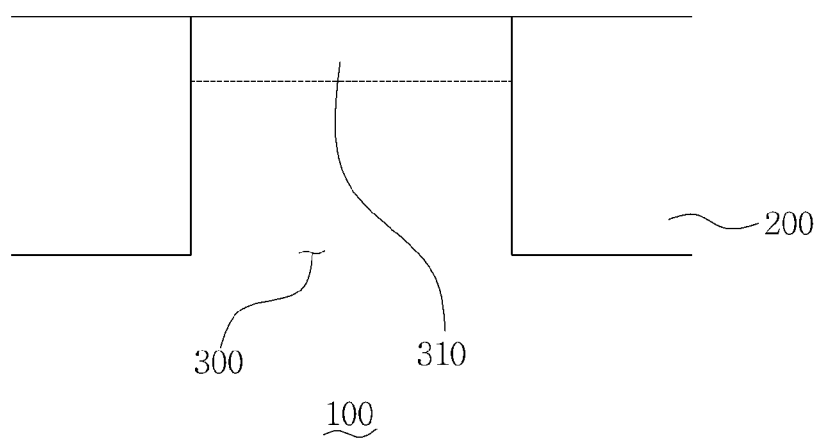
FIGS. 8A to 8K are longitudinal sectional views taken along line II-II' of FIG. 1, conceptually illustrating a method of fabricating the semiconductor device of FIG. 3A.

Referring to FIGS. 5C and 8A, a method of fabricating the semiconductor device in accordance with some example embodiments may include forming a field region 200 that defines an active region in a substrate 100 (S210). The method may further include forming source/drain regions 310 in the active region 300 (S215).

Figure 8B:
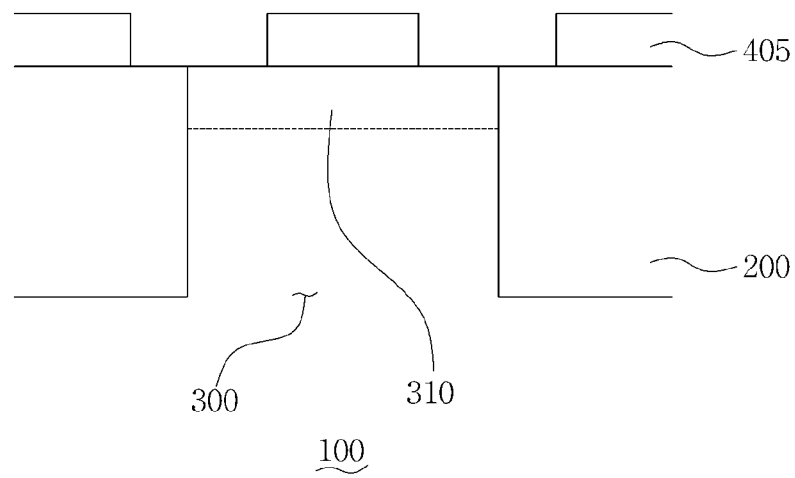

Referring to FIGS. 5C and 8B, the method may include forming a mask pattern 405 for trench formation (S217). The mask pattern 405 for trench formation may include a silicon oxide material, a silicon nitride material, a silicon oxynitride material and an insulation material containing carbon, such as spin-on-hardmask.

Figure 8C:
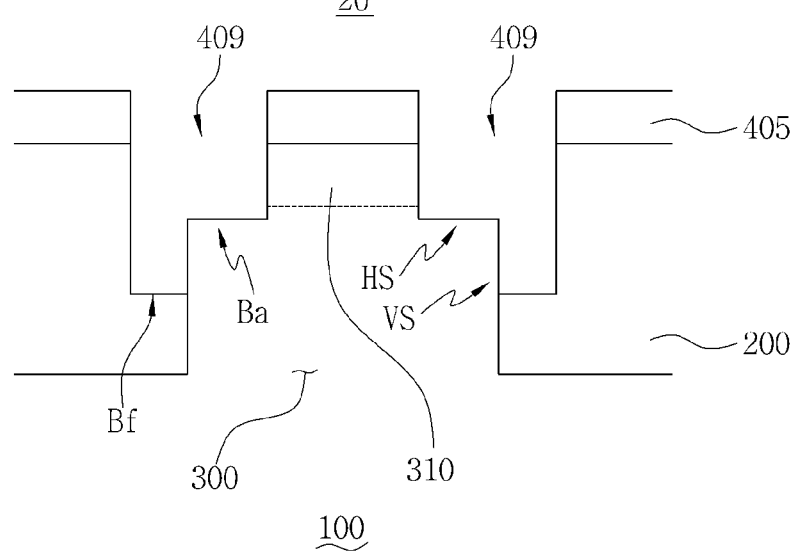

Referring to FIGS. 5C and 8C, the method may include forming a gate trench 409 in the substrate 100 (S220). The forming of the gate trench 409 may include etching the substrate 100 using the mask pattern 405 for trench formation as an etch mask. The gate trench 409 may be formed in the field region 200 and the active region 300. That is, the gate trench 409 may expose a portion of the field region 200 and a portion of the active region 300. The bottom surface of the gate trench 409 may have an active bottom surface Ba and a field bottom surface Bf, which have a step difference. The active bottom surface Ba may be disposed at a relatively high level, and the field bottom surface Bf may be disposed at a relatively low level. The bottom surface of the gate trench 409 including the active bottom surface Ba and the field bottom surface Bf may be substantially parallel to the upper surface of the substrate 100. That is, the active bottom surface Ba and the field bottom surface Bf are shown in the horizontal direction in FIG. 8C.

In some example embodiments, the vertical sidewall surface VS of the gate trench 409 may have a {110}crystal plane. The bottom surface of the gate trench 409, i.e., the active bottom surface Ba may have a {100}crystal plane. The active bottom surface Ba and the vertical sidewall surface VS are ideally perpendicular to each other, but actually smoothly connected to each other.

Figure 8D:
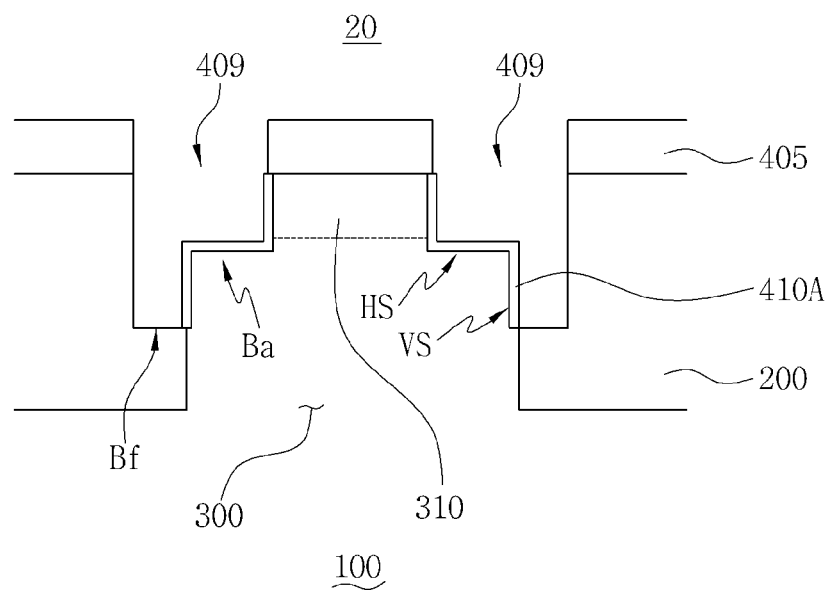
Figure 8E:
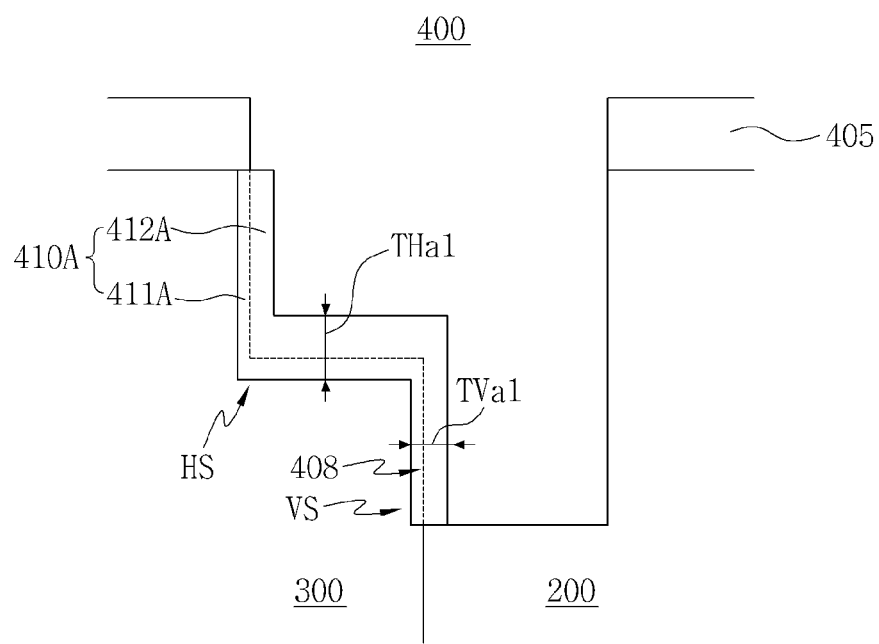

Referring to FIGS. 5C, 8D and 8E, the method may include forming a first gate oxide layer 410A on the surface of the active region 300 exposed in the gate trench 409 (S230). The first gate oxide layer 410A may include a first internal gate oxide layer 411A and a first external gate oxide layer 412A. As described above, the first external gate oxide layer 412A may be about 1.25 to 2 times thicker from the virtual trench surface 408 than the first internal gate oxide layer 411A.

The forming of the first gate oxide layer 410A may include performing a first oxidation process. The first oxidation process may include oxidizing the substrate 100 using plasma. The first oxidation process using the plasma can be understood in detail with reference to FIG. 6D. That is, the first oxidation process may include one of the first to third plasma processes described above. In the first gate oxide layer 410A, a portion formed on the bottom surface of the gate trench 409, i.e. the active bottom surface Ba may be thicker than that formed on the vertical sidewall surface VS of the gate trench 409 (THa1>TVa1).

Figure 8F:
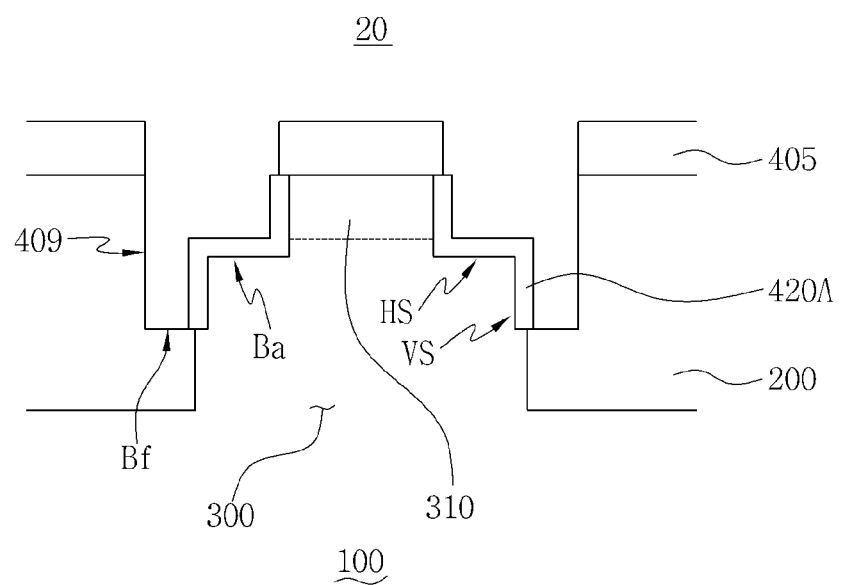
Figure 8G:
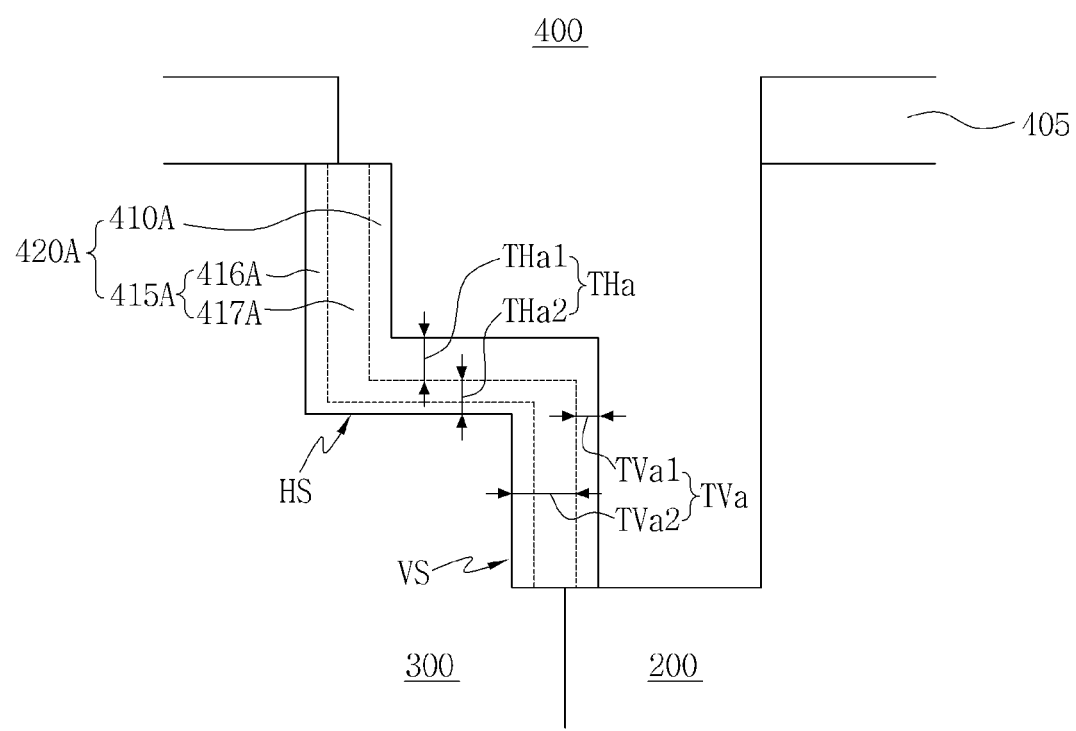

Referring to FIGS. 5C, 8F and 8G, the method may include forming a gate insulating layer 420A. That is, the method may include forming a second gate oxide layer 415A between the surface of the active region 300 and the first gate oxide layer 410A (S240). The gate insulating layer 420A may include a first gate oxide layer 410A of FIG. 8E, and a second gate oxide layer 415A of FIG. 8G. The forming of the second gate oxide layer 415A may include performing a second oxidation process.

The second oxidation process may include oxidizing the substrate 100 using heat. The second oxidation process using the heat can be understood in detail with reference to FIG. 6F. In the second gate oxide layer 415A, a portion formed on the vertical sidewall surface VS of the gate trench 409 may be thicker than that formed on the bottom surface of the gate trench 409, i.e., the active bottom surface Ba (TVa2>THa2).

The second gate oxide layer 415A may include a second internal gate oxide layer 416A, and a second external gate oxide layer 417A. As described above, the second external gate oxide layer 417A may be about 1.25 to 2 times thicker than the second internal gate oxide layer 416A.

According to some example embodiments, the gate insulating layer 420A may have a uniform thickness entirely within a variation of 10% (TVa≈THa).

Figure 8H:
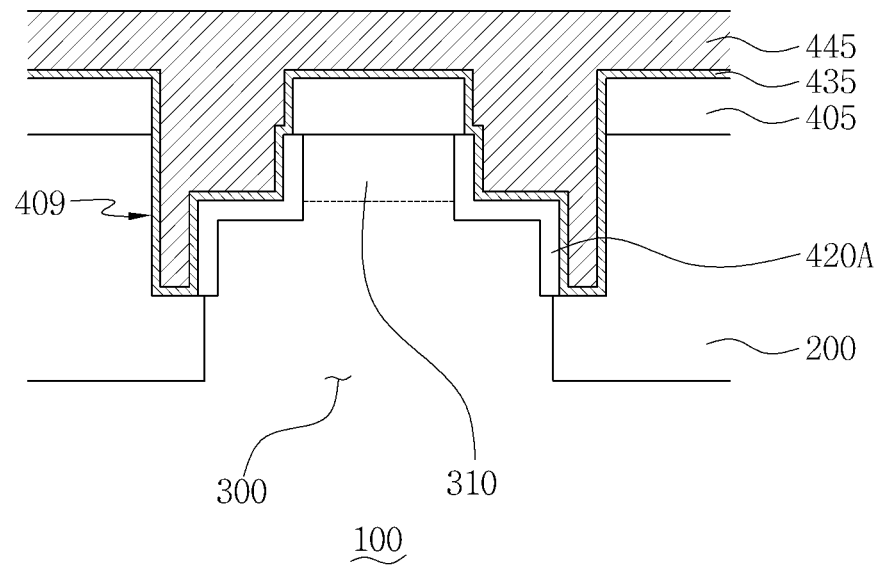

Referring to FIGS. 5C and 8H, the method may include forming a gate barrier material layer 435 and a gate electrode material layer 445 (S245). The gate barrier material layer 435 may be entirely conformally formed. Specifically, the gate barrier material layer 435 may be formed on the top and side of the mask pattern 405 for trench formation, the surface of the field region 200 exposed in the gate trench 409, and the surface of the gate insulating layer 420. The gate electrode material layer 445 may be formed on the gate barrier material layer 435.

Figure 8I:
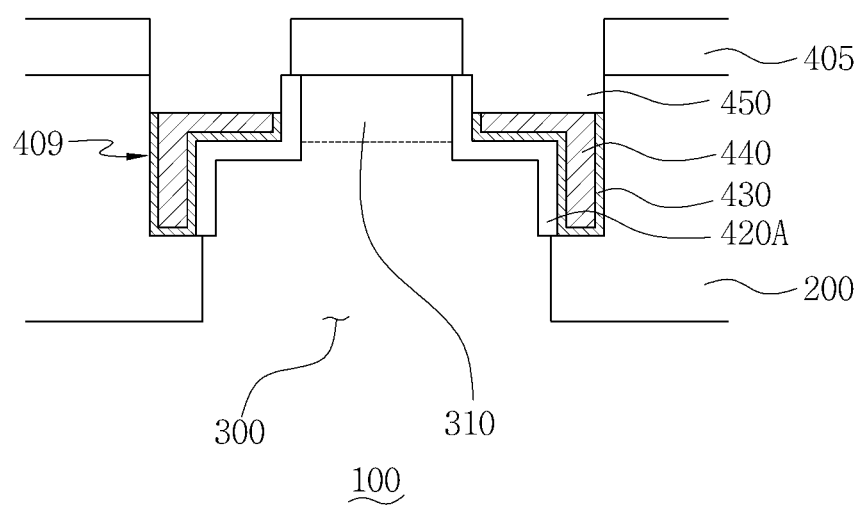

Referring to FIGS. 5C and 8I, the method may include forming a gate barrier layer 430 and a gate electrode layer 440 using an etch-back process (S250). The upper surfaces of the gate barrier layer 430 and the gate electrode layer 440 may be disposed lower than the upper surface of the substrate 100. That is, the upper surfaces of the gate barrier layer 430 and the gate electrode layer 440 may be recessed to be disposed in the gate trench 409.

Figure 8J:
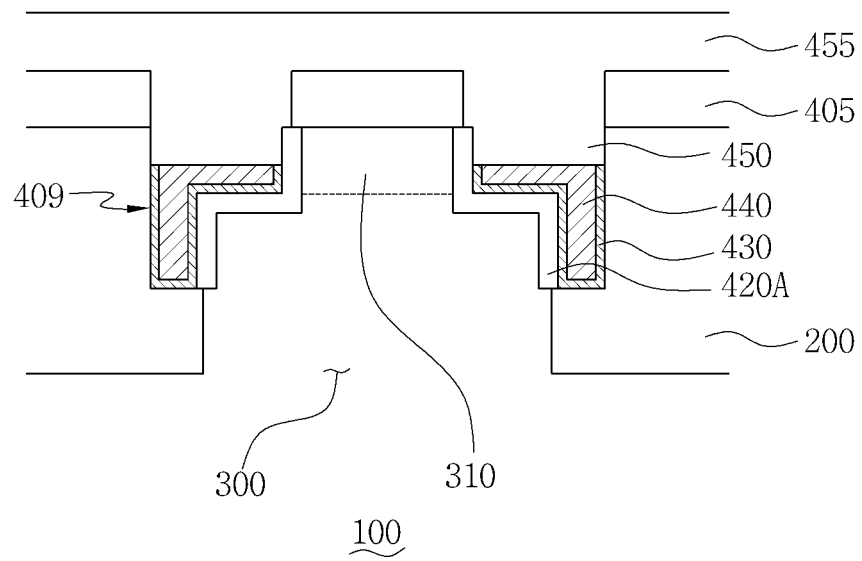

Referring to FIGS. 5C and 8J, the method may include entirely forming a gate capping material layer 455 (S255).

Figure 8K:
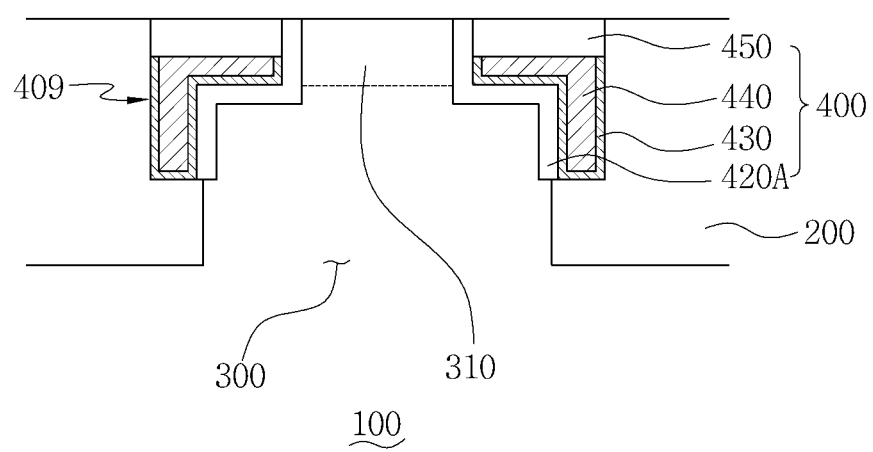

Referring to FIGS. 5C and 8K, the method may include forming a gate capping layer 450 using an etch-back process (S260). In this process, the upper surface of the gate capping layer 450 and the upper surface of the mask pattern 405 for trench formation may be identical or similar to each other. The gate capping layer 450 and the lower mask pattern 405 include different materials from each other, and therefore, the upper surfaces may not be formed at the exact same level.

Then, the method may include forming an interlayer insulating layer 710 on the gate capping layer 450 (S270), thereby fabricating the semiconductor device 20 shown in FIG. 3A.

FIGS. 9A to 9D are longitudinal sectional views taken along line II-II' of FIG. 1, conceptually illustrating another method of fabricating the semiconductor device 20 of FIG. 3A.

Figure 9A:
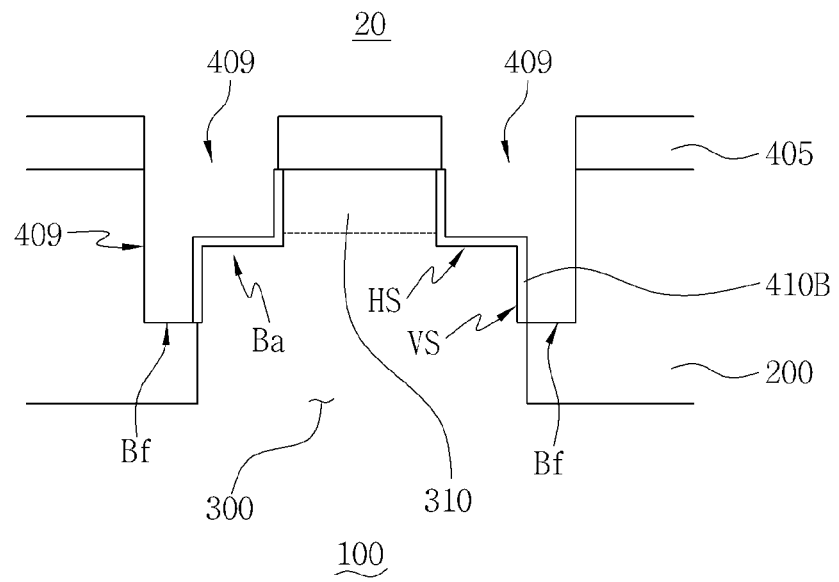
FIGS. 9A to 9D are longitudinal sectional views taken along line II-II' of FIG. 1, conceptually illustrating another method of fabricating the semiconductor device of FIG. 3A.
Figure 9B:
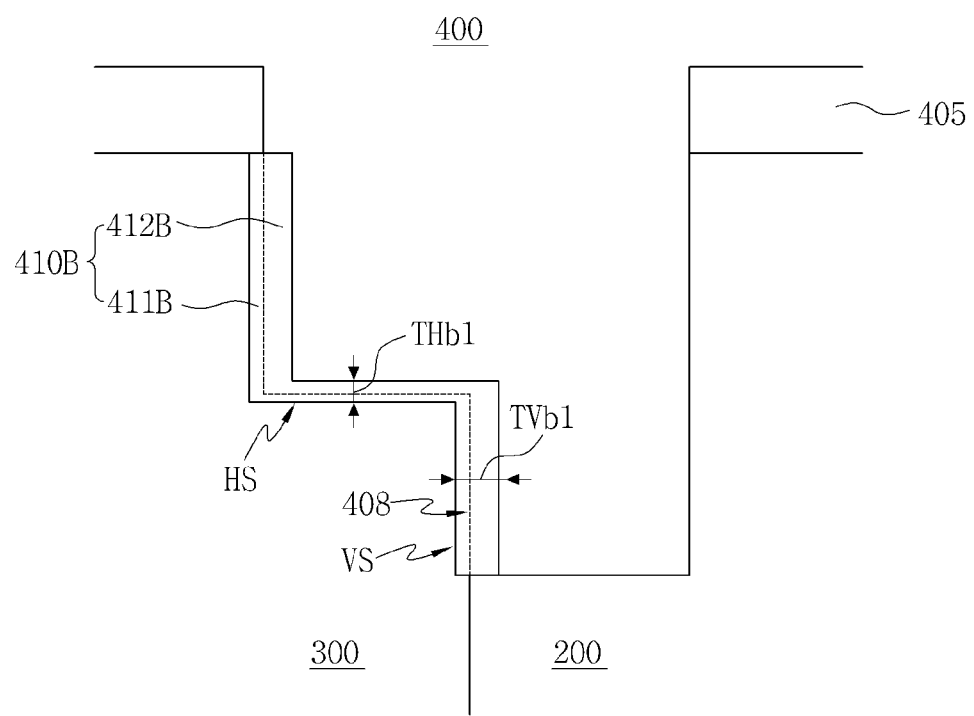

Referring to FIGS. 9A and 9B, a method of fabricating the semiconductor device in accordance with some example embodiments may include forming a gate trench 409 with reference to FIGS. 8A to 8C, and then forming a first gate oxide layer 410B in the gate trench 409 by performing a first oxidation process.

The first oxidation process may include oxidizing the surface of the substrate 100. The first oxidation process may include a thermal oxidation process. The thermal oxidation process can be understood in detail with reference to FIG. 7A. Therefore, in the first gate oxide layer 410B, a portion formed on the vertical sidewall surface VS of the gate trench 409 may be thicker than that formed on the bottom surface of the gate trench 409, i.e., the active bottom surface Ba (TVb1>THb1).

Figure 9C:
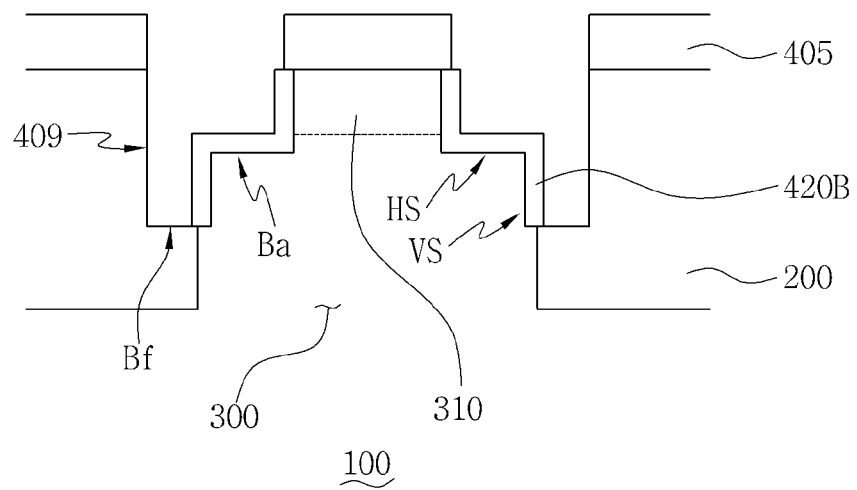
Figure 9D:
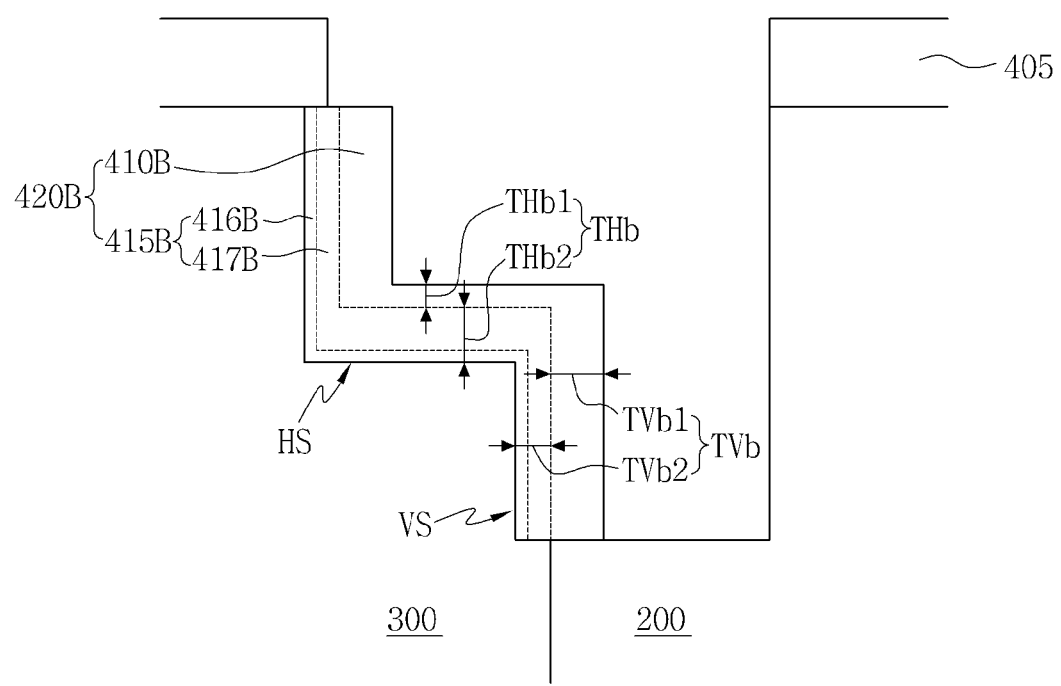

Referring to FIGS. 9C and 9D, the method may include forming a second gate oxide layer 415B between the surface of the active region 300 and the first gate oxide layer 410B. The first and second gate oxide layers 410B and 415B may form a gate insulating layer 420B. The forming of the second gate oxide layer 415B may include performing a second oxidation process.

The second oxidation process may include oxidizing the substrate 100 using plasma. The second oxidation process using the plasma can be understood in detail with reference to FIG. 7C. The second oxidation process may include one of the first to third plasma processes described above. In the second gate oxide layer 415B, a portion formed on the bottom surface of the gate trench 409, i.e., the active bottom surface Ba may be thicker than that formed on the vertical sidewall surface VS of the gate trench 409 (THb2>TVb2).

The second gate oxide layer 415B may include a second internal gate oxide layer 416B, and a second external gate oxide layer 417B. As described above, the second external gate oxide layer 417B may be about 1.25 to 2 times thicker than the second internal gate oxide layer 416B.

According to some example embodiments, the gate insulating layer 420B can have a uniform thickness entirely within a variation of 10%.

Then, the semiconductor device 20 shown in FIGS. 3A and 3C can be fabricated with reference to FIGS. 8H to 8K.

FIGS. 10A to 10J are longitudinal sectional views taken along line III-III' of FIG. 1, conceptually illustrating a method of fabricating the semiconductor device 30 of FIG. 4A.

Figure 5D:
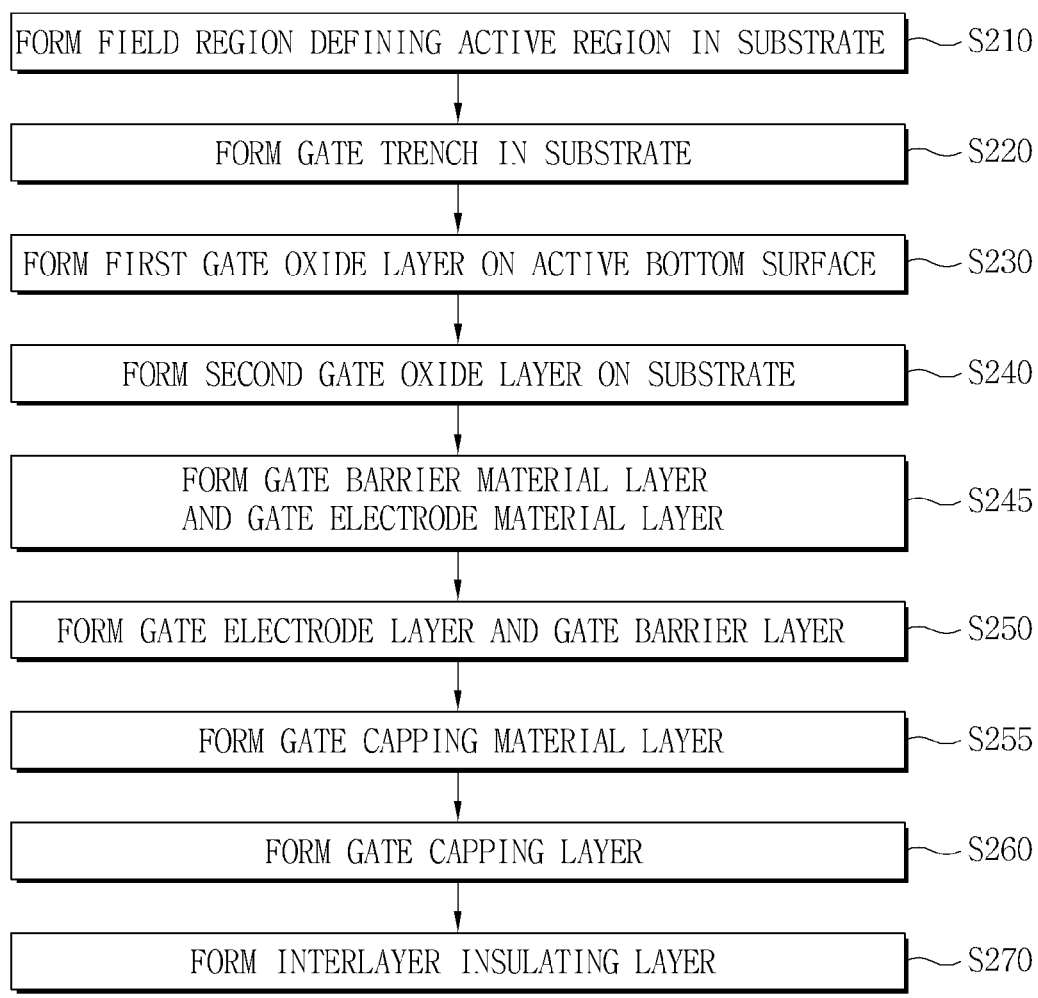
Figure 10A:
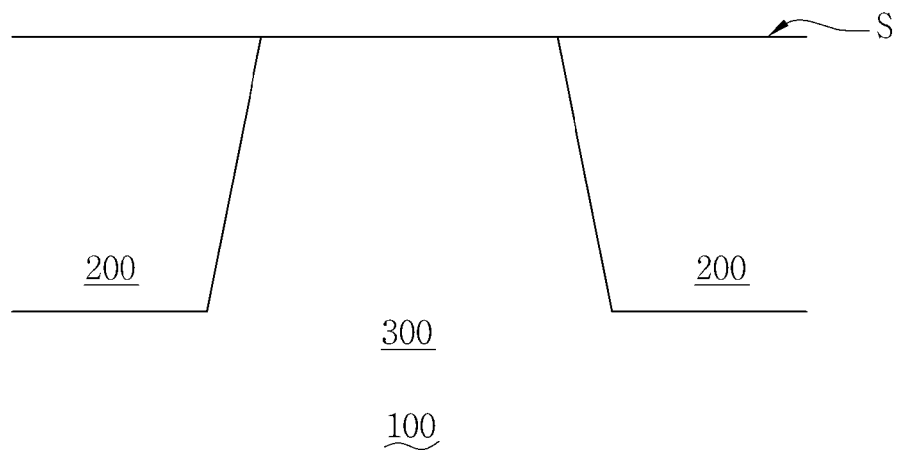
FIGS. 10A to 10J are longitudinal sectional views taken along line II-II' of FIG. 1, conceptually illustrating a method of fabricating the semiconductor device of FIG. 4A.

Referring to FIGS. 5D and 10A, a method of fabricating the semiconductor device in accordance with some example embodiments may include forming a field region 200 that defines an active region 300 in a substrate 100 (S210). For convenience of illustration, the source/drain regions will be omitted in the description of this embodiment.

Figure 10B:
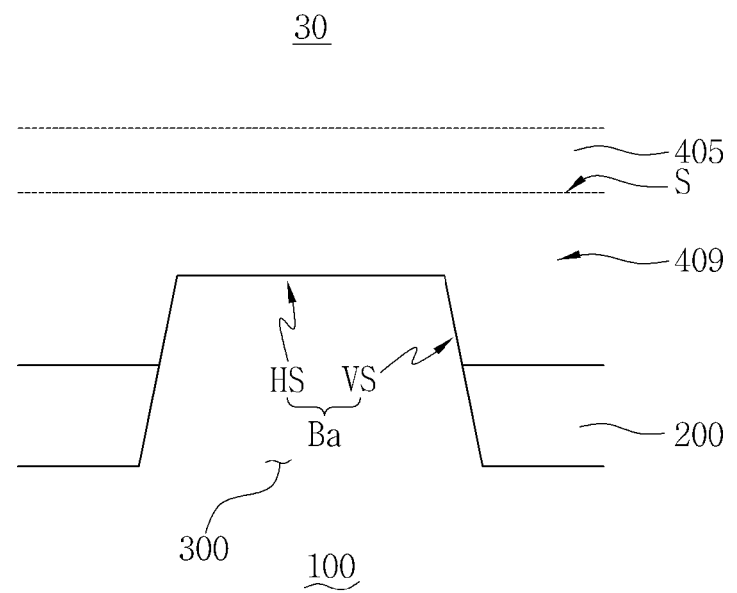

Referring to FIGS. 5D and 10B, the method may include forming a gate trench 409 (S220). The forming of the gate trench 409 may include forming the gate trench 409 by forming a mask pattern 405 for trench formation, and recessing the upper surface S of the substrate 100 using the mask pattern 405 for trench formation as an etch mask. The mask pattern 405 for trench formation and the upper surface S of the substrate 100 are not viewed in the longitudinal section and therefore indicated by a dotted line. The gate trench 409 may include an active bottom surface Ba disposed at a relatively high level, and a field bottom surface Bf disposed at a relatively low level. The active bottom surface Ba may include a horizontal surface HS and a vertical sidewall surface VS. The vertical sidewall surface VS of the active bottom surface Ba may be disposed between the horizontal surface HS and the field bottom surface Bf. The horizontal surface HS of the active bottom surface Ba and the field bottom surface Bf may be substantially parallel to the upper surface S of the substrate 100. That is, the active bottom surface Ba and the field bottom surface Bf are shown in the horizontal direction in FIG. 10B. The vertical sidewall surface VS of the active bottom surface Ba may be inclined close to a shape substantially perpendicular to the upper surface of the substrate 100.

Figure 10C:
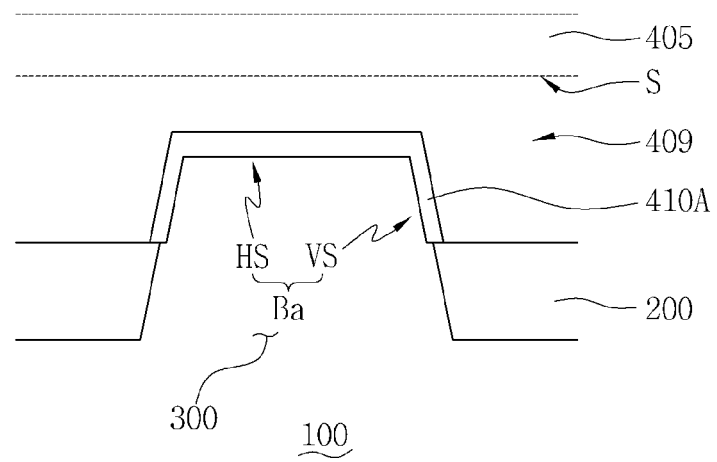
Figure 10D:
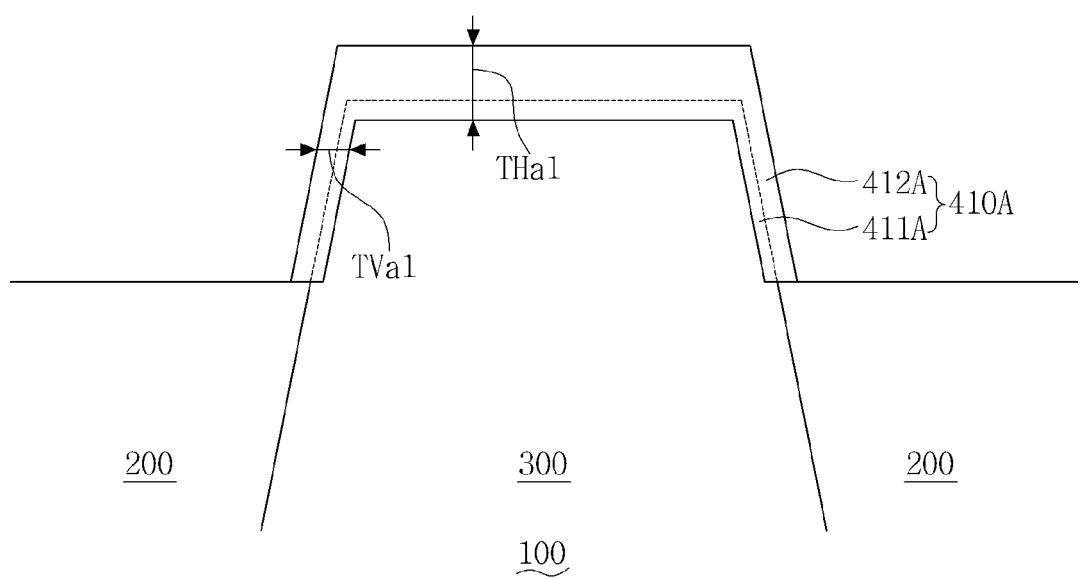

Referring to FIGS. 5D, 10C and 10D, the method may include forming a first gate oxide layer 410A on the active bottom surface Ba of the active region 300 exposed in the gate trench 409 (S230). The first gate oxide layer 410A may be formed to different thicknesses on the horizontal surface HS and vertical sidewall surface VS of the active bottom surface Ba. The forming of the first gate oxide layer 410A may include performing a first oxidation process. The first oxidation process may include oxidizing the active bottom surface Ba of the active region 300 using plasma. The first oxidation process using the plasma can be understood in detail with reference to FIG. 6D. The first oxidation process may include one of the first to third plasma processes described above. In the first gate oxide layer 410A, a portion formed on the horizontal surface HS of the active region 300 may be thicker than that formed on the vertical sidewall surface VS of the active region 300 (THa1>TVa1). The first gate oxide layer 410A may include a first internal gate oxide layer 411A, and a first external gate oxide layer 412A. As described above, the first external gate oxide layer 412A may be about 1.25 to 2 times thicker than the first internal gate oxide layer 411A.

Figure 10E:
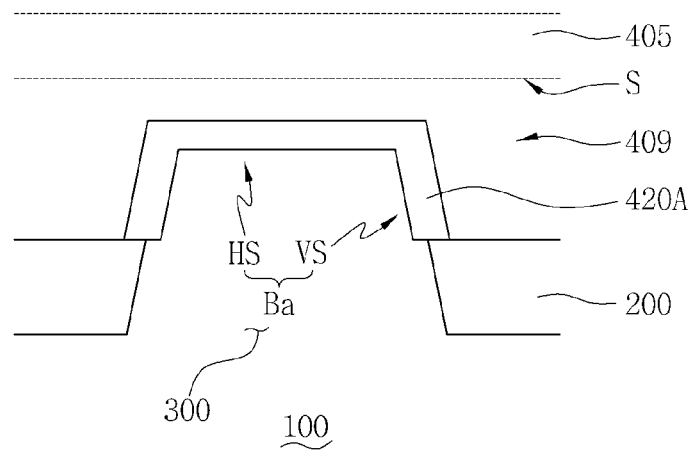
Figure 10F:
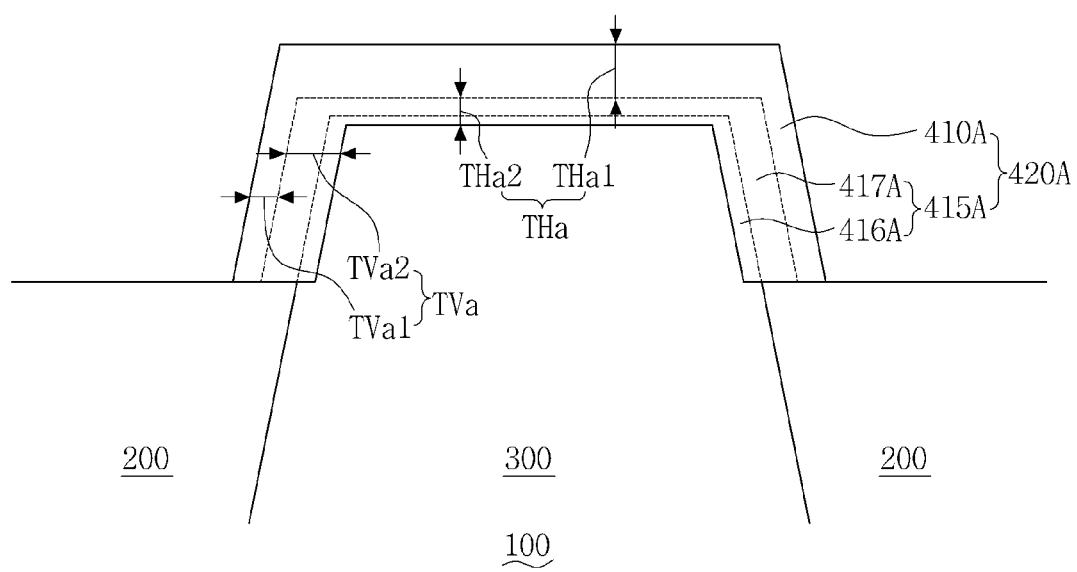

Referring to FIGS. 5D, 10E and 10F, the method may include forming a second gate oxide layer 415A between the surface of the active region 300 and the first gate oxide layer 410A (S240). The first and second gate oxide layers 410A and 415A may form a gate insulating layer 420A. The forming of the second gate oxide layer 415A may include performing a second oxidation process. The second oxidation process may include oxidizing the substrate 100 using heat. The second oxidation process using the heat can be understood in detail with reference to FIG. 6F. In the second gate oxide layer 415A, a portion formed on the vertical sidewall surface VS of the active region 300 may be thicker than that formed on the horizontal surface HS of the active region 300 (TVa2>THa2). The second gate oxide layer 415A may include a second internal gate oxide layer 416A, and a second external gate oxide layer 417A. As described above, the second external gate oxide layer 417A may be about 1.25 to 2 times thicker than the second internal gate oxide layer 416A. According to some example embodiments, the gate insulating layer 420A can have a uniform thickness entirely within a variation of 10% (THa≈TVa).

Figure 10G:
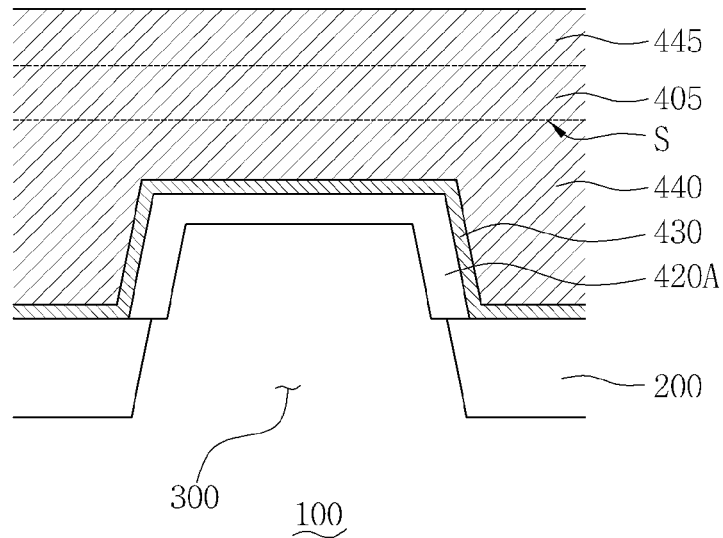

Referring to FIGS. 5D and 10G, the method may include forming a gate barrier material layer 435 and a gate electrode material layer 445 (S245). The gate barrier material layer 435 may be entirely conformally formed. Specifically, the gate barrier material layer 435 may be formed on the top and side of the mask pattern 405 for trench formation, the field bottom surface Bf of the field region 200 exposed in the gate trench 409, and the surface of the gate insulating layer 420A.

Figure 10H:
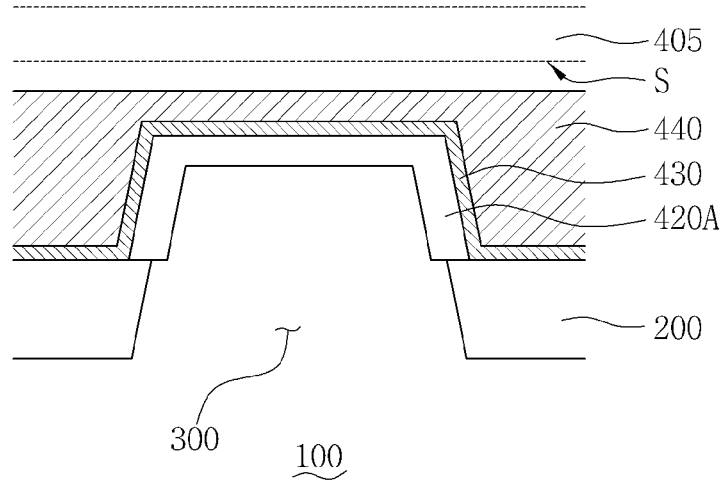

Referring to FIGS. 5D and 10H, the method may include forming a gate barrier layer 430 and a gate electrode layer 440 using an etch-back process (S250). The upper surfaces of the gate barrier layer 430 and the gate electrode layer 440 may be disposed lower than the upper surface of the substrate 100. That is, the upper surfaces of the gate barrier layer 430 and the gate electrode layer 440 may be recessed to be disposed in the gate trench 409.

Figure 10I:
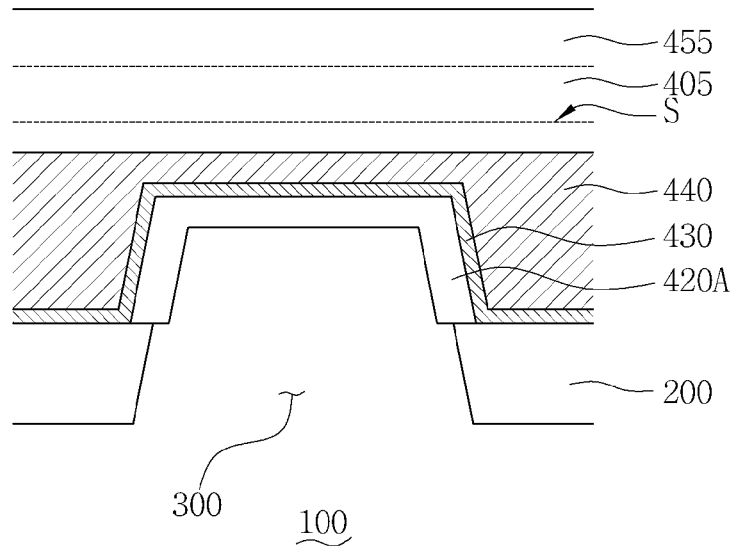

Referring to FIGS. 5D and 10I, the method may include entirely forming a gate capping material layer 455 (S255).

Figure 10J:
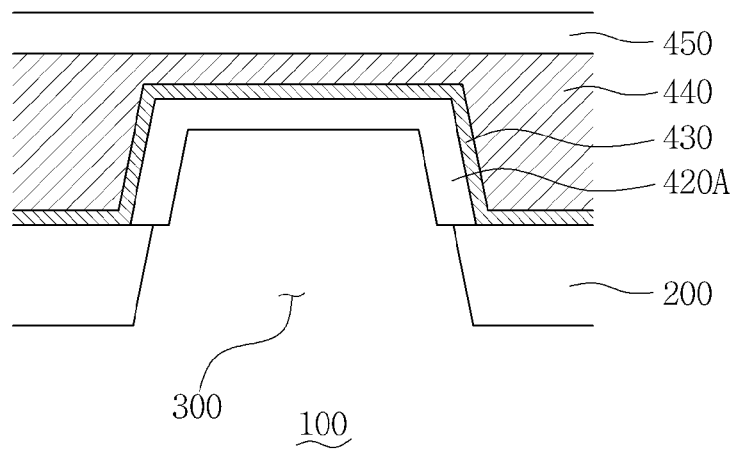

Referring to FIGS. 5D and 10J, the method may include forming a gate capping layer 450 using an etch-back process (S260). In this process, the upper surface of the gate capping layer 450 and the upper surface of the mask pattern 405 for trench formation may be identical or similar to each other. The gate capping layer 450 and the lower mask pattern 405 include different materials from each other, and therefore, the upper surfaces may not be formed at the exact same level. Then, the method may include forming an interlayer insulating layer 710 on the gate capping layer 450, thereby forming the semiconductor device 10B shown in FIG. 3A (S270).

FIGS. 11A to 11D are longitudinal sectional views taken along line II-III' of FIG. 1, conceptually illustrating another method of fabricating the semiconductor device 30 of FIG. 4A.

Figure 11A:
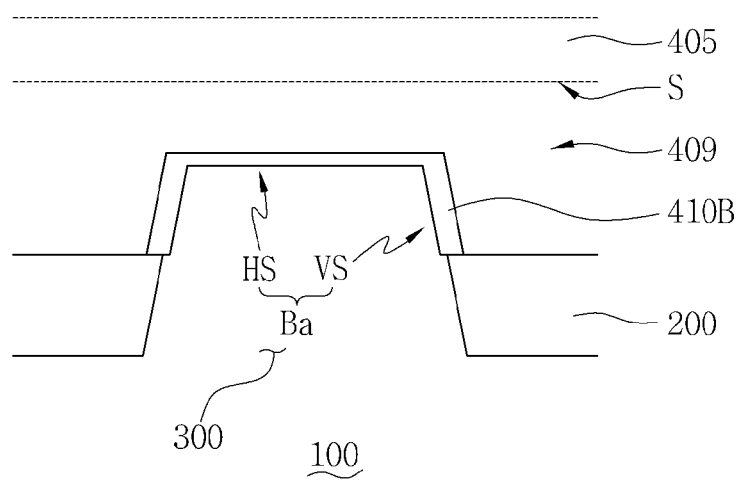
FIGS. 11A to 11D are longitudinal sectional views taken along line III-III' of FIG. 1, conceptually illustrating another method of fabricating the semiconductor device of FIG. 4A.
Figure 11B:
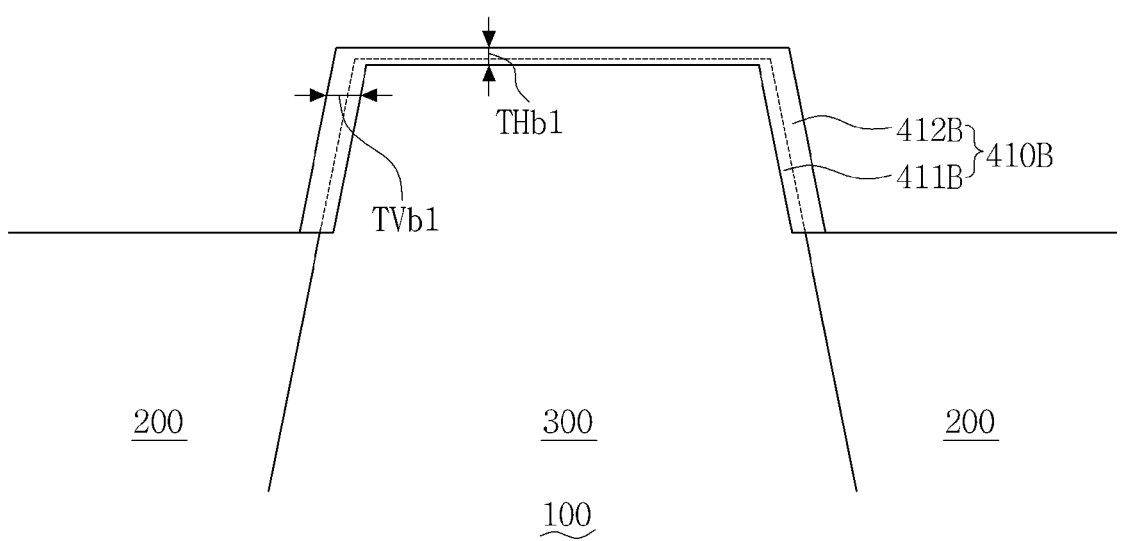

Referring to FIGS. 11A and 11B, a method of fabricating the semiconductor device 30 in accordance with some example embodiments may include forming a gate trench 409 with reference to FIGS. 10A and 10B, and then forming a first gate oxide layer 410B on the horizontal surface HS and vertical sidewall surface VS of the active region 300 exposed in the gate trench 409 by performing a first oxidation process.

The first oxidation process may include oxidizing the surface of the substrate 100. The first oxidation process may include a thermal oxidation process. The thermal oxidation process can be understood in detail with reference to FIG. 7A. In the first gate oxide layer 410B, a portion formed on the vertical sidewall surface VS of the active region may be thicker than that formed on the horizontal surface HS of the active region 300 (TVb1>THb1).

Figure 11C:
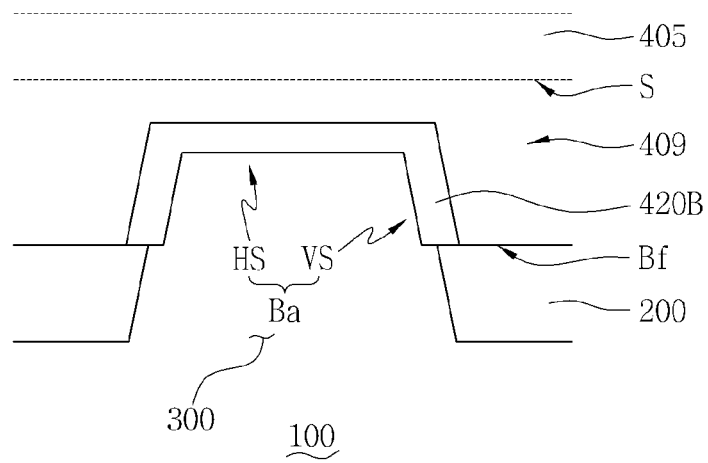
Figure 11D:
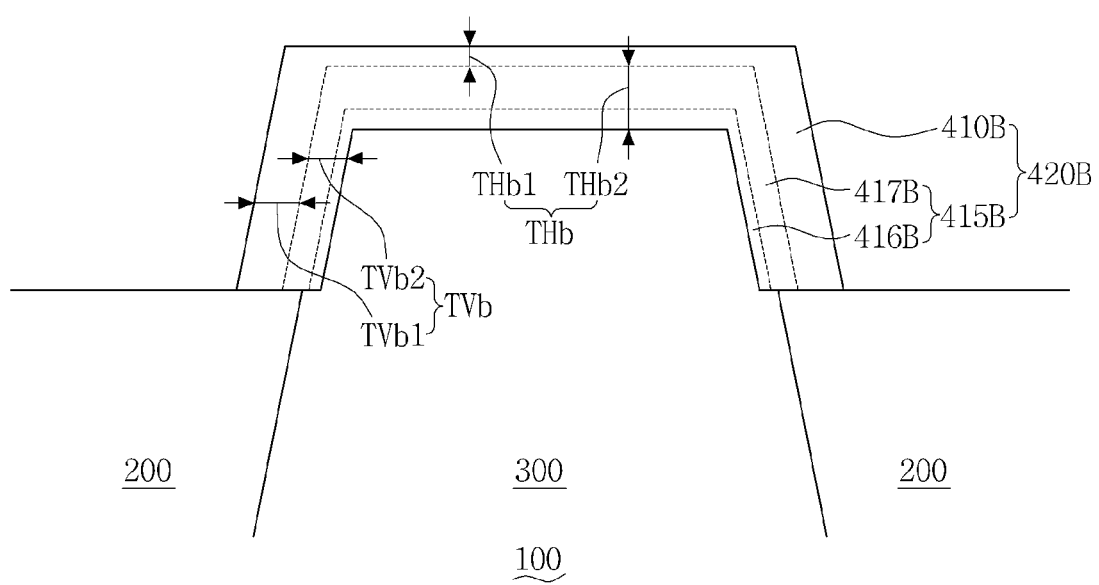

Referring to FIGS. 11C and 11D, the method may include forming a second gate oxide layer 415B between the surface of the active region 300 and the first gate oxide layer 410B. The first and second gate oxide layers 410B and 415B may form a gate insulating layer 420B. The forming of the second gate oxide layer 415B may include performing a second oxidation process. The second oxidation process may include oxidizing the substrate 100 using plasma. The second oxidation process using the plasma can be understood in detail with reference to FIG. 7C. The second oxidation process may include one of the first to third plasma processes described above. Specifically, in the second gate oxide layer 415B, a portion formed on the horizontal surface HS of the active region 300 may be thicker than that formed on the vertical sidewall surface VS of the active region 300 (THb2>TVb2). The second gate oxide layer 415B may include a second internal gate oxide layer 416B, and a second external gate oxide layer 417B. As described above, the second external gate oxide layer 417B may be about 1.25 to 2 times thicker than the second internal gate oxide layer 416B. According to some example embodiments, the gate insulating layer 420B can have a uniform thickness entirely within a variation of 10% (THb≈TVb). Then, the semiconductor device 30 shown in FIGS. 3A and 3C can be formed with reference to FIGS. 10G and 10J.

Figure 12A:
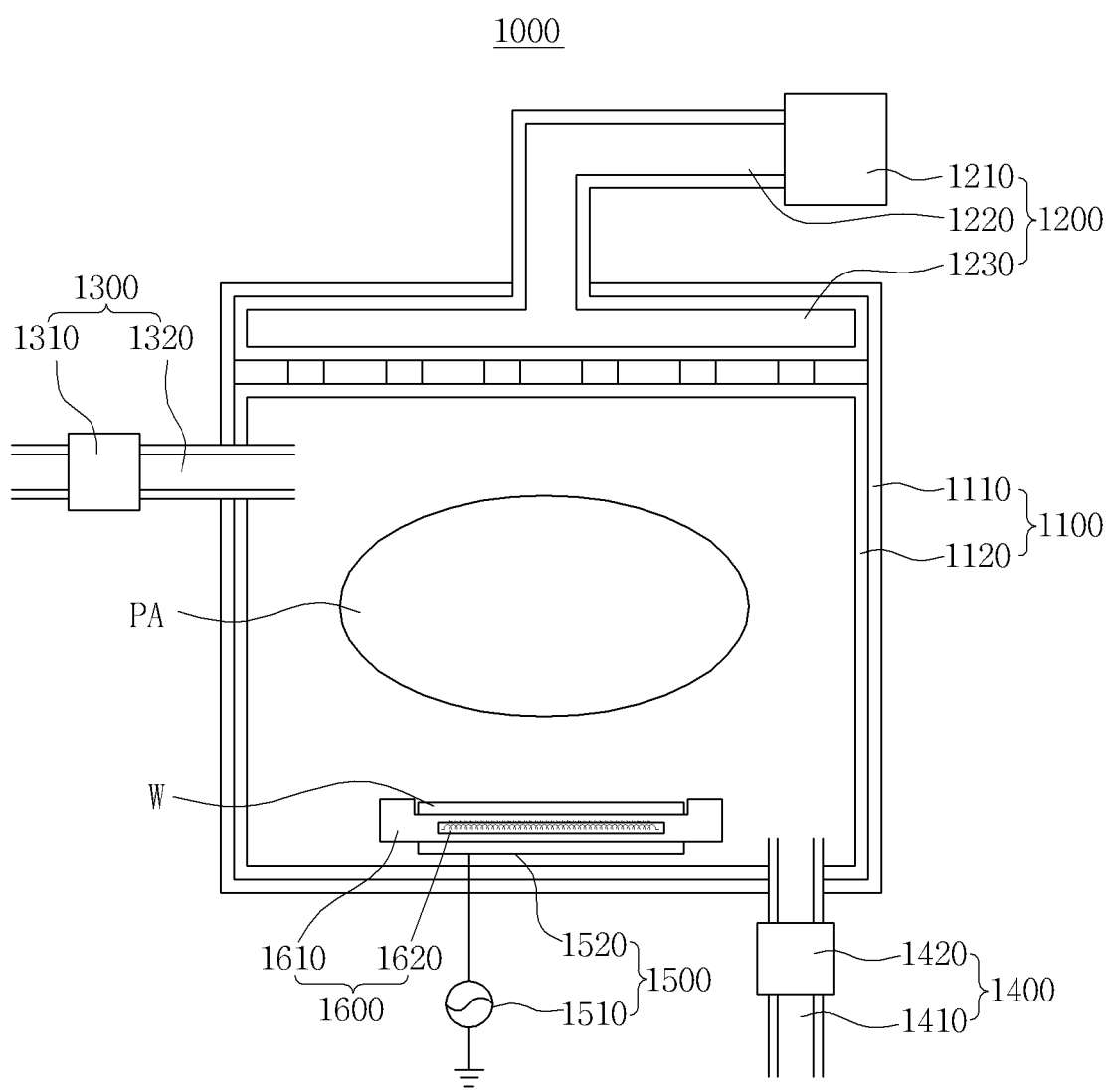
FIG. 12A is a view conceptually showing a semiconductor fabrication apparatus in accordance with some example embodiments.
Figure 12B:
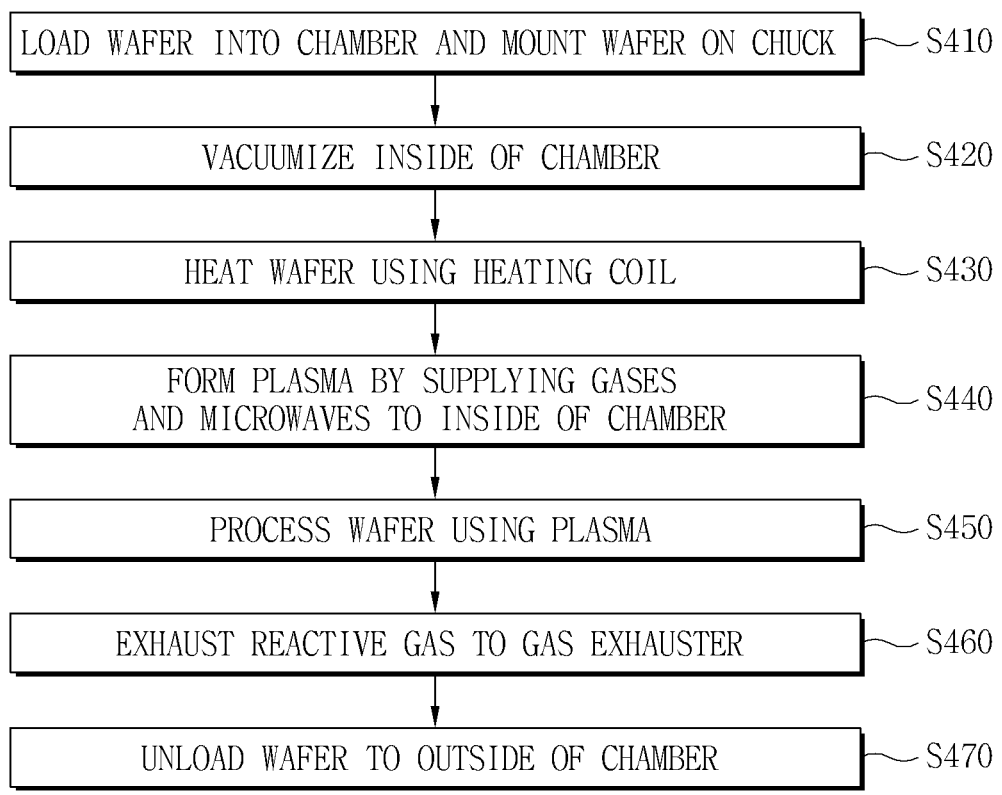
FIG. 12B is a flowchart illustrating a method of fabricating a semiconductor device using the semiconductor fabrication apparatus.

FIG. 12A is a view conceptually showing a semiconductor fabrication apparatus 1000 in accordance with some example embodiments, and FIG. 12B is a flowchart illustrating a method of fabricating a semiconductor device using the semiconductor fabrication apparatus 1000.

Referring to FIG. 12A, the semiconductor fabrication apparatus 1000 in accordance with some example embodiments may include a chamber 1100, a source power supplier 1200, a gas supplier 1300, a gas exhauster 1400, a bias power supplier 1500 and a supporter 1600.

The chamber 1100 may include an external chamber 1110 and an internal chamber 1120. The external chamber 1110 may include stainless metal such as SUS. The internal chamber 1120 may include an insulation material such as quartz. A plasma area PA may be formed in the internal chamber 1120.

The source power supplier 1200 may be disposed in an upper region of the chamber 1100. The source power supplier 1200 may include a microwave generator 1210, a wave guide 1220 and a microwave radiator 1230. The wave guide 1220 may transfer microwaves generated in the microwave generator 1210 to the inside of the chamber 1100. The microwave radiator 1230 may uniformly supply the microwaves to the plasma area PA of the chamber 1100.

The gas supplier 1300 may be disposed in an upper, side or upper side region of the chamber 1100. The gas supplier 1300 may include a mass flow controller (MFC) 1310 and a supply pipe 1320. The MFC 1310 may independently or entirely control the flow rate of gases supplied to the inside of the chamber 1100. That is, in the MFC 1310, a plurality of valves and control devices may be configured in series or parallel. The supply pipe 1320 may supply gas to the plasma area PA in the chamber 1100.

The gas exhauster 1400 may be disposed at a lower, side or lower side region of the chamber 1100. The gas exhauster 1400 may include an exhaustion pipe 1410 and a vacuum pump 1420. The vacuum pump 1420 may constantly maintain the pressure/vacuum of the inside of the chamber 1100.

The bias power supplier 1500 may include an RF generator 1510 and a bias electrode 1520. The bias electrode 1520 may be disposed beneath the supporter 1600. In another embodiment, the bias electrode 1520 may be disposed in the supporter 1600. In still another embodiment, the supporter 1600 may be used as the bias electrode 1520.

The supporter 1600 may be disposed in a lower region of the chamber 1100, e.g., in a lower center region of the chamber 1100. The supporter 1600 may include a support chuck 1610 and a heating coil 1620. A wafer W may be mounted on the support chuck 1610. The heating coil 1620 may be disposed at a lower portion of the inside of the support chuck 1610.

Referring to FIG. 12B, the method of fabricating the semiconductor device using the semiconductor fabrication apparatus 1000 in accordance with some example embodiments may include loading a wafer W into the chamber 1100 and mounting the wafer W on the support chuck 1610 (S410).

The method may include vacuumizing the inside of the chamber 1100 (S420). For example, the vacuumizing of the inside of the chamber 1100 may include vacuumizing the inside of the chamber 1100 to a pressure of about 10 to 500 mTorr using the vacuum pump 1420. In another embodiment, the vacuumizing of the inside of the chamber 1100 may include highly vacuumizing the inside of the chamber 1100 to a pressure of about 10 to 50 mTorr.

The method may include heating the wafer W using the heating coil 1620 (S430). For example, the heating of the wafer W may include heating the support chuck 1610 to a temperature of about 400 to 600° C.

The method may include forming plasma by supplying gases and microwaves to the inside of the chamber 1100 (S440). The gases may include gas containing oxygen and an inert gas. For example, the gases may include a combination of oxygen/argon gases or oxygen/hydrogen/argon gases. Specifically, when the combination of oxygen/argon gases is used, the flow rate of the argon gas supply may be about 5 to 20 times more than that of the oxygen gas. For example, the oxygen gas may be supplied to the inside of the chamber at a flow rate of about 10 to 100 sccm, and the argon gas may be supplied to the inside of the chamber at a flow rate of about 100 to 700 sccm. When the combination of oxygen/hydrogen/argon gases is used, the oxygen gas may be supplied in an amount twice or more that of the hydrogen gas.

The method may include processing the wafer W using plasma (S450). The processing of the wafer W using the plasma may include applying an RF bias of about 50 to 500 W at a frequency of 5 to 50 MHz. In this process, the silicon or silicon oxide material formed on the wafer may be formed to a silicon nitride material or silicon oxynitride material.

The method may include exhausting a reactive gas to the gas exhauster 1400 (S460). For example, the gases in the chamber 1100 may be exhausted to the outside thereof using the vacuum pump 1420. Then, the vacuum state in the chamber 1100 may be adjusted to a normal pressure. Subsequently, the method may include unloading the wafer W to the outside of the chamber 1100 (S470).

Figure 13A:
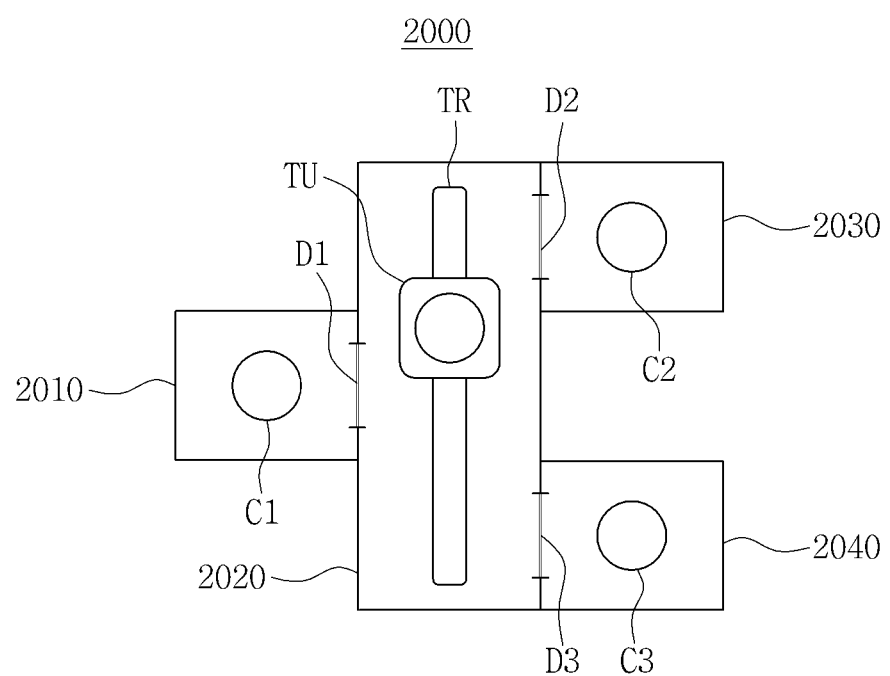
FIG. 13A is a view conceptually showing a semiconductor fabrication apparatus for performing processes of forming semiconductor devices in accordance with some example embodiments.

FIG. 13A is a view conceptually showing a semiconductor fabrication apparatus for performing processes of forming semiconductor devices in accordance with some example embodiments.

Referring to FIG. 13A, a semiconductor fabrication apparatus 2000 in accordance with some example embodiments may include a wafer stage 2010, a transfer space 2020, a plasma processing chamber 2030 and a thermal processing furnace 2040. The wafer stage 2010 may include a first chuck C1. A wafer may be mounted on the first chuck C1. The wafer stage 2010 may include a load lock chamber. Thus, the wafer stage 2010 can be vacuumized. A first door D1 may be disposed between the wafer stage 2010 and the transfer space 2020. The transfer space 2020 may include a transfer unit TU and a transfer rail TR. The transfer unit TU may support and transfer the wafer. The transfer rail TR may provide a path along which the transfer unit TU moves. That is, the transfer unit TU may move along the transfer rail TR. The transfer unit TU may freely transfer the wafer to the wafer stage 2010, the plasma processing chamber 2030 and the thermal processing furnace 2040. A second door D2 may be disposed between the transfer space 2020 and the plasma processing chamber 2030, and a third door D3 may be disposed between the transfer space 2020 and the thermal processing furnace 2040. Therefore, the wafer stage 2010, the transfer space 2020, the plasma processing chamber 2030 and the thermal processing furnace 2040 may be spatially connected or blocked. The plasma processing chamber 2030 and the thermal processing furnace 2040 may perform an oxidation process using plasma and an oxidation process using heat, respectively. For example, the plasma processing chamber 2030 may provide a space for performing the oxidation process using the plasma, and the thermal processing furnace 2040 may provide a space for performing the oxidation process using the heat.

Figure 13B:
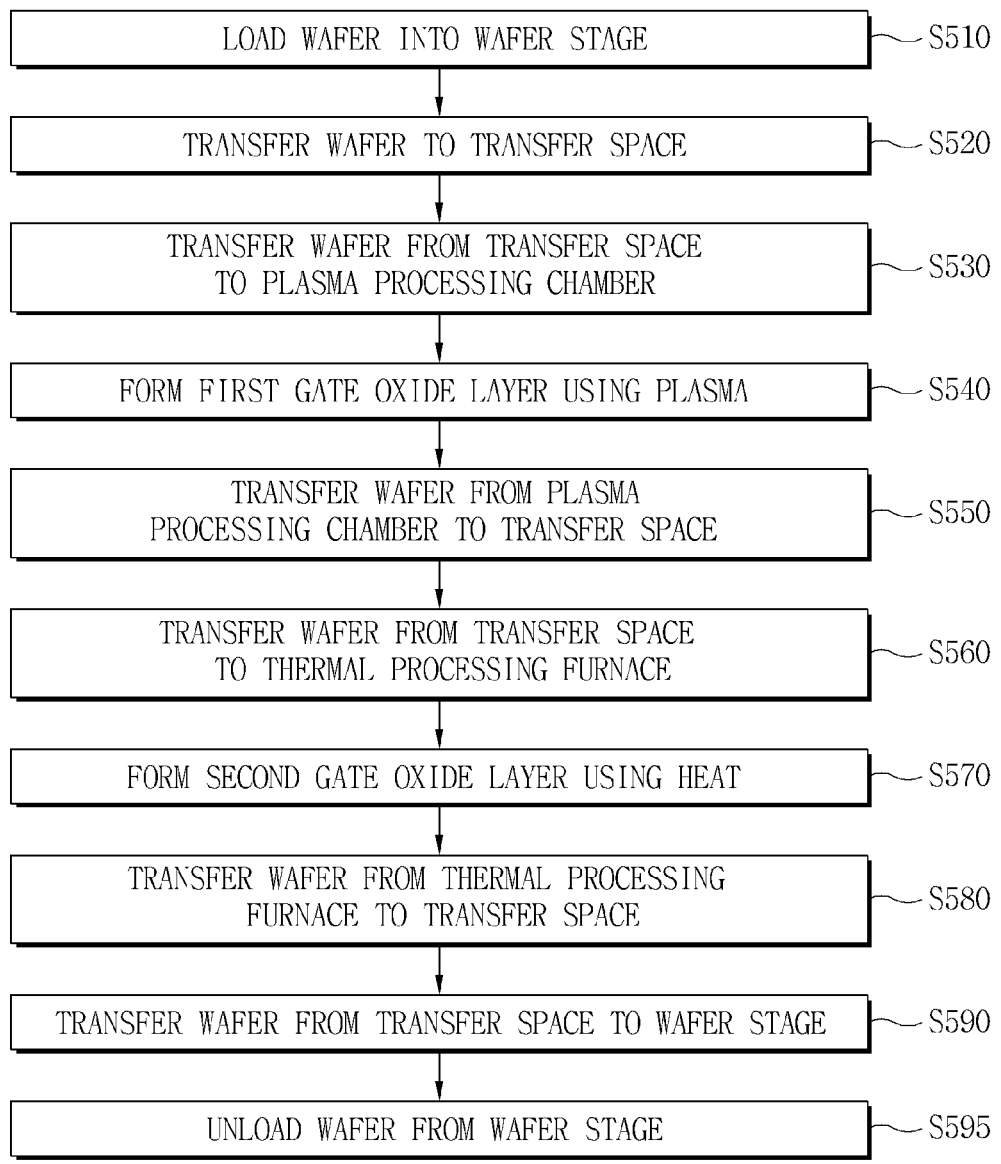
FIGS. 13B and 13C are flowcharts illustrating a method of processing a wafer or fabricating a semiconductor device using the semiconductor fabrication apparatus in accordance with some example embodiments.
Figure 13C:
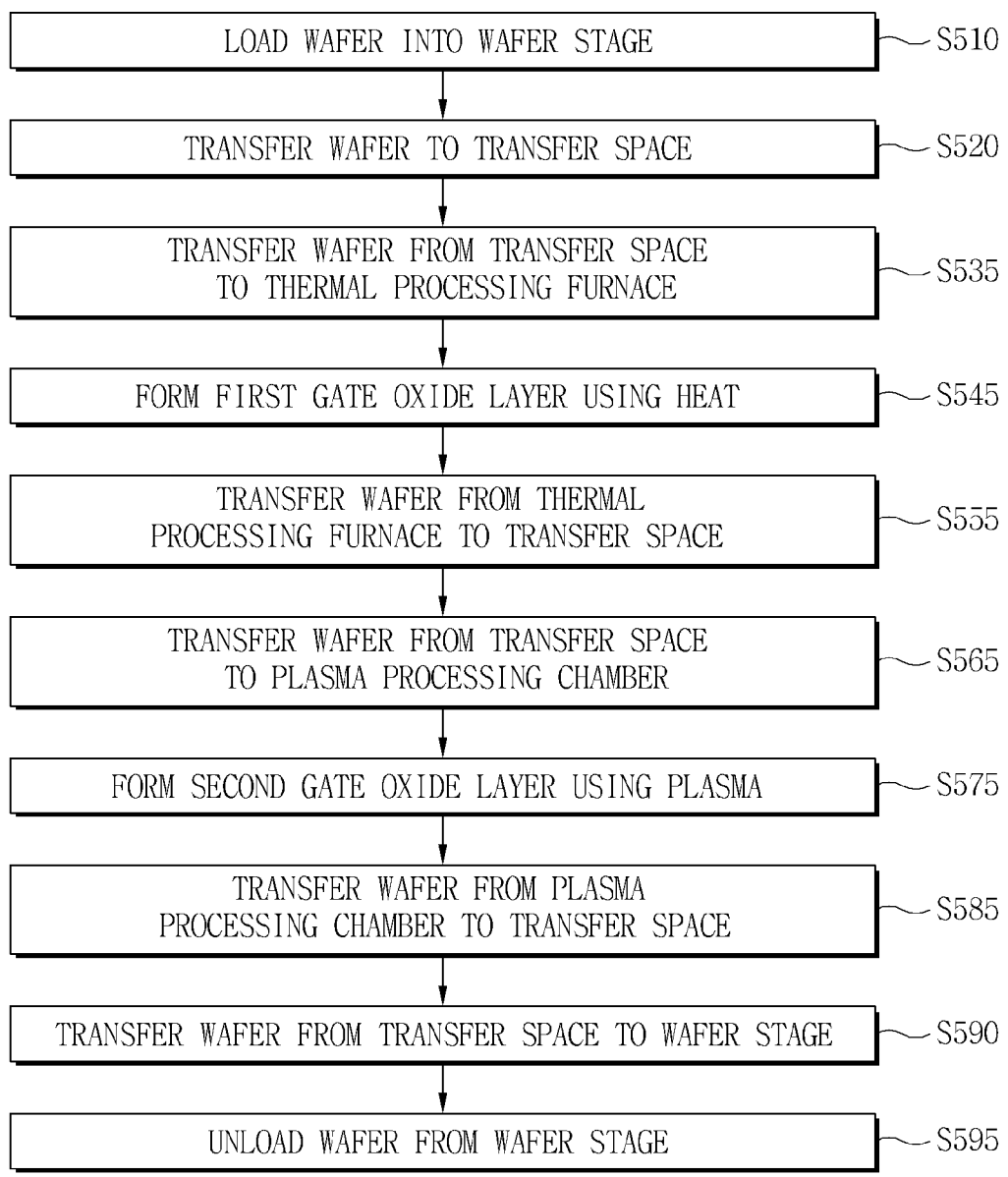

FIGS. 13B and 13C are flowcharts illustrating a method of processing a wafer or fabricating a semiconductor device using the semiconductor fabrication apparatus in accordance with some example embodiments.

Referring to FIG. 13B, a method of processing a wafer or fabricating a semiconductor device using the semiconductor fabrication apparatus 2000 in accordance with some example embodiments may include loading a wafer into the wafer stage 2010 (S510). The wafer may be mounted on the first chuck C1 disposed in the inside of the wafer stage 2010. When the wafer stage 2010 includes a load lock chamber, the wafer stage 2010 may be vacuumized to a desired degree of vacuum. Next, the method may include transferring the wafer from the wafer stage 2010 to the transfer space 2020 (S520). When the wafer is transferred, the first door D1 may be temporarily opened. The transfer unit TU disposed in the transfer space 2020 may support the wafer by moving to the inside of the wafer stage 2010, and then transferring the wafer into the transfer space 2020. Next, the method may include transferring the wafer from the transfer space 2020 to the plasma processing chamber 2030 (S530). The transfer unit TU may transfer the wafer by moving along the transfer rail TR. When the wafer is transferred, the second door D2 may be temporarily opened. The wafer may be mounted on a second chuck C2 in the plasma processing chamber 2030. Next, the method may include forming a first gate oxide layer 410A on the wafer by performing an oxidation process using plasma in the plasma processing chamber 2030 (S540). The oxidation process using the plasma has been described with reference to FIG. 6D. Next, the method may include transferring the wafer from the plasma processing chamber 2030 to the transfer space 2020 (S550). The transfer unit TU may unload the wafer from the plasma processing chamber 2030. Then, the transfer unit TU may move toward the thermal processing furnace 2040 along the transfer rail TR. Next, the method may include transferring the wafer from the transfer space 2020 to the thermal processing furnace 2040 (S560). When the wafer is transferred, the third door D3 may be temporarily opened. The wafer may be mounted on a third chuck C3 disposed in the inside of the thermal processing furnace 2040. Next, the method may include forming a second gate oxide layer 415A on the wafer by performing an oxidation process using heat in the thermal processing furnace 2040 (S570). The oxidation process using the heat has been described with reference to FIG. 6F. Next, the method may include transferring the wafer from the thermal processing furnace 2040 to the transfer space 2020 (S580). Next, the method may include transferring the wafer from the transfer space 2020 to the wafer stage 2010 (S590). Next, the method may include unloading the wafer from the wafer stage 2010 (S595).

Referring to FIG. 13C, another method of processing a wafer or fabricating a semiconductor device using the semiconductor fabrication apparatus 2000 in accordance with some example embodiments may include loading a wafer into the wafer stage 2010 (S510). The wafer may be mounted on the first chuck C1 disposed in the wafer stage 2010. When the wafer stage 2010 includes a load lock chamber, the load lock chamber of the water stage 2010 may be vacuumized to a desired degree of vacuum. Next, the method may include transferring the wafer from the wafer stage 2010 to the transfer space 2020 (S520). When the wafer is transferred, the first door D1 may be temporarily opened. The transfer unit TU disposed in the transfer space 2020 may support the wafer while moving to the inside of the wafer stage 2010, and transferring the wafer into the transfer space 2020. Next, the method may include transferring the wafer from the transfer space 2020 to the thermal processing furnace 2040 (S535). The transfer unit TU may transfer the wafer while moving along the transfer rail TR. When the wafer is transferred, the third door D3 may be temporarily opened. The wafer may be mounted on the third chuck C3 in the thermal processing furnace 2040. Next, the method may include forming a first gate oxide layer 410B on the wafer by performing an oxidation process using heat in the thermal processing furnace 2040 (S545). The oxidation process using the heat has been described with reference to FIG. 6F. Next, the method may include transferring the wafer from the thermal processing furnace 2040 to the transfer space 2020 (S555). The transfer unit TU may unload the wafer from the thermal processing furnace 2040. Then, the transfer unit TU may move toward the plasma processing chamber 2030 along the transfer rail TR. Next, the method may include transferring the wafer from the transfer space 2020 to the plasma processing chamber 2030 (S565). When the wafer is transferred, the second door D2 may be temporarily opened. The wafer may be mounted on the second chuck C2 disposed in the plasma processing chamber 2030. Next, the method may include forming a second gate oxide layer 415B on the wafer by performing an oxidation process using plasma in the plasma processing chamber 2030 (S575). The oxidation process using the plasma has been described with reference to FIG. 6D. Next, the method may include transferring the wafer from the plasma processing chamber 2030 to the transfer space 2020 (S585). Next, the method may include transferring the wafer from the transfer space 2020 to the wafer stage 2010 (S590). Next, the method may include unloading the wafer from the wafer stage 2010 (S595).

Figure 14:
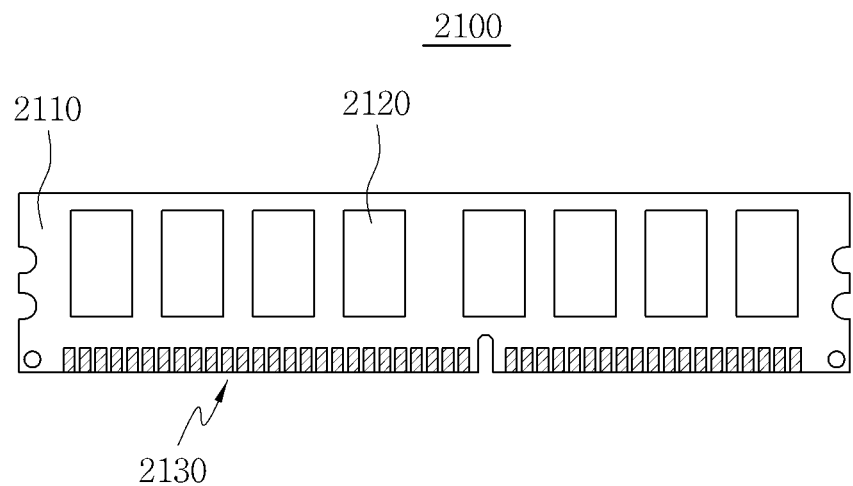
FIG. 14 is a view conceptually showing a memory module including at least one of the semiconductor devices in accordance with some example embodiments.

FIG. 14 is a view conceptually showing a memory module 2100 including at least one of the semiconductor devices 10, 20 and 30 in accordance with some example embodiments.

Referring to FIG. 14, the memory module 2100 may include a memory module substrate 2110, and a plurality of memory devices 2120 and a plurality of terminals 2130, disposed on the memory module substrate 2110. The memory module substrate 2110 may include a printed circuit board (PCB) or wafer. The memory devices 2120 may be one of the semiconductor devices 10, 20 and 30 in accordance with some example embodiments, or a semiconductor package including one of the semiconductor devices 10, 20 and 30. The plurality of terminals 2130 may include a conductive metal. The terminals 2130 may be electrically connected to the memory devices 2120. The memory module 2100 includes a semiconductor device having low leakage current and excellent on/off current characteristics, and thus the performance of the module can be improved.

Figure 15:
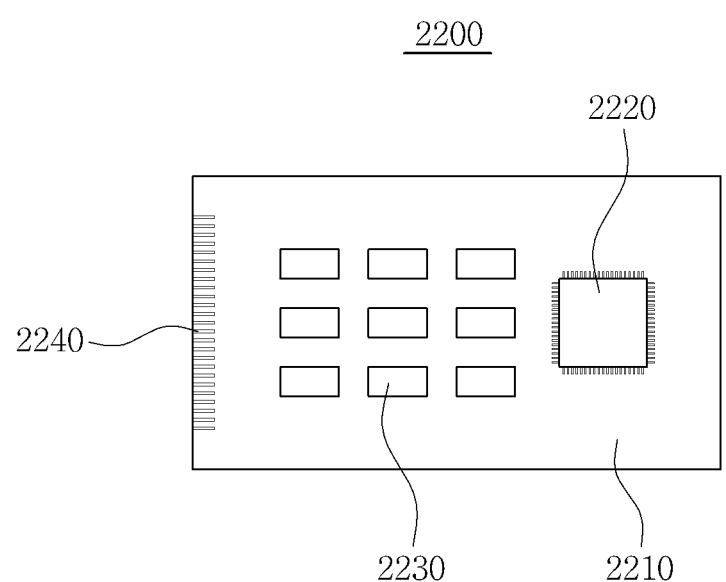
FIG. 15 is a view conceptually showing a semiconductor module including at least one of the semiconductor devices in accordance with some example embodiments.

FIG. 15 is a view conceptually showing a semiconductor module 2200 including at least one of the semiconductor devices 10, 20 and 30 in accordance with some example embodiments.

Referring to FIG. 15, the semiconductor module 2200 may include one of the semiconductor devices 10, 20 30 in accordance with some example embodiments, mounted on a semiconductor module substrate 2210. The semiconductor module 2200 may further include a microprocessor 2220 and memory devices 2230 mounted on the semiconductor module substrate 2210. Input/output terminals 2240 may be disposed on at least one side of the semiconductor module substrate 2210.

Figure 16:
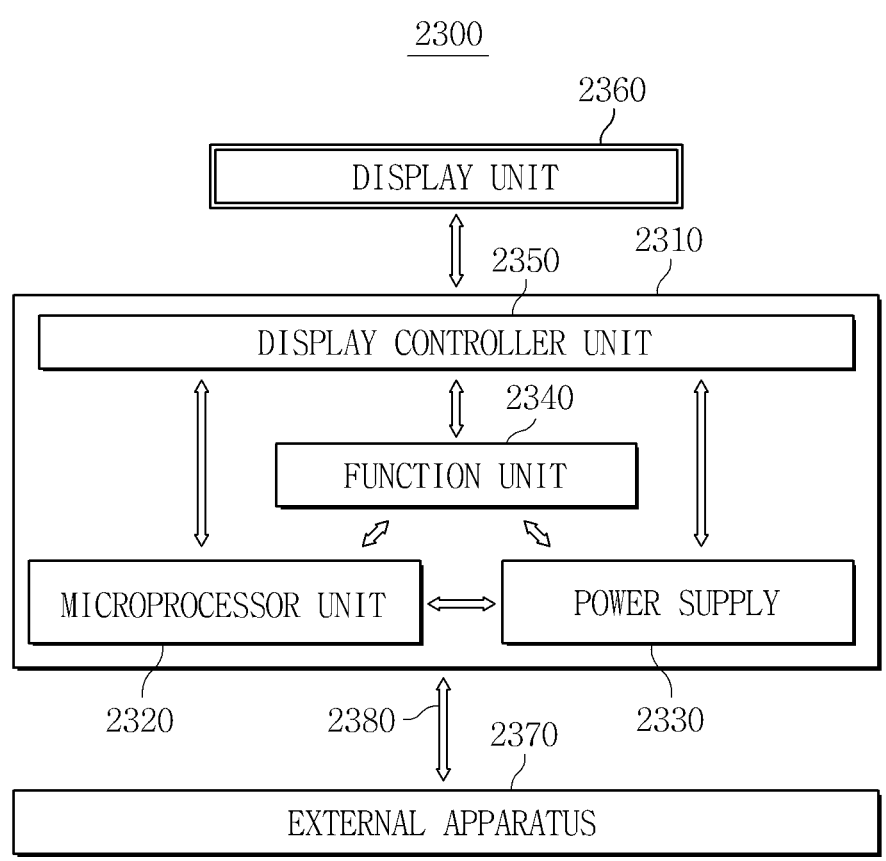
FIG. 16 is a block diagram conceptually showing an electronic system including at least one of the semiconductor devices in accordance with some example embodiments.

FIG. 16 is a block diagram conceptually showing an electronic system 2300 including at least one of the semiconductor devices 10, 20 and 30 in accordance with some example embodiments.

Referring to FIG. 16, the semiconductor devices 10, 20 and 30 in accordance with some example embodiments may be applied to the electronic system 2300. The electronic system 2300 may include a body 2310. The body 2310 may include a microprocessor unit 2320, a power supply 2330, a function unit 2340 and/or a display controller unit 2350. The body 2310 may be a system board or mother board having a printed circuit board, etc. The microprocessor unit 2320, the power supply 2330, the function unit 2340 and the display controller unit 2350 may be mounted or attached on the body 2310. A display unit 2360 may be disposed on the top surface of the body 2310 or outside of the body 2310. For example, the display unit 2360 may be disposed on the surface of the body 2310 so as to display an image processed by the display controller unit 2350. The power supply 2330 may receive a certain voltage supplied from an external power source, etc. and divide the voltage into various voltage levels so as to supply the divided voltage to the microprocessor unit 2320, the function unit 2340, the display controller unit 2350, etc. The microprocessor unit 2320 may receive the voltage supplied from the power supply 2330 so as to control the function unit 2340 and the display unit 2360. The function unit 2340 may perform various functions of the electronic system 2300. For example, when the electronic system 2300 is a mobile electronic product such as a cellular phone, the electronic system 2300 may include various components capable of performing wireless communication functions such as the output of video to the display unit 2360 and the output of voice to a speaker through dialing or communication with an external apparatus 2370. When the electronic system 2300 includes a camera, the electronic system 2300 may perform the function of an image processor. In another embodiment, when the electronic system 2300 is connected to a memory card, etc. for the purpose of capacity extension, the function unit 2340 may be a memory card controller. The function unit 2340 may communicate a signal with the external apparatus 2370 through a wired/wireless communication unit 2380. When the electronic system 2300 requires a universal serial bus (USB), etc. for the purpose of functional extension, the function unit 2340 may perform the function of an interface controller. The semiconductor devices 10, 20 and 30 in accordance with some example embodiments may be included in at least one of the microprocessor unit 2320 and the function unit 2340.

Figure 17:
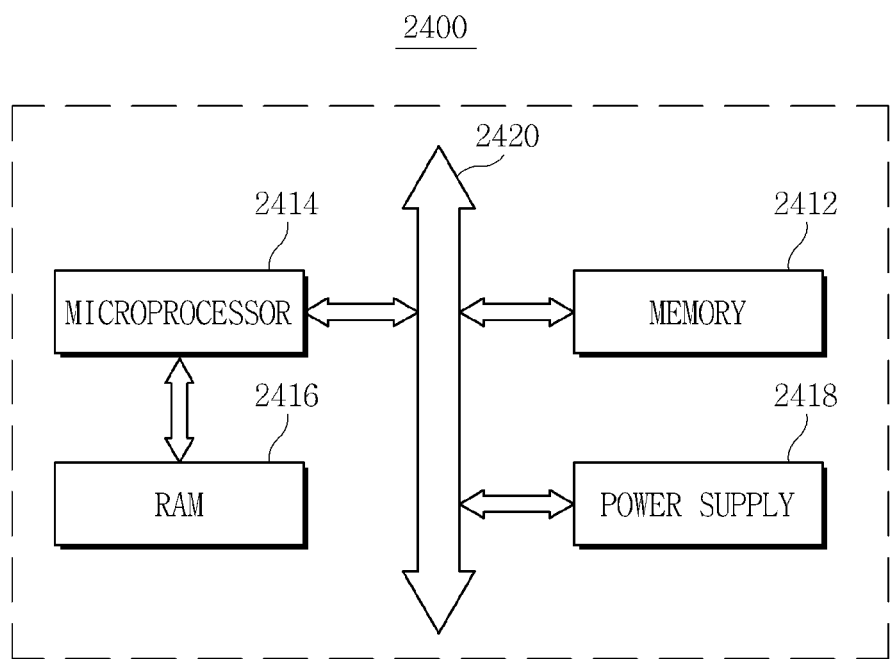
FIG. 17 is a block diagram conceptually showing another electronic system including at least one of the semiconductor devices in accordance with some example embodiments.

FIG. 17 is a block diagram conceptually showing another electronic system 2400 including at least one of the semiconductor devices 10, 20 and 30 in accordance with some example embodiments.

Referring to FIG. 17, the electronic system 2400 may include at least one of the semiconductor devices 10, 20 and 30 in accordance with some example embodiments. The electronic system 2400 may be used to manufacture a mobile device or computer. For example, the electronic system 2400 may include a user interface for performing data communication using a memory system 2412, a microprocessor 2414, a random access memory (RAM) 2416, power supply 2418, and a bus 2420. The microprocessor 2414 may program and control the electronic system 2400. The RAM 2416 may be used as an operation memory of the microprocessor 2414. For example, the microprocessor 2414 or the RAM 2416 may include at least one of the electrode connection structures in accordance with some example embodiments. The microprocessor 2414, the RAM 2416 and/or other components may be assembled in a single package. A user interface (not shown) may be used to input or output data to or from the electronic system 2400. The memory system 2412 may store codes for operating the microprocessor 2414, data processed by the microprocessor 2414 or external input data. The memory system 2412 may include a controller and a memory.

Figure 18:
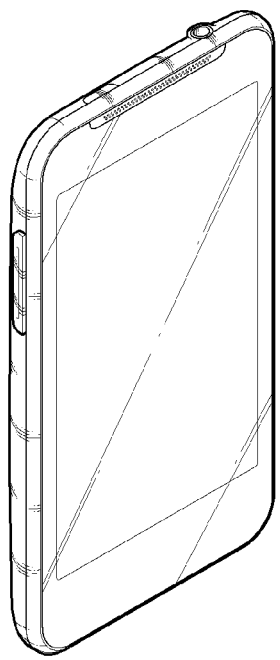
FIG. 18 is a view conceptually showing a mobile wireless phone including at least one of the semiconductor devices in accordance with some example embodiments.

FIG. 18 is a view conceptually showing a mobile wireless phone 2500 including at least one of the semiconductor devices 10, 20 and 30 in accordance with some example embodiments. The mobile wireless phone 2500 may be construed as a tablet personal computer (PC). In addition, at least one of the semiconductor devices 10, 20 and 30 in accordance with some example embodiments may be used in a portable computer such as a notebook computer, a moving picture experts group (MPEG)-1 audio layer-3 (MP3) player, an audio layer-4 (MP4) player, a navigation device, a solid state disk (SSD), a desktop computer, a vehicle and a household electronic appliance, as well as the tablet PC.

According to some example embodiments, it is possible to form a gate insulating layer having uniform thickness selectively in a desired region. The gate insulating layer can be formed to a uniform thickness according to various shapes and various process conditions. A transistor having the gate insulating layer with uniform thickness has low leakage current, stable turn-on/turn-off operations and improved durability. Since the semiconductor device has low leakage current, the semiconductor device can stably operate at high speed, and have low power consumption and long lifespan. The apparatus for fabricating the semiconductor device can perform, at high speed and low cost, the method of fabricating the semiconductor device.

While example embodiments have been particularly shown and described, it will be understood by those of ordinary skill in the art that various changes in form and details may be made therein without departing from the spirit and scope of the present invention as defined by the following claims.

What is claimed is:

1. A method of fabricating a semiconductor device, comprising:

forming a field region defining an active region in a substrate;

forming a gate trench in which the active region and the field region in the substrate are partially exposed;

forming a gate insulating layer on a surface of the active region exposed in the gate trench, wherein forming the gate insulating layer includes forming a first gate oxide layer by primarily oxidizing the surface of the active region, and forming a second gate oxide layer between the surface of the active region and the first gate oxide layer by secondarily oxidizing the surface of the active region;

conformally forming a gate barrier layer including metal on the gate insulating layer and the partially exposed field region;

forming a gate electrode layer including metal on the gate barrier layer; and forming a gate capping layer;

wherein the gate capping layer is in contact with the gate insulating layer in the gate trench,
wherein the gate capping layer is in contact with the gate barrier layer in the gate trench, and
wherein the gate capping layer is in contact with the gate electrode layer in the gate trench.

2. The method according to claim 1, wherein forming the gate trench includes:
forming a mask pattern for gate trench formation that selectively exposes the active region and the field region on the substrate; and
etching the active region and the field region using the mask pattern for gate trench formation as an etch mask; and
wherein conformally forming the gate barrier layer includes:
forming a gate barrier material layer on the gate insulating layer, the exposed field region, and the mask pattern for gate trench formation; and
removing the gate barrier material layer formed on the mask pattern for gate trench formation.

3. The method according to claim 1, wherein the surface of the active region includes a horizontal surface substantially parallel to an upper surface of the substrate, and a vertical sidewall surface inclined with respect to the horizontal surface, and
wherein the field region includes a field bottom surface substantially parallel to the horizontal surface.

4. The method according to claim 3, wherein the horizontal surface is closer to the upper surface of the substrate than the field bottom surface, and
wherein the vertical sidewall surface is between the horizontal surface and the field bottom surface.

5. The method according to claim 3, wherein the horizontal surface has a $\{100\}$ crystal plane, and
wherein the vertical sidewall surface has a $\{110\}$ crystal plane.

6. The method according to claim 3, wherein forming the first gate oxide layer includes:
forming a first external gate oxide layer toward the gate trench from the surface of the active region; and
forming a first internal gate oxide layer toward a bulk of the substrate from the surface of the active region; and
wherein the first external gate oxide layer is thicker than the first internal gate oxide layer.

7. The method according to claim 6, wherein forming the second gate oxide layer includes:
forming a second external gate oxide layer toward the gate trench from the surface of the active region; and
forming a second internal gate oxide layer toward the bulk of the substrate from the surface of the active region; and
wherein the second external gate oxide layer is thicker than the second internal gate oxide layer.

8. The method according to claim 3, wherein forming the first gate oxide layer includes oxidizing the surface of the active region using plasma, and
wherein the first gate oxide layer is about 1.5 to 3.5 times thicker on the horizontal surface of the active region than on the vertical sidewall surface of the active region.

9. The method according to claim 8, wherein forming the first gate oxide layer further includes:
loading the substrate into a plasma processing chamber;
vacuumizing an inside of the plasma processing chamber to pressure greater than or equal to about 10 mTorr and less than or equal to about 500 mTorr;
heating the substrate to temperature greater than or equal to about 400° C. and less than or equal to about 600° C.;
supplying oxygen and argon gases to the inside of the plasma processing chamber; and
generating plasma by supplying microwaves to the inside of the plasma processing chamber.

10. The method according to claim 9, wherein forming the first gate oxide layer further includes applying, to the substrate, bias power greater than or equal to about 50 W and less than or equal to about 500 W, at frequency greater than or equal to about 5 MHz and less than or equal to about 50 MHz.

11. The method according to claim 9, wherein forming the first gate oxide layer further includes supplying the oxygen and argon gases at a volume ratio greater than or equal to about 1:5 and less than or equal to about 1:20.

12. The method according to claim 11, wherein forming the first gate oxide layer further includes supplying hydrogen gas to the inside of the plasma processing chamber, and
wherein the oxygen gas is supplied in an amount two or more times that of the hydrogen gas.

13. The method according to claim 8, wherein forming the second gate oxide layer includes oxidizing the surface of the active region, which contacts the first gate oxide layer, using heat, and
wherein the second gate oxide layer is about 1.5 to 3.5 times thicker on the vertical sidewall surface of the active region than on the horizontal surface of the active region.

14. The method according to claim 13, wherein forming the second gate oxide layer further includes:
loading the substrate into a thermal processing furnace;
supplying oxygen gas to an inside of the thermal processing furnace; and
heating the substrate to temperature greater than or equal to about 800° C. and less than or equal to about 1100° C.

15. A method of fabricating a semiconductor device, comprising:
loading a substrate into a plasma processing chamber, wherein the substrate includes a field region defining an active region, and a gate trench partially exposing the active region and the field region;
forming a first gate oxide layer on the active region exposed in the gate trench;
unloading the substrate having the first gate oxide layer formed thereon from the plasma processing chamber, and loading the substrate into a thermal processing furnace;
forming a gate insulating layer by forming a second gate oxide layer between the active region and the first gate oxide layer; and
unloading the substrate having the gate insulating layer formed thereon from the thermal processing furnace.

16. A method of fabricating a gate insulating layer, comprising:
forming a field region defining an active region in a substrate;
forming a gate trench in which the active region and the field region in the substrate are at least partially exposed;
forming a first gate oxide layer on horizontal and vertical side surfaces of the active region at least partially exposed in the gate trench by primarily oxidizing the horizontal and vertical side surfaces of the active region; and
forming a second gate oxide layer between the horizontal and vertical side surfaces of the active region and the first gate oxide layer by secondarily oxidizing the horizontal and vertical side surfaces of the active region.

17. The method according to claim 16, wherein the horizontal and vertical side surfaces of the active region are primarily oxidized using plasma.

18. The method according to claim 17, wherein the horizontal and vertical side surfaces of the active region are secondarily oxidized using heat.

19. The method according to claim 16, wherein the horizontal and vertical side surfaces of the active region are primarily oxidized using heat.

20. The method according to claim 19, wherein the horizontal and vertical side surfaces of the active region are secondarily oxidized using plasma.

* * * * *